(12) United States Patent
Hasunuma et al.

(10) Patent No.: US 7,180,192 B2
(45) Date of Patent: Feb. 20, 2007

(54) SEMICONDUCTOR DEVICE

(75) Inventors: Masahiko Hasunuma, Yokohama (JP); Sachiyo Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/168,928

(22) Filed: Jun. 29, 2005

(65) Prior Publication Data

US 2005/0255650 A1 Nov. 17, 2005

Related U.S. Application Data

(62) Division of application No. 10/653,186, filed on Sep. 3, 2003, now Pat. No. 6,958,542.

(30) Foreign Application Priority Data

Sep. 3, 2002 (JP) ............................. 2002-257974

(51) Int. Cl.
*H01L 23/48* (2006.01)
*H01L 23/52* (2006.01)
*H01L 29/40* (2006.01)

(52) U.S. Cl. .................. 257/758; 257/750; 257/751; 257/760; 257/762; 257/763; 257/774; 257/E21.585; 257/E21.641

(58) Field of Classification Search ........ 257/750–751, 257/758–760, 762–763, 761
See application file for complete search history.

(56) References Cited

U.S. PATENT DOCUMENTS 6,037,668 A 3/2000 Cave et al.
6,559,548 B1 * 5/2003 Matsunaga et al. ......... 257/774
6,617,690 B1 9/2003 Gates et al.
2003/0094696 A1 * 5/2003 Dunham et al. ............ 257/758
2004/0119164 A1 6/2004 Kurashima et al.

FOREIGN PATENT DOCUMENTS

| CN | 1477705 | 2/2004 |
|----|---------|--------|
| JP | 11-176835 | 7/1999 |
| JP | 11-307633 | 11/1999 |
| JP | 2001-196372 | 7/2001 |
| JP | 2001-267323 | 9/2001 |

OTHER PUBLICATIONS

Nofication of Reasons for Rejection (Office Action) for Chinese Patent Application No. 031565166, mailed Jun. 24, 2005 and English translation thereof.

* cited by examiner

*Primary Examiner*—Nitin Parekh
(74) *Attorney, Agent, or Firm*—Finnegan, Henderson, Farabow, Garrett & Dunner, L.L.P.

(57) ABSTRACT

A semiconductor device includes an insulating film whose relative dielectric constant is 3.4 or less, at least one conductive layer, at least one conductive plug which is electrically connected to the conductive layer to form a conduction path, at least one reinforcing material whose Young's modulus is 30 GPa or more, at least one first reinforcing plug which is connected to the conductive layer and which is formed in contact with the reinforcing material, a reinforcing metal layer which is provided in the insulating film in an area other than that where the conductive layer is formed, and which is electrically disconnected from the conductive layer and the conductive plug, and a second reinforcing plug which is connected to the under side of the reinforcing metal layer and which is formed in contact with the reinforcing material.

8 Claims, 41 Drawing Sheets

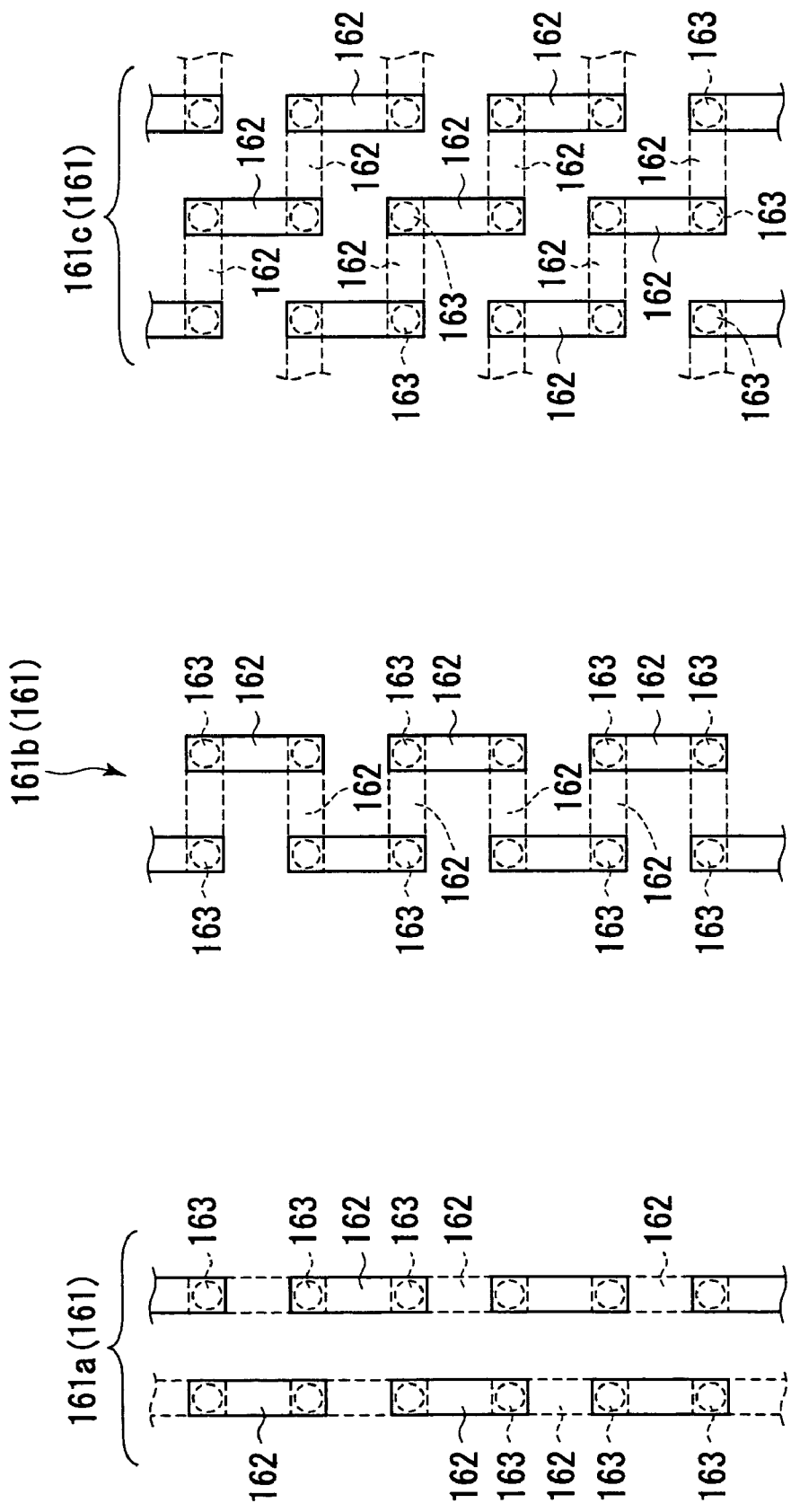

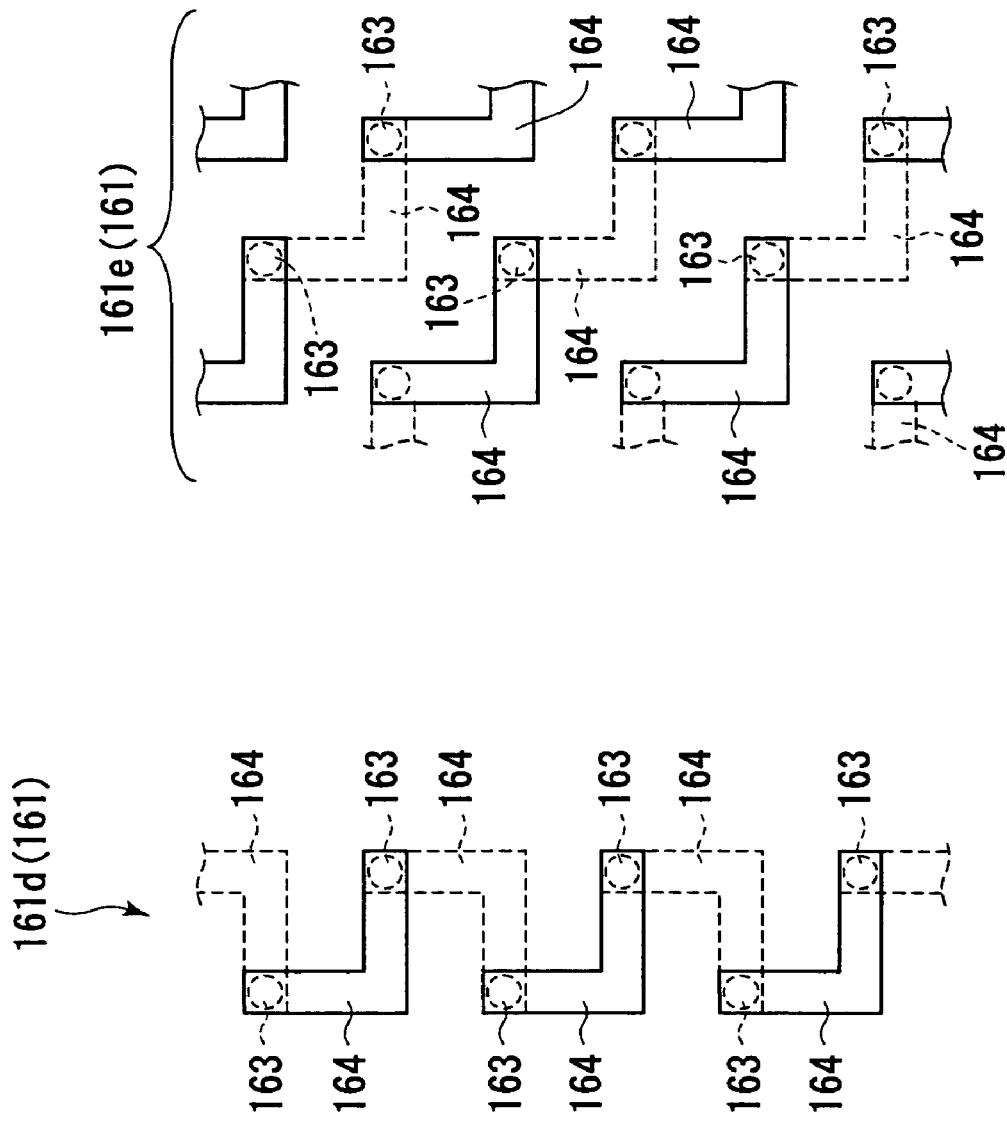

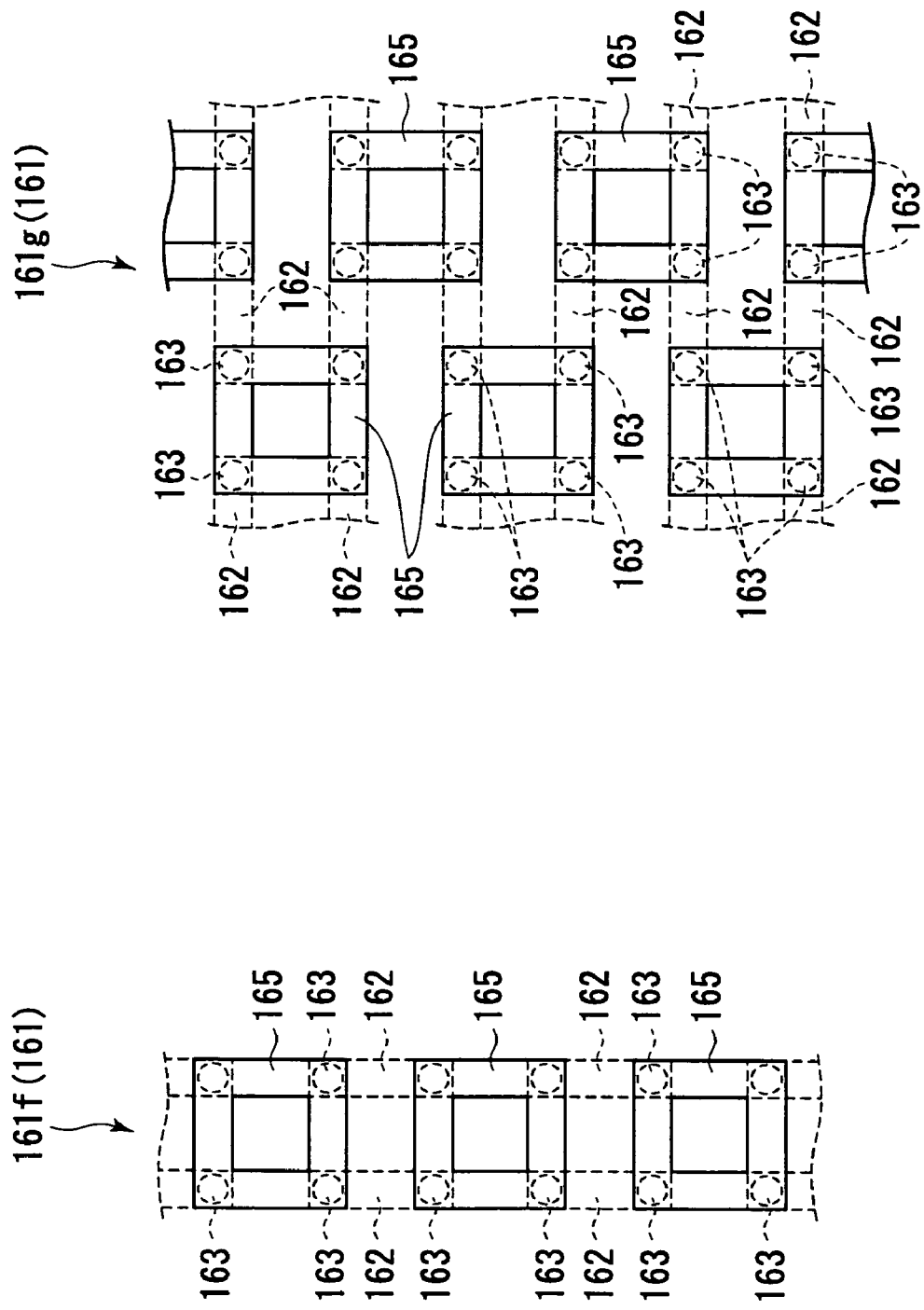

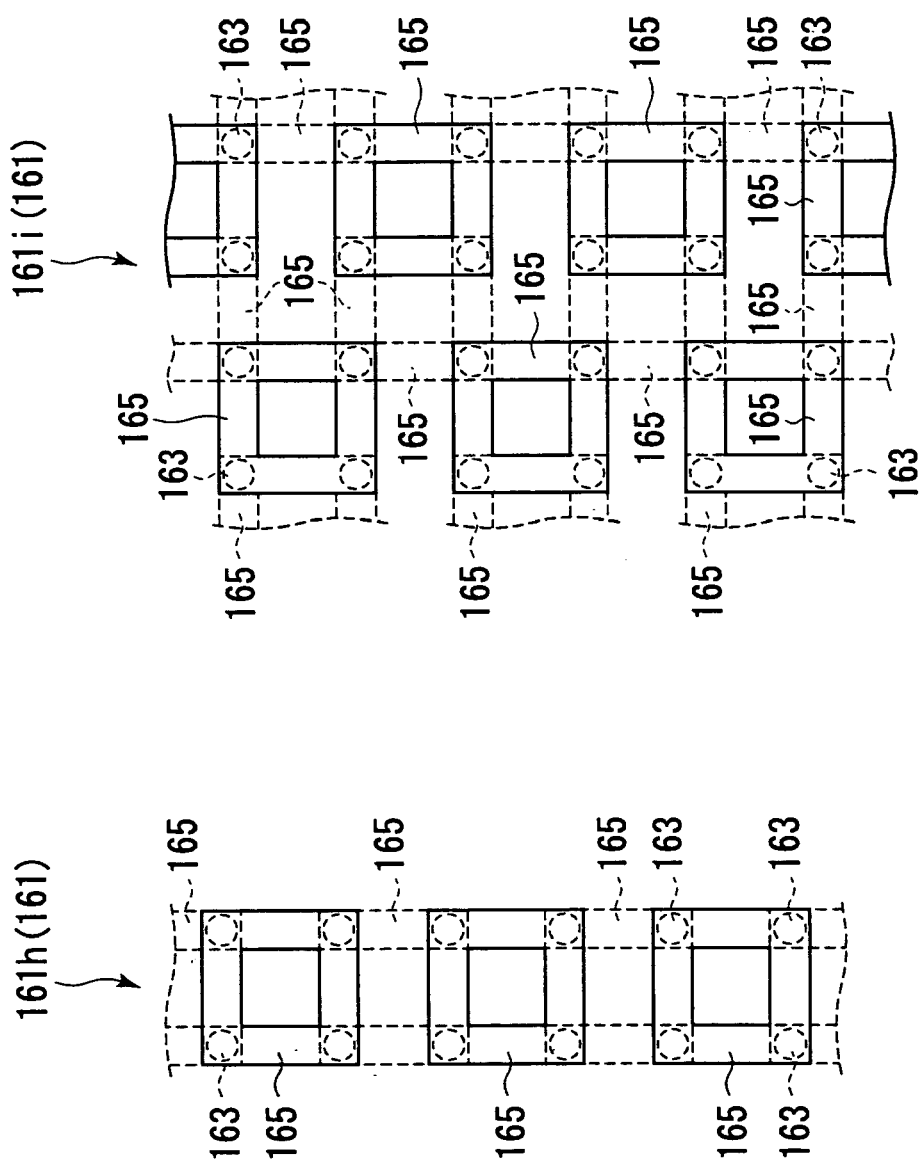
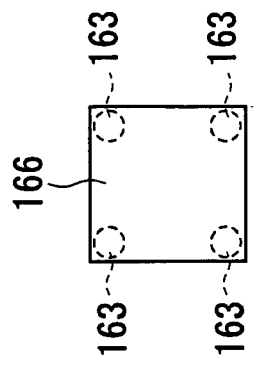

SEMICONDUCTOR DEVICE

CROSS-REFERENCE TO RELATED APPLICATIONS

This is a division of application Ser. No. 10/653,186, filed Sep. 3, 2003 now U.S. Pat. No. 6,958,542, which is incorporated in its entirety herein by reference. This application is also based upon and claims priority from prior Japanese Patent Application No. 2002-257974, filed Sep. 3, 2002, the entire contents of which are incorporated herein by reference.

BACKGROUND OF THE INVENTION

1. Field of the Invention

The present invention relates to a technique for enhancing reliability of a semiconductor device, particularly to a semiconductor device in which durability of a conductive portion against a heat stress generated in an insulating film formed of a low relative dielectric constant film is enhanced.

2. Description of the Related Art

In recent years, to speed up semiconductor devices such as LSI, reduction of a wiring resistance or reduction of dielectric constant of an interlayer insulating film have been advanced. Concretely, a material of a wiring has been shifted to copper (Cu) from aluminum (Al). Also for the interlayer insulating film, films having a low relative dielectric constant film (low-k films) such as a simple $SiO_2$ film, an $SiO_2$ film doped with fluorine, and an $SiO_2$ film containing organic components have been attempted to be employed.

The low relative dielectric constant film is formed by lowering density of the material or by removing polarity from the material. For example, when the material density is lowered, the material is usually prepared to be porous. Since the low relative dielectric constant film is low in the film density, mechanical physical values such as Young's modulus are usually low. That is, the low relative dielectric constant film is weak in the material itself. Additionally, the low relative dielectric constant film includes a film structure having a low polarity so as to lower the dielectric constant in the film. Therefore, adhesion strength is little in a laminate interface between laminate films in which the low relative dielectric constant films are stacked or the low relative dielectric constant film and another film are stacked. Concretely, the materials of the films change in properties by permeation of gas for use in processing/forming via holes or grooves for wirings in the low relative dielectric constant film, or by processing processes. Accordingly, there is possibility that the mechanical strength of the material of the low relative dielectric constant film is deteriorated, or the adhesion strength in the interface between the laminate films including the low relative dielectric constant film is deteriorated.

The little film strength of the low relative dielectric constant film or the little adhesion strength in the interface between the laminate films including the low relative dielectric constant film is a large obstacle to a multi-layer process in which especially the wiring of the semiconductor device is formed in a multi-layered structure. In order to overcome this obstacle, an interface treatment technique or a process at the time of RIE processing is optimized, and accordingly enhancement of the film strength of the low relative dielectric constant film or the adhesion strength in the multi-layered wiring structure including the low relative dielectric constant film has been attempted. This technique is described, for example, in Jpn. Pat. Appln. KOKAI Publication No. 11-176835.

As described above, the material of the low relative dielectric constant film is essentially low in the Young's modulus as compared with that of a general $SiO_2$-based insulating film. Additionally, it is seen that the material of the low relative dielectric constant film is high in coefficient of linear expansion as compared with that of the general $SiO_2$-based insulating film. A possibility that the low Young's modulus and high coefficient of linear expansion of the low relative dielectric constant film cause unknown defects in the semiconductor device and a process for manufacturing the device is high. Additionally, full-scale studies or countermeasures have not been carried out against the low Young's modulus and high coefficient of linear expansion of the low relative dielectric constant film.

BRIEF SUMMARY OF THE INVENTION

According to an aspect of the present invention, there is provided a semiconductor device comprising: an insulating film which is provided in at least one layer above a substrate and whose relative dielectric constant is 3.4 or less; at least one conductive layer provided in the insulating film; at least one conductive plug which is formed in the insulating film and which is electrically connected to the conductive layer to form a conduction path; at least one reinforcing material which is provided under at least the conductive layer and whose Young's modulus is 30 GPa or more; a plurality of first reinforcing plugs which are connected to the conductive layer, which are formed in contact with the reinforcing material, and which are arranged within 5 µm from the conductive plug, an interval between plugs including the respective first reinforcing plugs and the conductive plug being set to 1 µm or less; a reinforcing metal layer which is provided in the insulating film in an area other than that where the conductive layer is formed, and which is electrically disconnected from the conductive layer and the conductive plug; and a second reinforcing plug which is connected to the under side of the reinforcing metal layer and which is formed in contact with the reinforcing material.

According to another aspect of the invention, there is provided a semiconductor device comprising: an insulating film which is provided above a substrate and whose relative dielectric constant is 3.4 or less; a conductive layer provided in the insulating film; a conductive plug which is formed in the insulating film and which is electrically connected to the conductive layer to form a conduction path; and at least one dummy via chain which is provided in the insulating films stacked in two or more layers above the substrate within 5 µm from a wiring layer comprised of the conductive layer and the conductive plug; wherein the dummy via chain comprises at least two reinforcing metal layers and at least one reinforcing plug, in which the reinforcing metal layer is electrically disconnected from the wiring layer, at least one reinforcing metal layer is provided in each of the insulating films of at least two different layers of the respective insulating films, the reinforcing metal layer is extended and formed to be longer than a diameter of the reinforcing plug along the surface of the insulating film, the reinforcing metal layers are superposed upon each other in a stacking direction of the insulating films and deviate from each other along a direction vertical to the stacking direction of the insulating films, the reinforcing plug is formed in the insulating film of at least one layer, and the reinforcing plug connects the reinforcing metal layer to another reinforcing metal layer along the stacking direction of the insulating films.

BRIEF DESCRIPTION OF THE SEVERAL VIEWS OF THE DRAWING

FIG. 24A is a plan view showing the pattern in which the dummy via chain according to the ninth embodiment is provided;

FIG. 24B is a plan view showing another pattern in which the dummy via chain according to the ninth embodiment is provided;

FIG. 24C is a plan view showing another pattern in which the dummy via chain according to the ninth embodiment is provided;

FIG. 25A is a plan view showing another pattern in which the dummy via chain according to the ninth embodiment is provided;

FIG. 25B is a plan view showing another pattern in which the dummy via chain according to the ninth embodiment is provided;

FIG. 26A is a plan view showing still another pattern in which the dummy via chain according to the ninth embodiment is provided;

FIG. 26B is a plan view showing still another pattern in which the dummy via chain according to the ninth embodiment is provided;

FIG. 27A is a plan view showing still another pattern in which the dummy via chain according to the ninth embodiment is provided;

FIG. 27B is a plan view showing still another pattern in which the dummy via chain according to the ninth embodiment is provided;

FIG. 27C is a plan view showing another shape of a reinforcing metal layer provided in the dummy via chain according to the ninth embodiment;

DETAILED DESCRIPTION OF THE INVENTION

Embodiments of the present invention will be described hereinafter with reference to the drawings.

(First Embodiment)

Prior to description of a first embodiment according to the present invention, simulations carried out in consideration with the above-described problems of the related art by the present inventors will first be described. As a result of the simulation, it has first been clarified that there is a possibility of occurrence of the following problem. With a decrease of Young's modulus of an interlayer insulating film in which a wiring is formed, for example, a force weakens with which distortion by heat generated in a metal wiring has been suppressed in a multi-layered wiring forming process. Then, a heat stress generated in a wiring itself drops, but the wiring freely expands/contracts. As a result, a load for displacement of the wiring is applied to a via plug formed in an end of the wiring. This will concretely be described hereinafter with reference to FIGS. 41A to 43. FIGS. 41A, 41B, 42A, and 42B show results of simulation of sizes of stresses applied to a barrier metal film in the via plug, and shapes of the film, assuming that the interlayer insulating film formed of materials different from one another in Young's modulus is heated at about 400° C.

Figure 41A:
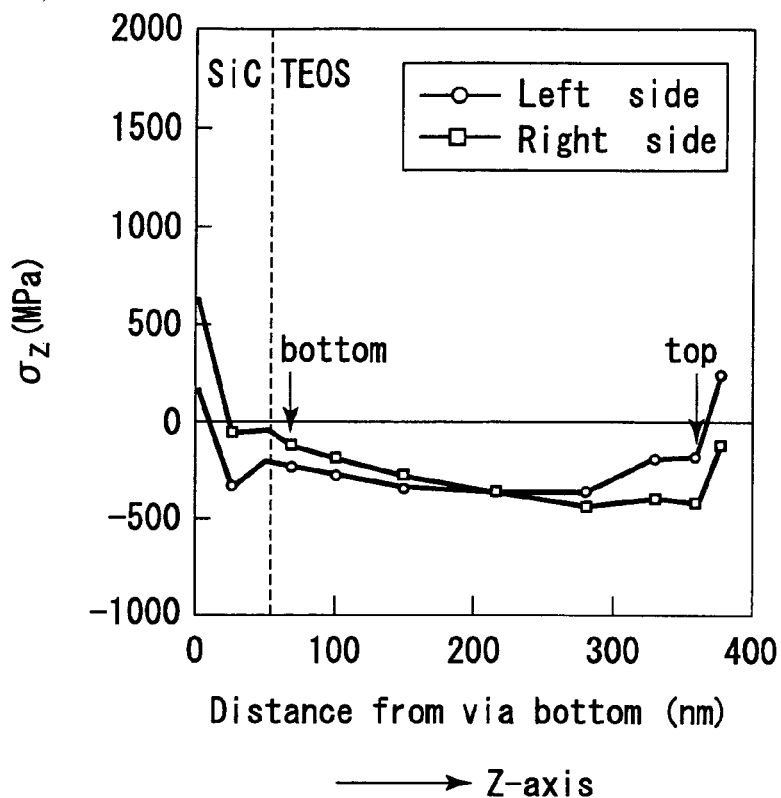
FIG. 41A is a characteristic diagram showing the results of the simulation carried out by the present inventors according to a related art.
Figure 41B:
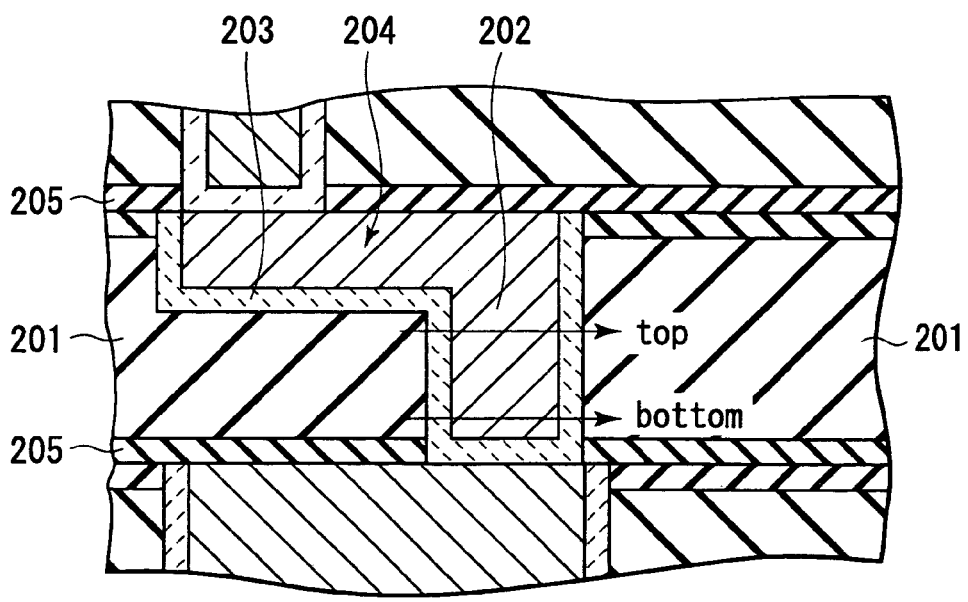
FIG. 41B is a sectional view showing the results of the simulation carried out by the present inventors according to the related art.

FIGS. 41A and 41B show the results of the simulation in a case in which a general TEOS film 201 having a Young's modulus of about 60 GPa is used as the interlayer insulating film. In this case, as shown in FIG. 41A, large stress concentration does not occur on left and right sides of a barrier metal film (TaN film) 203 in a via plug 202. Especially, as shown by solid-line arrows in FIG. 41A, in top and bottom portions of the barrier metal film (TaN film) 203 in the via plug 202 to which the stress is easily added, the large stress concentration does not occur on either the left or right side. Additionally, the large stress concentration does not occur even in the whole via plug 202 and barrier metal film 203.

Moreover, the distortion is enlarged ten times and the sectional shapes are further simulated. Even in this case, as shown in FIG. 41B, deformation by the stress of a metal wiring 204 is hardly confirmed in the via plug 202 and barrier metal film 203. It is to be noted that a graph shown in FIG. 41A shows simulated results of a distribution of a stress ($\sigma z$) in a vertical direction along a height direction of the via plug 202 in the vicinity of an interface between the via plug 202 and barrier metal film 203. To carry out the simulation, in FIG. 41B a lower surface of an SiC layer 205 which is a top barrier layer is set to an origin, and the height direction of the via plug 202 is set to a Z-axis. This also applies to the simulation and results shown in FIGS. 42A and 42B.

Figure 42A:
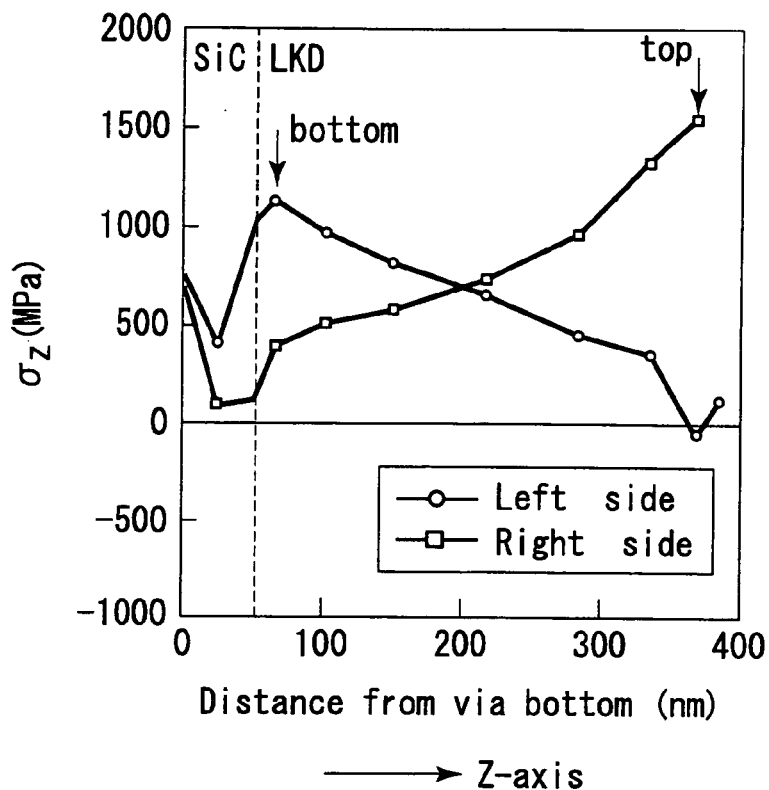
FIG. 42A is a characteristic diagram showing the results of the simulation carried out by the present inventors according to the related art.
Figure 42B:
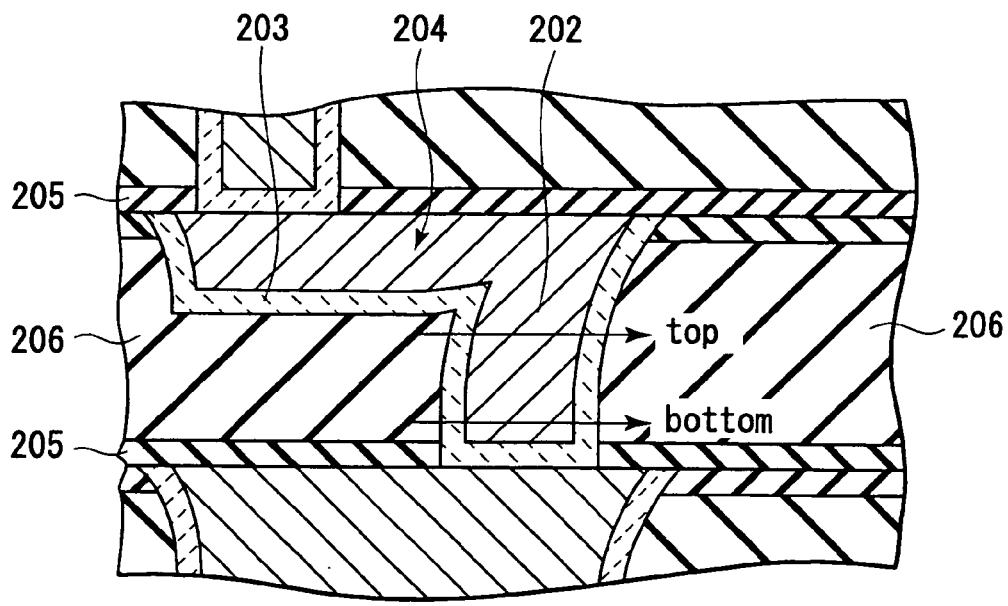
FIG. 42B is a sectional view showing the results of another simulation carried out by the present inventors according to the related art.

FIGS. 42A and 42B show the simulation results in a case where a low relative dielectric constant film (low-k film) 206 having a Young's modulus of about 11 GPa is used as the interlayer insulating film. In this case, a force weakens with which stretching of the metal wiring 204 along a longitudinal direction by the heat is suppressed. Therefore, as shown by the solid-line arrows in FIG. 42A, in the barrier metal film (TaN film) 203 in the via plug 202, the large stress concentration occurs in the bottom or top portion on the left and right sides. A stress applied to the via plug 202 along the longitudinal direction of the wiring will hereinafter be referred to as a horizontal load stress. As shown in FIG. 42B, the via plug 202 and barrier metal film 203 are largely deformed by the horizontal load stress generated in the wiring 204.

According to these results, it is feared that a possibility of destruction of the barrier metal film as a side wall of the via plug because of the horizontal load stress is high. When the barrier metal film is destroyed, metal materials for the wiring, such as Cu, possibly project into the interlayer insulating film from a destroyed portion. When the metal for the wiring projects into the interlayer insulating film from the via plug, an open defect of a conductive layer by metal shortage in the via plug is caused, the projecting metal for the wiring causes short-circuit with a conductive portion, or there is further a high possibility of device defects caused by the metal for the wiring diffused into a device portion. When the metal for the wiring projects into the interlayer insulating film from the via plug in this manner, a possibility that fatal via plug defects are caused is high.

Figure 43:
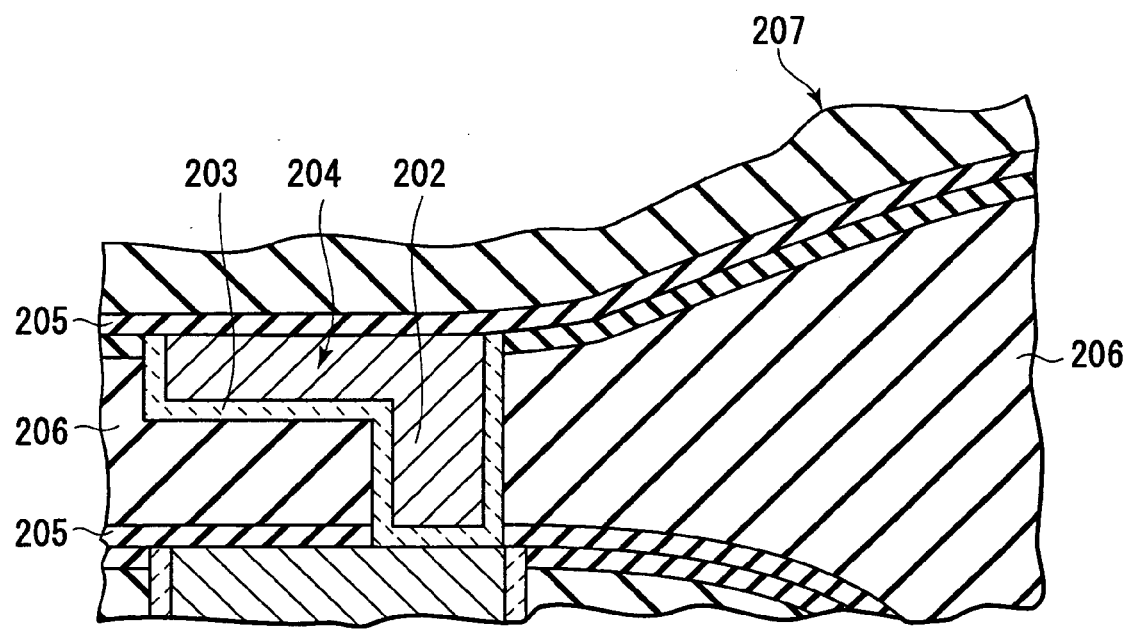
FIG. 43 is a sectional view showing a state in which an interlayer insulating film formed of a low relative dielectric constant film according to the related art thermally expands.

Moreover, as described above, a mechanical strength of the low relative dielectric constant film is lower than that of a general interlayer insulating film by about 1 to 20 GPa. Additionally, a coefficient of linear expansion of the low relative dielectric constant film is higher than that of the general interlayer insulating film or wiring material by about 20 to 70 ppm. For example, the coefficient of expansion of Cu which is the material of the wiring is about 16 ppm. Therefore, as shown in FIG. 43, the low relative dielectric constant film 206 easily thermally expands, for example, even along a thickness direction, and the load by the heat stress along the thickness direction is easily produced in the film. That is, in the low relative dielectric constant film 206, the load by the heat stress is easily generated along a direction vertical to the surface of the substrate, or along the height direction of the via plug 202 in the film. The stress applied to the via plug 202 along the thickness direction of the low relative dielectric constant film will hereinafter be referred to as a vertical load stress.

The vertical load stress generated in the low relative dielectric constant film 206 is easily applied, for example, to the via plug 202 in the film 206. Especially when the via plug 202 is isolated/provided, the vertical load stress of the low relative dielectric constant film 206 in a whole via plug peripheral area surrounding the isolated via plug 202 is overconcentrated in the isolated via plug 202. As a result, it is easily assumed that the vertical load stress generated in the low relative dielectric constant film 206 at the time of heating at high temperature in a manufacturing process of the semiconductor device causes the destruction of the isolated via plug 202. It is clear that this phenomenon is caused mainly by the via plug 202 provided in a compressed manner. It is especially feared that the phenomenon remarkably appears in the via plug 202 provided adjacent to a broad space area (field area) 207 in which the wiring 204, and the like are not formed.

As described above, when the low relative dielectric constant film is employed in the interlayer insulating film, there is a very high possibility that the fatal defects are caused in the conductive portions such as the via plug by the horizontal load stress generated in the wiring and the vertical load stress generated in the film in a heat process. Accordingly, there is a very high possibility that the fatal defects are caused in the semiconductor device and the process for manufacturing the device. That is, there is a possibility that the capability or quality of the semiconductor device drops and that the reliability of the semiconductor device drops. Additionally, there is a possibility that a defective semiconductor device is manufactured to lower yield of the semiconductor device and that production efficiency of the semiconductor device drops.

The first embodiment according to the present invention has been developed to solve the above-described problems. An object of the embodiment is to provide a semiconductor device including an insulating film formed of the low relative dielectric constant film. In the device, durability of the conductive portion against the load by the heat stress generated in the conductive portion and low relative dielectric constant film is enhanced, and the reliability is enhanced. This will be described hereinafter in detail.

Figure 8:
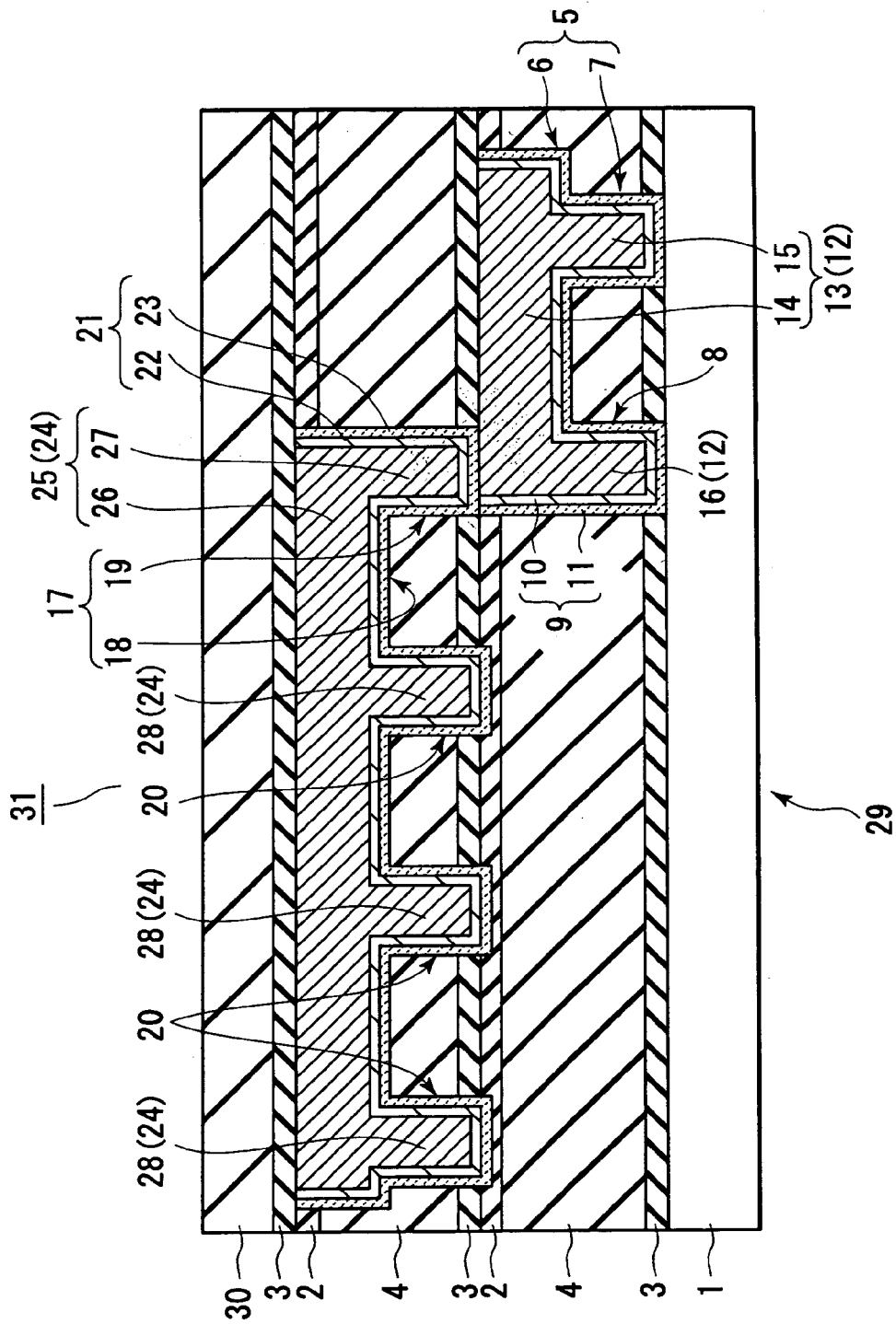
FIG. 8 is a sectional view showing the semiconductor device according to the first embodiment.
Figure 9:
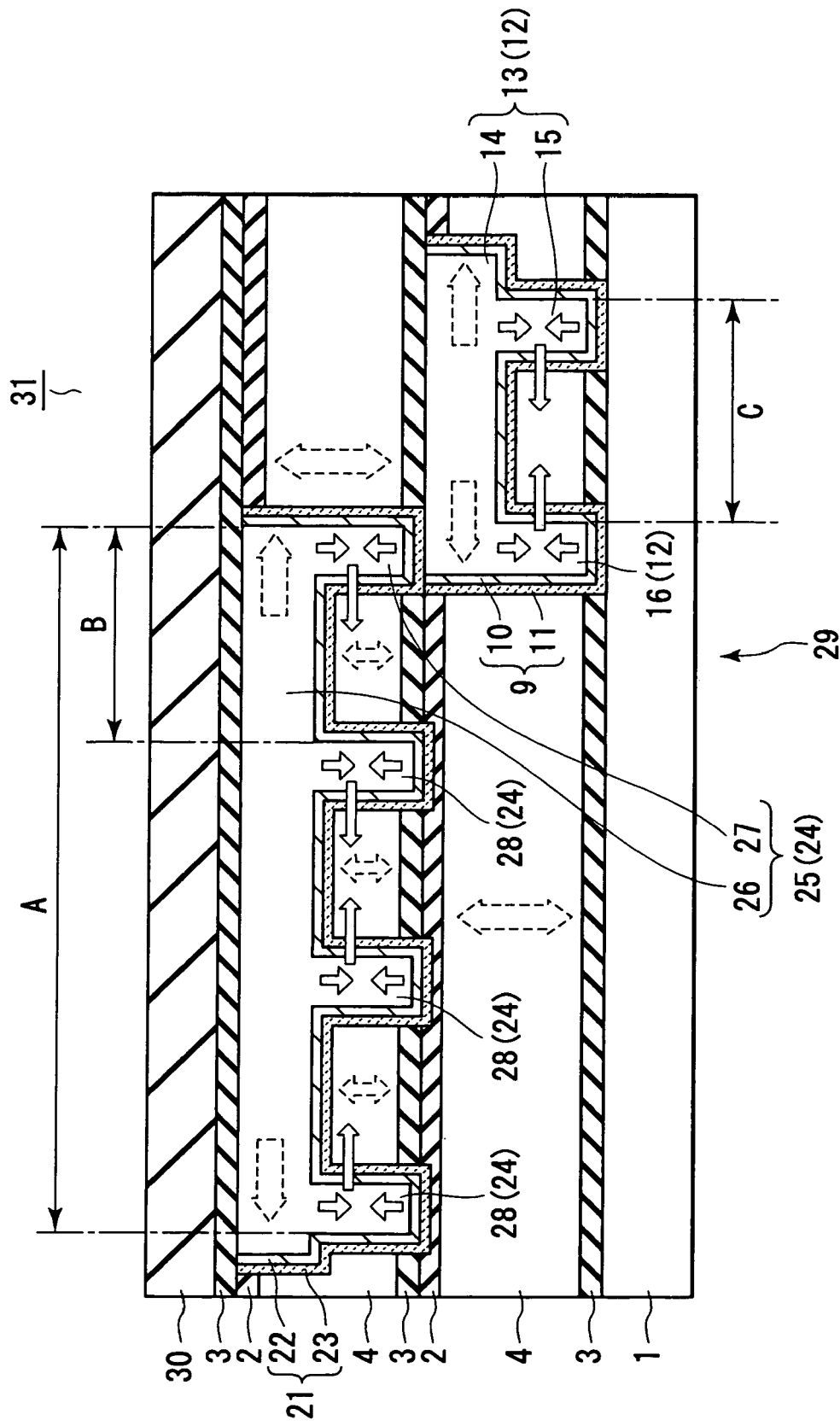
FIG. 9 is a sectional view schematically showing a wiring structure inside the semiconductor device according to the first embodiment and a heat stress generated in the device.

Next, the first embodiment according to the present invention will be described with reference to FIGS. 1 to 9. FIGS. 1 to 7 are step sectional views showing a method for manufacturing the semiconductor device according to the present embodiment. FIG. 8 is a sectional view showing the semiconductor device according to the present embodiment. FIG. 9 is a sectional view schematically showing a wiring structure inside the semiconductor device according to the present embodiment and a heat stress generated in the device.

In the first embodiment, for the semiconductor device using the low relative dielectric constant film (low-k film) which is the interlayer insulating film, a technique for inhibiting the stress from being generated in the semiconductor device by thermal expansion of the wiring will be described. In the present embodiment, two wiring layers of the semiconductor device are stacked. The semiconductor device and the method for manufacturing the device according to the present embodiment will hereinafter be described along an order of manufacturing steps.

Figure 1A:
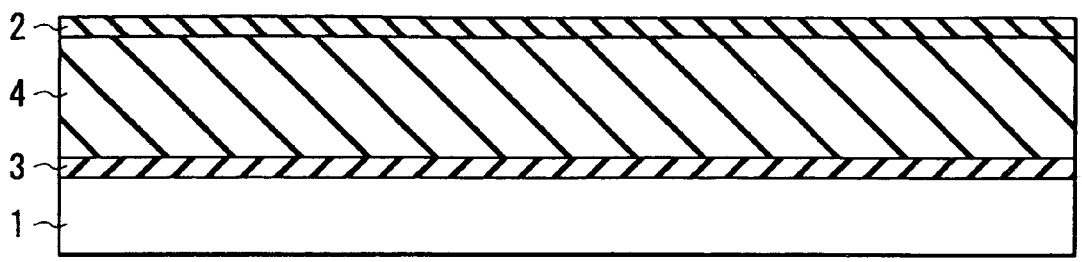
FIG. 1A is a step sectional view showing a manufacturing step of a semiconductor device according to a first embodiment.

First, as shown in FIG. 1A, on a silicon substrate (semiconductor substrate) 1 in which an active area and underlayer wiring comprising various electronic circuits (not shown) are formed, an insulating film 3, interlayer insulating film (inter-level dielectrics: ILD) 4, and another insulating film 2 are successively stacked. Concretely, first on the surface of the Si substrate 1, for example, a CVD process is used to deposit the insulating film 3 whose Young's modulus is about 30 GPa or more in a film thickness of about 50 nm. This insulating film 3 functions as a first reinforcing film (reinforcing material), and in the present embodiment, for example, an SiCN film is employed as the insulating film 3. Subsequently, on the surface of this SiCN film 3, the CVD process is used to deposit the interlayer insulating film 4 which is a first layer in a film thickness of about 300 nm.

A so-called low relative dielectric constant film (low-k film) having a relative dielectric constant of about 3.4 or less is employed in the interlayer insulating film 4. Examples of the low relative dielectric constant film 4 include a methyl polysiloxane (MSQ)-based low-k film including an SiOC composition, and polyarylene ether (PAE)-based low-k film. In the present embodiment, especially the PAE-based low relative dielectric constant film 4 having a Young's modulus of about 5 GPa and a coefficient of linear expansion of about 40 ppm is employed as the interlayer insulating film 4. Therefore, in the present embodiment, the SiCN film 3 having a Young's modulus of about 30 GPa or more is provided to directly contact the underside (back surface) of the PAE-based low relative dielectric constant film 4 which has a relative dielectric constant of about 3.4 or less, Young's modulus of about 5 GPa, and coefficient of linear expansion of about 40 ppm. Subsequently, on the surface of the low relative dielectric constant film 4, the CVD process is used to deposit the insulating film 2 having a Young's modulus of about 30 GPa or more, which is a first layer, in the film thickness of about 50 nm. This insulating film 2 on the surface of the low relative dielectric constant film 4 functions as a capping layer (capping film) of the first layer. When the SiCN film 3 is used as a first reinforcing film, the insulating film 2 on the low relative dielectric constant film 4 functions as a second reinforcing film. In the present embodiment, for example, an SiC film is employed as the insulating film 2.

Figure 1B:
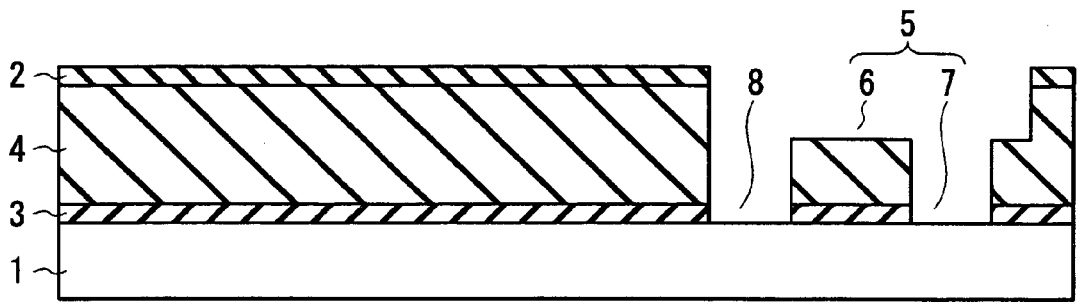
FIG. 1B is a step sectional view showing the manufacturing step of the semiconductor device according to the first embodiment.

Next, as shown in FIG. 1B, a recess for a wiring layer 5 of the first layer for forming a conductive layer 14 and conductive plug 15 of the first layer described later is formed over the SiCN film 3 immediately under the low relative dielectric constant film 4 from the SiC film 2 on the low relative dielectric constant film 4. The conductive plug 15 is formed so as to be electrically connected to the conductive layer 14, and comprises a conduction path to be actually energized together with the conductive layer 14. That is, the conductive layer 14 and conductive plug 15 comprise a wiring layer (effective wiring layer) 13 which is actually energized to function as a primary wiring. In the present embodiment, for the wiring layer 13, the conductive layer 14 and conductive plug 15 are integrally formed. That is, the wiring layer 13 is formed in a so-called dual damascene structure. Therefore, the recess 5 is formed in a two-stage structure including a recess for the conductive layer 6 in the top and a recess for the conductive plug 7 in the bottom. At this time, the recess 6 and the recess 7 are integrally formed. It is to be noted that the conductive plug 15 of the first layer is formed as the contact plug 15 for securing the conduction to the electronic circuit formed in the Si substrate 1. Therefore, the recess for the conductive plug 7 of the first layer is formed as the usual recess for the contact plug 7.

The recess 5 is formed, for example, using an RIE process. In this case, the recess 7 is formed through the SiCN film 3 of the first layer so as to expose the surface of the Si substrate 1 so that the conduction of the contact plug 15 to the electronic circuit formed in the Si substrate 1 is secured.

Moreover, the wiring layer 13 (conductive layer 14) is connected to a first reinforcing plug (mechanical reinforcing plug) 16 as described later so as to enhance the durability of the wiring layer 13 against the heat stress generated in the wiring layer 13 which is the conductive portion and the low relative dielectric constant film 4 which is the insulating film. In the present embodiment, one first reinforcing plug 16 is formed whose upper end (top portion) is directly connected to the undersurface (back surface) of the conductive layer 14. That is, in the same manner as the conductive layer 14 and contact plug 15, the conductive layer 14 and first reinforcing plug 16 are formed in the dual damascene structure which is an integral structure. Therefore, a recess for the first reinforcing plug 8 for forming the first reinforcing plug 16 is integrally formed with the recess 6. In actual, the recess 8 is formed in parallel with the recess 7 using the RIE process. Therefore, the recess 8 is formed through the SiCN film 3 of the first layer so that the surface of the Si substrate 1 is exposed.

Figure 2A:
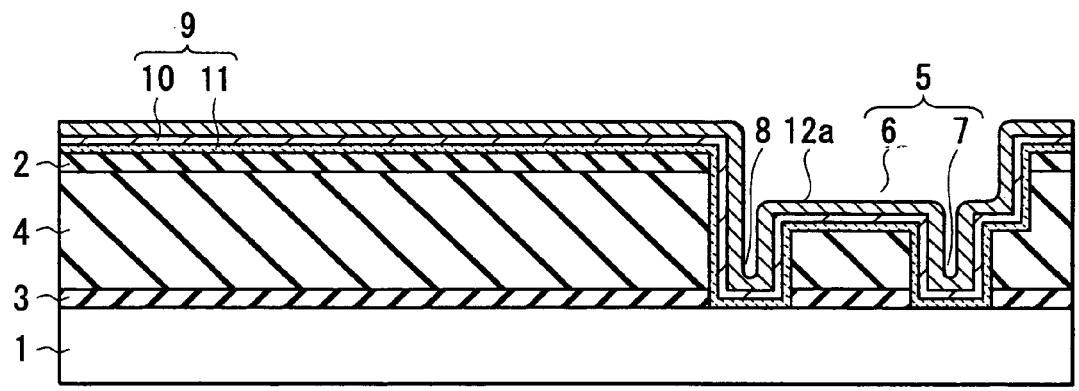
FIG. 2A is a step sectional view showing the manufacturing step of the semiconductor device according to the first embodiment.

Next, as shown in FIG. 2A, a barrier metal film 9 is provided on the surface of the SiC film of the first layer (capping layer of the first layer) 2, inside the recess 5, and inside the recess 8. In the barrier metal film 9, the Ta/TaN laminate film 9 is employed including a Ta film 10 which is the metal layer and a TaN film 11 which is a layer having conductivity. Concretely, the barrier metal film 9 is formed in a two-layer structure including the Ta film 10 formed inside to directly contact the wiring layer 13, and the TaN film 11 provided outside the Ta film 10. For example, a sputtering film forming method of a bias application type is used to form the barrier metal film 9 in the film thickness of about 10 nm.

Subsequently, the Si substrate 1 is conveyed in high vacuum so as to prevent the Si substrate 1 in which the barrier metal film 9 is formed from being exposed to the atmosphere, and is fed into a treatment chamber of a sputtering device (not shown) for forming a plating seed layer (film) 12a which is a base (substrate) of the conductive layer 14. Thereafter, materials forming the conductive layer 14, conductive plug 15, and first reinforcing plug 16 are provided on the surface of the Ta film 10. In the present embodiment, copper (Cu) is used to integrally form the conductive layer 14, conductive plug 15, and first reinforcing plug 16. Concretely, the plating seed layer (film) 12a is first provided on the surface of the Ta film 10. For example, the sputtering method of a self ionized type (self ionized sputtering method: SIS method) is used to form the Cu plating seed layer 12a until the film thickness reaches about 70 nm in terms of conversion to a solid film.

Figure 2B:
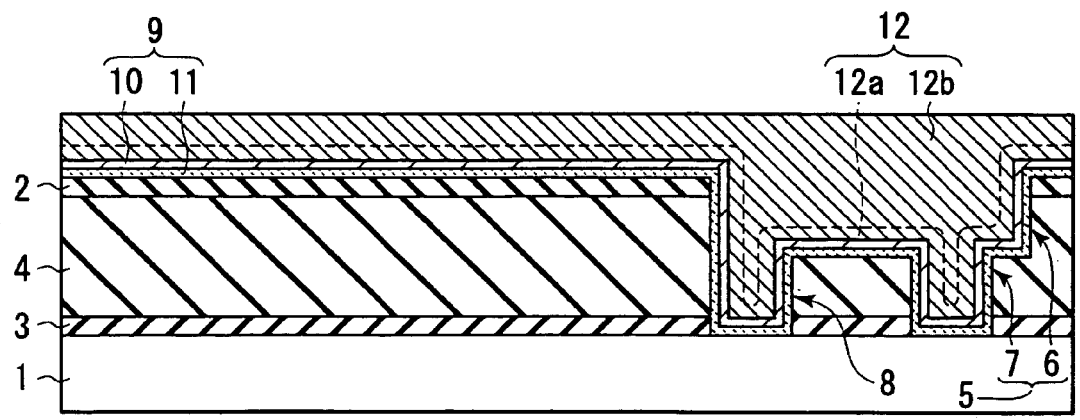
FIG. 2B is a step sectional view showing the manufacturing step of the semiconductor device according to the first embodiment.

Next, as shown in FIG. 2B, a Cu plating film 12b is provided on the surface of the Cu plating seed layer 12a. The Cu plating film 12b is formed, for example, using an electrolytic plating process. The Cu plating film 12b is formed integrally with the Cu plating seed layer 12a. Accordingly, on the surface of the Ta film 10, a Cu film 12 is formed which is the forming material of the conductive layer 14, conductive plug 15, and first reinforcing plug 16.

Figure 3A:
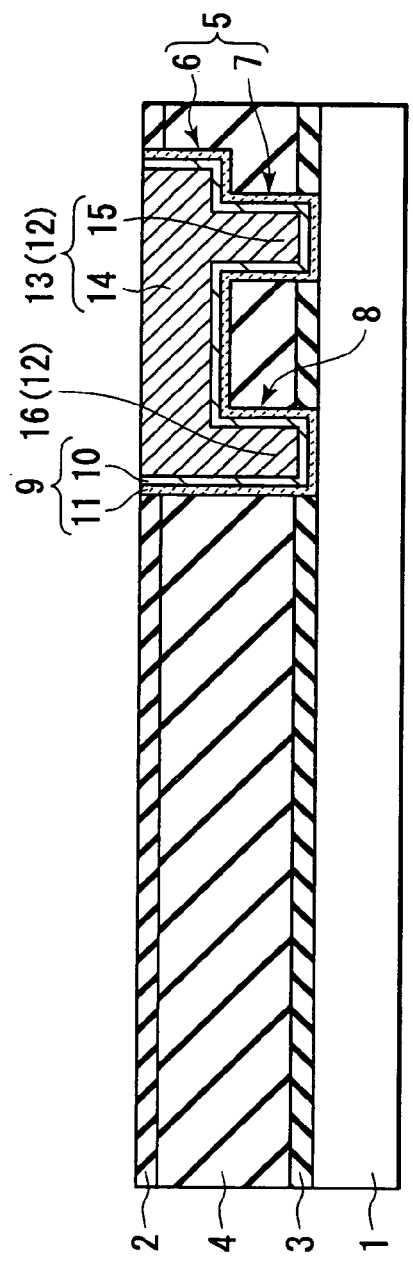
FIG. 3A is a step sectional view showing the manufacturing step of the semiconductor device according to the first embodiment.

Next, as shown in FIG. 3A, the unnecessary barrier metal film 9 and Cu film 12 are removed. Concretely, a CMP process is used to grind and remove the barrier metal film 9 and Cu film 12 on the surface of the SiC film of the first layer (capping layer of the first layer) 2. Accordingly, the unnecessary barrier metal film 9 and Cu film 12 outside the recess 5 and the recess 8 are removed from the capping layer 2, and the barrier metal film 9 and Cu film 12 are left only inside the recess 5 and the recess 8. That is, only inside the recess 5 and the recess 8, the Cu film 12 is buried to comprise the barrier metal film 9 including the laminate film of the Ta film 10 and TaN film 11, the conductive layer 14, the conductive plug 15, and the first reinforcing plug 16. As a result, to extend over the SiCN film 3 of the first layer from the SiC film 2 of the first layer, the Cu wiring layer 13 of the first layer including the Cu conductive layer 14 and Cu conductive plug (Cu conductive contact plug) 15, and the first reinforcing plug 16 of the first layer are formed. The Cu wiring layer 13 is a so-called Cu dual damascene wiring.

In the same manner as the Cu contact plug 15, the Cu first reinforcing plug 16 is formed extending through the SiCN film 3 of the first layer having a Young's modulus of about 30 GPa or more to indirectly contact the surface of the Si substrate 1 via the barrier metal film 9. That is, the Cu first reinforcing plug 16 is formed to be substantially connected to the Si substrate 1 and the SiCN film 3 of the first layer via the barrier metal film 9 in the lower end (bottom portion). The Cu first reinforcing plug 16 is a so-called dummy plug (sacrifice plug) which does not substantially function as the wiring. Moreover, the Cu first reinforcing plug 16 of the first layer may also be referred to as a Cu reinforcing contact plug or Cu sacrifice contact plug.

Figure 3B:
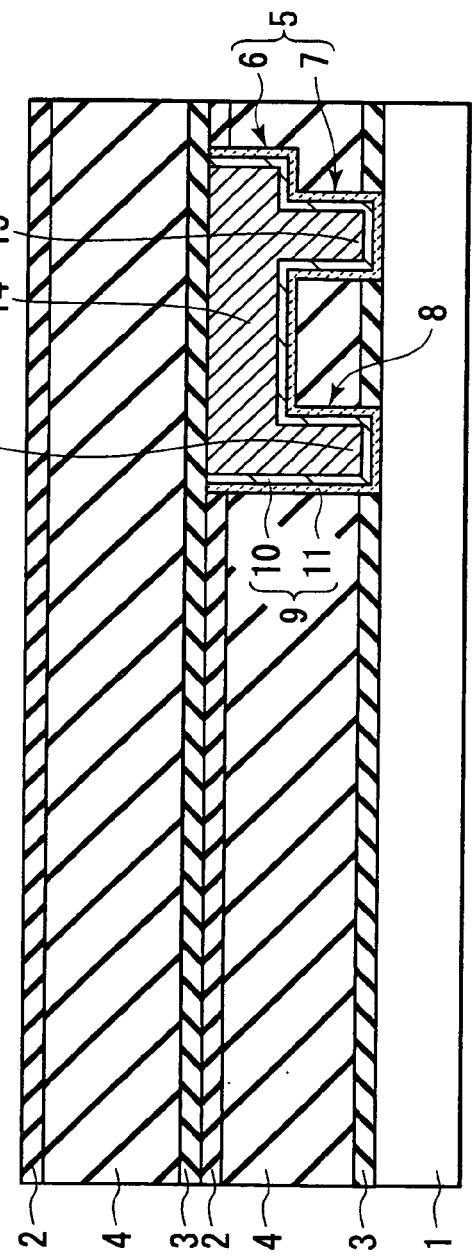
FIG. 3B is a step sectional view showing the manufacturing step of the semiconductor device according to the first embodiment.

Next, as shown in FIG. 3B, on the SiC film 2 and Cu wiring layer 13 of the first layer, the SiCN film 3, the low relative dielectric constant film 4, and the SiC film (capping layer of a second layer) 2 of the second layer are successively stacked. Concretely, first on the surfaces of the SiC film 2 and Cu wiring layer 13 of the first layer, the CVD process is used to deposit the SiCN film 3 of the second layer in the film thickness of about 50 nm. The SiCN film 3 of the second layer functions as a top barrier layer (film) of the first layer. Subsequently, on the surface of the SiCN film 3 of the second layer, the CVD process is used to deposit the low relative dielectric constant film 4 of the second layer until the film thickness reaches about 300 nm. Subsequently, on the surface of the low relative dielectric constant film 4 of the second layer, the CVD process is used to deposit the SiC film 2 of the second layer until the film thickness reaches about 50 nm.

Figure 4:
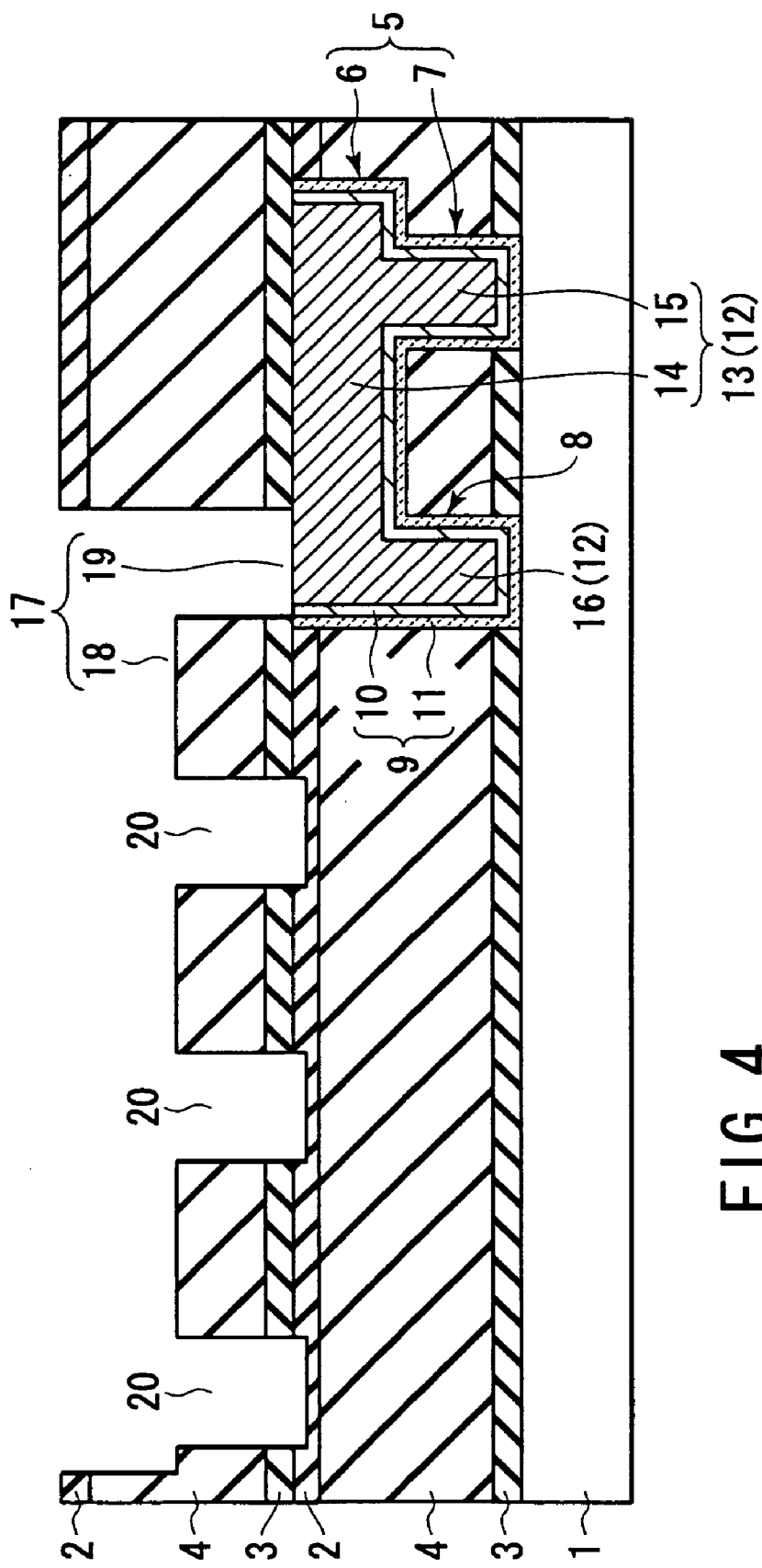
FIG. 4 is a step sectional view showing the manufacturing step of the semiconductor device according to the first embodiment.

Next, as shown in FIG. 4, to extend over to the SiCN film 3 of the second layer from the SiC film 2 of the second layer, a recess for the wiring layer 17 of the second layer is formed for forming a conductive layer 26 and conductive plug 27 of the second layer described later. In the same manner as the conductive layer 14 and conductive plug 15 of the first layer, the conductive plug 27 of the second layer is formed to be electrically connected to the conductive layer 26 of the second layer, and comprises the conduction path to be actually energized together with the conductive layer 26. That is, the conductive layer 26 and conductive plug 27 comprise a wiring layer (effective wiring layer) 25 which is actually energized to function as the essential wiring. In the same manner as the wiring layer 13 of the first layer, for the wiring layer 25 of the second layer, the conductive layer 26 and conductive plug 27 are integrally formed. That is, the wiring layer 25 is formed in the dual damascene structure. Therefore, the recess 17 is formed in the two-stage structure including a recess for the conductive layer 18 in the top and a recess for the conductive plug 19 in the bottom. In this case, the recess 18 and the recess 19 are integrally formed. It is to be noted that the conductive plug 27 of the second layer is formed as the via plug 27 for securing the conduction to the wiring layer 13 of the first layer formed in the low relative dielectric constant film 4 of the first layer. Therefore, the recess 19 of the second layer is formed as the usual recess for the via plug 19.

The recess 17 is formed, for example, using the RIE process. In this case, the recess 19 is formed extending through the SiCN film 3 of the second layer so as to expose the surface of the wiring layer 13 of the first layer so that the conduction of the via plug 27 to the wiring layer 13 of the first layer.

Moreover, in the same manner as in the wiring layer 13 of the first layer, the wiring layer 25 (conductive layer 26) of the second layer is connected to a first reinforcing plug 28 (mechanical reinforcing plug) of the second layer in order to enhance the durability of the wiring layer 25 against the heat stress generated in the wiring layer 25 and the low relative dielectric constant film 4. In the present embodiment, three first reinforcing plugs 28 are formed whose upper ends (top portions) are directly connected to the undersurface (back surface) of the conductive layer 26. That is, in the same manner as the conductive layer 26 and conductive plug 27, the conductive layer 26 and three first reinforcing plugs 28 are formed in the dual damascene structure which is the integral structure. Therefore, three recesses for the first reinforcing plugs 20 for forming the first reinforcing plugs 28 are formed integrally with the recess 18. In actual, each the recess 20 is formed in parallel with the recess 19 using the RIE process. Therefore, each the recess 20 is formed extending through the SiCN film 3 of the second layer so as to expose the surface of the SiC film 2 of the first layer.

It is to be noted that in the actual RIE process, as shown in FIG. 4, there is a possibility of occurrence of a so-called overetching phenomenon in which the bottom portions of the recesses 20 extend below the surface of the SiC film 2 of the first layer. Even when this overetching phenomenon occurs, there is no problem as long as each the recess 20 has a depth to such an extent that the first reinforcing plug 28 of the second layer formed in the recess 20 is not electrically connected to the essential wiring layer (not shown) provided below the plug.

Figure 5:
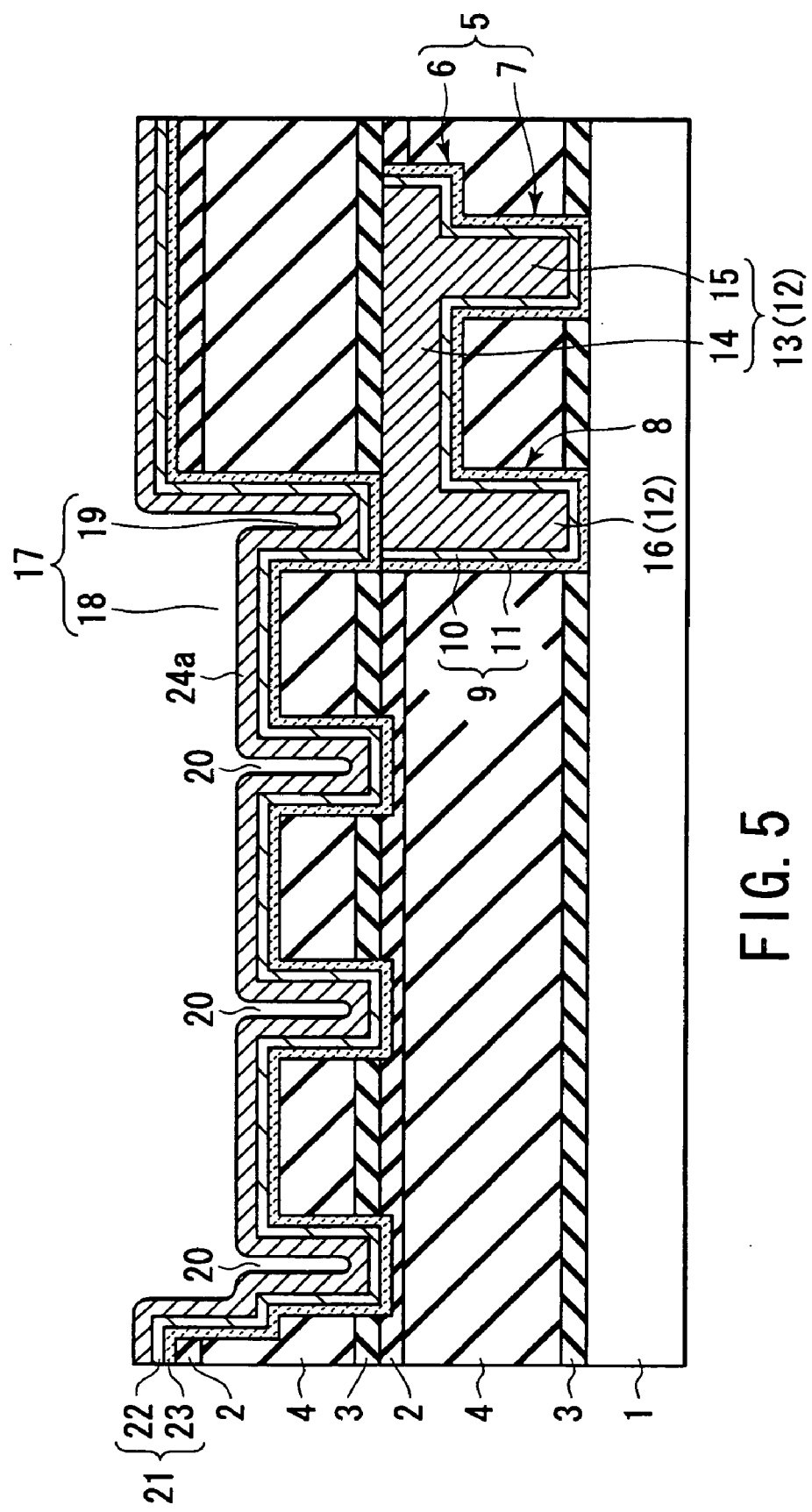
FIG. 5 is a step sectional view showing the manufacturing step of the semiconductor device according to the first embodiment.

Next, as shown in FIG. 5, a barrier metal film 21 of the second layer is provided on the surface of the SiC film of the second layer (capping layer of the second layer) 2, inside the recess 17, and inside each the recess 20. In the same manner as in the barrier metal film 9 of the first layer, the Ta/TaN laminate film 21 including a Ta film 22 and TaN film 23 is employed in the barrier metal film 21 of the second layer. Concretely, the barrier metal film 21 is formed in the two-layer structure including the Ta film 22 formed inside to directly contact the wiring layer 25, and the TaN film 23 provided outside the Ta film 22. The barrier metal film 21 is formed using the sputtering film forming method of the bias application type so as to obtain the film thickness of about 10 nm.

Subsequently, the Si substrate 1 is conveyed in the high vacuum so as to prevent the Si substrate 1 in which the barrier metal film 21 is formed from being exposed to the atmosphere, and is fed into the treatment chamber of the sputtering device. Thereafter, the materials forming the conductive layer 26, conductive plug 27, and first reinforcing plugs 28 are provided on the surface of the Ta film 22. In the same manner as the conductive layer 14, conductive plug 15, and first reinforcing plug 16 of the first layer, the conductive layer 26, conductive plug 27, and first reinforcing plugs 28 are integrally formed using Cu. Concretely, a plating seed layer (film) 24a formed of Cu is first provided on the surface of the Ta film 22. The SIS method is used to form the Cu plating seed layer 24a until the film thickness reaches about 70 nm in terms of the conversion to the solid film.

Figure 6:
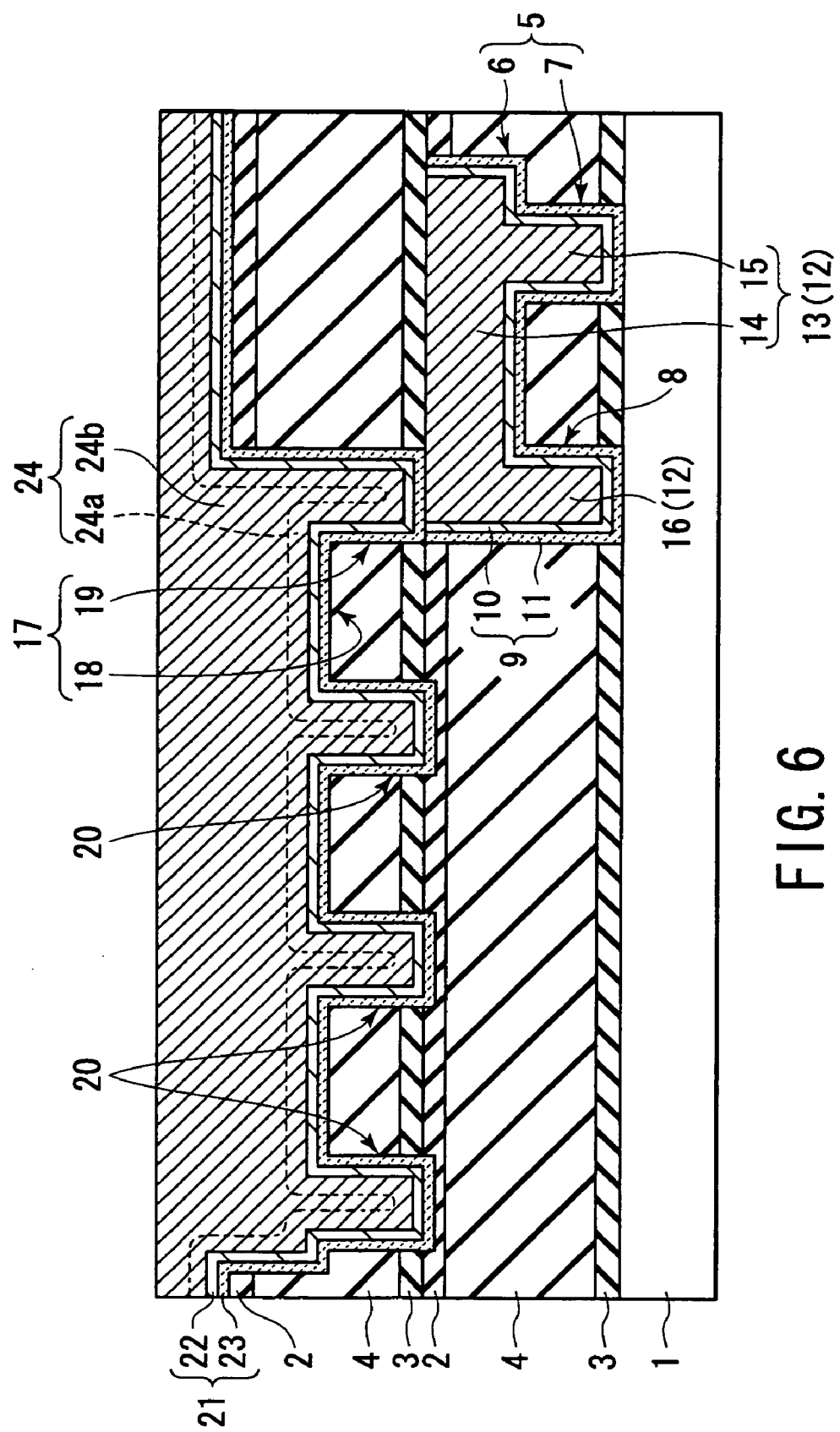
FIG. 6 is a step sectional view showing the manufacturing step of the semiconductor device according to the first embodiment.

Next, as shown in FIG. 6, a Cu plating film 24b is provided on the surface of the Cu plating seed layer 24a. In the same manner as the Cu plating film 12b of the first layer, the Cu plating film 24b is formed using the electrolytic plating process. The Cu plating film 24b is formed integrally with the Cu plating seed layer 24a. Accordingly, on the surface of the Ta film 22, a Cu film 24 of the second layer is formed which is the forming material of the conductive layer 26, conductive plug 27, and first reinforcing plugs 28.

Figure 7:
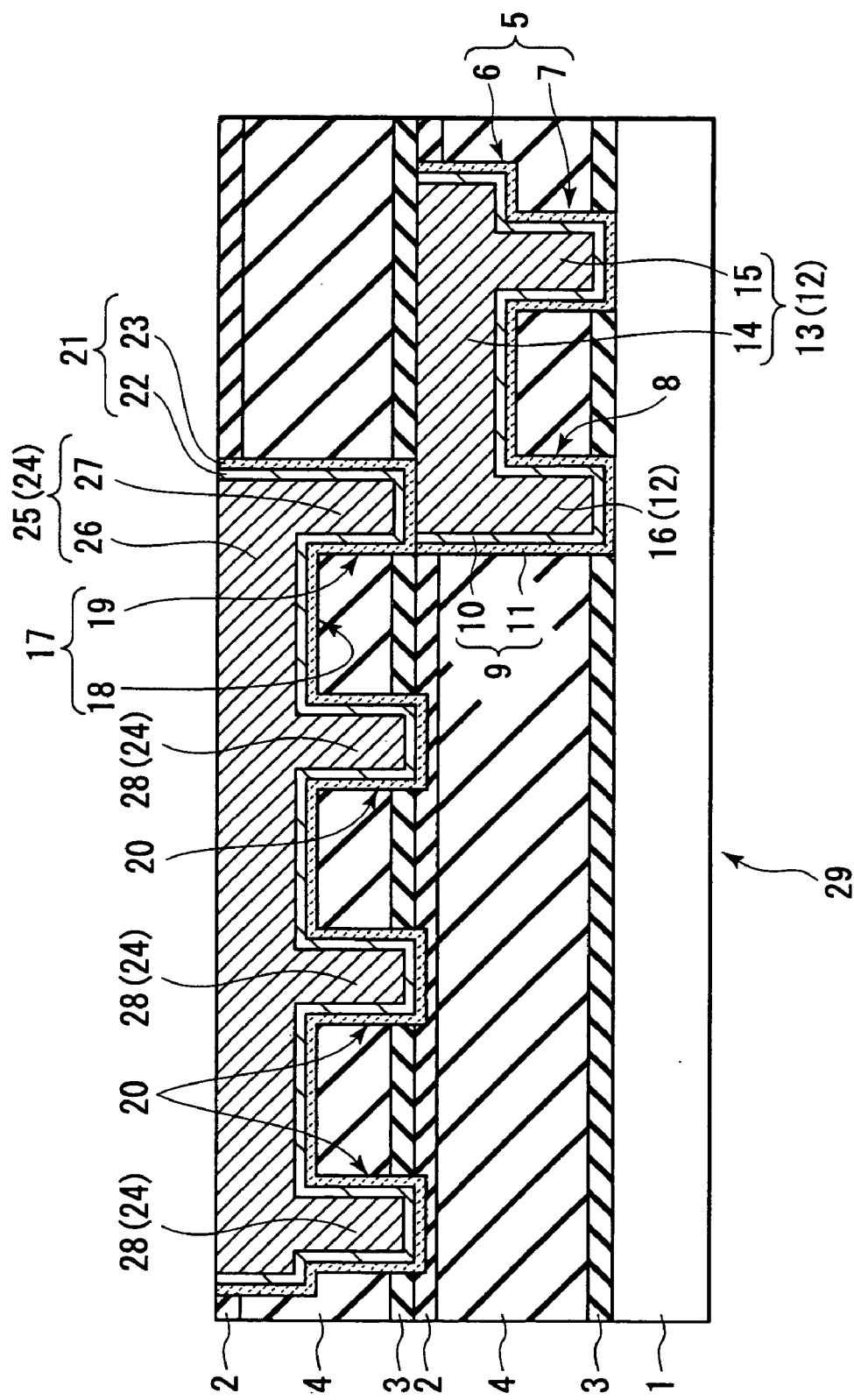
FIG. 7 is a step sectional view showing the manufacturing step of the semiconductor device according to the first embodiment.

Next, as shown in FIG. 7, the unnecessary barrier metal film 21 and Cu film 24 are removed. Concretely, the CMP process is used to grind and remove the barrier metal film 21 and Cu film 24 on the surface of the SiC film of the second layer (capping layer of the second layer) 2. Accordingly, the unnecessary barrier metal film 21 and Cu film 24 outside the recess 17 and the recesses 20 are removed from the capping layer 2, and the barrier metal film 21 and Cu film 24 are left only inside the recess 17 and the recesses 20. That is, only inside the recess 17 and the recesses 20, the Cu film 24 is buried to comprise the barrier metal film 21 including the laminate film of the Ta film 22 and TaN film 23, the conductive layer 26, the conductive plug 27, and the first reinforcing plugs 28. As a result, to extend over the SiCN film 3 of the second layer from the SiC film 2 of the second layer, the Cu wiring layer 25 of the second layer including the Cu conductive layer 26 and Cu conductive plug (Cu conductive contact plug) 27, and three Cu first reinforcing plugs 28 of the second layer are formed. The Cu wiring layer 25 is a so-called Cu dual damascene wiring.

The three Cu first reinforcing plugs 28 are formed substantially extending through the SiCN film 3 of the second layer to indirectly contact the SiC film 2 of the first layer via the barrier metal film 21. That is, each Cu first reinforcing plug 28 is formed to be substantially connected to the SiCN film 3 of the second layer having a Young's modulus of about 30 GPa or more and the SiC film 2 of the first layer via the barrier metal film 21 in the lower end (bottom portion). In the same manner as the Cu first reinforcing plug 16 of the first layer, each first reinforcing plug 28 of the second layer is the dummy plug (sacrifice plug) which does not substantially function as the wiring. Moreover, the Cu first reinforcing plug 28 of the second layer may also be referred to as the Cu reinforcing via plug or Cu sacrifice via plug.

By the above-described steps, an effective wiring area 29 including the two-layer structure, which is comprised of the Cu wiring layer 13 of the first layer and the Cu wiring layer 25 of the second layer and which actually functions as the wiring, is formed on the Si substrate 1.

Next, as shown in FIG. 8, the SiCN film 3 and passivation film 30 of a third layer are successively stacked on the SiC film 2 and wiring layer 25 of the second layer. Concretely, first on the surfaces of the SiC film 2 and wiring layer 25 of the second layer, the CVD process is used to deposit the SiCN film 3 of the third layer until the film thickness reaches about 50 nm. The SiCN film 3 of the third layer functions as the top barrier layer (film) of the second layer. Subsequently, on the surface of the top barrier layer (SiCN film) 3 of the second layer, for example, the CVD process is used to form the passivation film 30 which is formed of a predetermined material and has a predetermined film thickness. Thereafter, through predetermined steps, a desired semiconductor device 31 shown in FIG. 8 is obtained. That is, the semiconductor device 31 of the present embodiment including a two-layer laminate wiring structure.

Next, when heat is added to the semiconductor device 31, the heat stress is generated in the low relative dielectric constant film 4 including the two-layer structure, the Cu wiring layer 13 and Cu reinforcing plug 16 of the first layer, and the Cu wiring layer 25 and Cu reinforcing via plugs 28 of the second layer. The heat stress and a load caused by the heat stress will be described with reference to FIG. 9. It is to be noted that in FIG. 9, for ease of seeing the direction of the main heat stress generated inside the semiconductor device 31, hatching is omitted to show the low relative dielectric constant film 4, Cu wiring layer 13, Cu reinforcing contact plug 16, Cu wiring layer 25, and Cu reinforcing via plugs 28.

In FIG. 9, solid-line and broken-line arrows show the direction of the main heat stress generated in the semiconductor device 31. Concretely, the broken-line arrows in FIG. 9 show the heat stress generated in the low relative dielectric constant film 4, Cu wiring layer 13, and Cu wiring layer 25 at the time of application of the heat to the semiconductor device 31, and the directions of the loads caused by the heat stress. The solid-line arrows in FIG. 9 show the directions of stresses (drags) generated in the Cu conductive contact plug 15, Cu reinforcing contact plug 16, Cu conductive via plug 27, and Cu reinforcing via plugs 28 against the heat stress and heat stress load at the time of the application of the heat to the semiconductor device 31. In the following description, for the heat stress and heat stress load shown by the broken-line arrows in FIG. 9, the heat stress and heat stress load of the Cu wiring layer 13 (Cu conductive layer 14) and Cu wiring layer 25 (Cu conductive layer 26) along the longitudinal direction will generically be referred to as a horizontal load stress. Similarly, for the heat stress and heat stress load shown by the broken-line arrows in FIG. 9, the heat stress and heat stress load of the low relative dielectric constant film 4 along the thickness direction will generically be referred to as a vertical load stress.

As shown in FIG. 9, the Cu reinforcing contact plug 16 provided under the Cu wiring layer 13 (Cu conductive layer 14) of the first layer is substantially connected to the Si substrate 1 and the SiCN film 3 of the first layer. Similarly, the Cu reinforcing via plugs 28 provided under the Cu wiring layer 25 (Cu conductive layer 26) of the second layer are substantially connected to the SiC film of the first layer (capping layer of the first layer) 2 and the SiCN film of the second layer (Cu wiring top barrier layer of the first layer) 3. Moreover, the Cu reinforcing contact plug 16 is provided in the vicinity of the Cu conductive contact plug 15 at a predetermined interval C. Furthermore, three Cu reinforcing via plugs 28 are provided to be distant from one another in a predetermined range A from the Cu conductive via plug 27. Additionally, among three Cu reinforcing via plugs 28, the Cu reinforcing via plug 28 closest to the Cu conductive via plug 27 is provided in the vicinity of the Cu conductive via plug 27 at a predetermined interval B. According to this structure, a possibility that the horizontal and vertical load stresses are concentrated in the Cu conductive contact plug 15 and Cu conductive via plug 27 can be reduced. Additionally, a possibility that the horizontal and vertical load stresses are concentrated in the effective wiring area 29 including the Cu wiring layer 13 and Cu wiring layer 25 can be reduced. This will concretely be described hereinafter.

It is known that the low relative dielectric constant film 4 has the Young's modulus indicating the mechanical strength essentially smaller than that of $SiO_2$-based insulating film as the general interlayer insulating film by about 1 to 20 GPa. According to an experiment carried out by the present inventors, it has been confirmed that there is a certain degree of correlation between the relative dielectric constant and Young's modulus of the low relative dielectric constant film 4. For example, for the low relative dielectric constant film 4 having a relative dielectric constant k of about 3.4, it has been confirmed that the Young's modulus corresponds to about 20 GPa. Moreover, when the low relative dielectric constant film 4 having the Young's modulus indicating the strength of about 20 GPa or less is used as the interlayer insulating film, it is feared that various problems are caused by the heat in the heating process.

That is, in a case of the Young's modulus of the low relative dielectric constant film 4 comprising the interlayer insulating film is small, and when the heat is added to the Cu wiring layer 13 and Cu wiring layer 25 provided in the low relative dielectric constant film 4, a force with which the thermal distortion generated in the respective wiring layers 13, 25 has been suppressed weakens. Then, the heat stress generated in the respective wiring layers 13, 25 drops, but the respective wiring layers 13, 25 are freely deformed (expanded/contracted). As a result, the loads by the deformation (displacement) of the wiring layers 13, 25 are applied to the Cu conductive contact plug 15 and Cu conductive via plug 27 formed in the ends of the wiring layers 13, 25. The stress along the longitudinal direction of each wiring layer 13, 25 comprises the horizontal load stress.

Moreover, it is known that the low relative dielectric constant film 4 has the coefficient of linear expansion higher than that of the general $SiO_2$-based insulating film or wiring by about 20 to 70 ppm. For example, the coefficient of expansion of Cu which is the material of each wiring layer 13, 25 is about 16 ppm. Therefore, for example, when the heat is added to the low relative dielectric constant film 4, the low relative dielectric constant film 4 easily thermally expands along the thickness direction, and the load by the heat stress along the thickness direction is easily generated in the film. That is, in the low relative dielectric constant film 4, the load by the heat stress is easily generated along the direction vertical to the surface of the Si substrate 1, or the height direction of each plug 15, 16, 27, 28 in the film. The stress along the thickness direction of the low relative dielectric constant film 4 comprises the vertical load stress.

Additionally, as shown in FIG. 9, in the semiconductor device 31 of the present embodiment, the Cu conductive contact plug 15 and Cu reinforcing contact plug 16 are integrally formed with the Cu conductive layer 14 provided in the low relative dielectric constant film 4, and are substantially connected to the Si substrate 1 and the SiCN film 3 of the first layer. Accordingly, the Cu conductive layer 14 is substantially connected to the Si substrate 1 and the SiCN film 3 of the first layer via the Cu reinforcing contact plug 16. Similarly, one Cu reinforcing via plug 27 and three Cu reinforcing via plugs 28 are formed integrally with the Cu conductive layer 26 provided in the low relative dielectric constant film 4, and are substantially connected to the Cu conductive layer 14 (Cu wiring layer 13)/SiC film 2 of the first layer, and the SiCN film 3 of the second layer. Accordingly, the Cu conductive layer 26 is substantially connected to the SiC film 2 of the first layer and the SiCN film 3 of the second layer via each Cu reinforcing via plug 28. The Young's modulus of each of the SiC film 2 of the first layer, and the SiCN films 3 of the first and second layers is 30 GPa or more, and the films have a strength higher than that of the low relative dielectric constant film 4. The Si substrate 1 also has a Young's modulus of 30 GPa or more, and, needless to say, has the strength higher than that of the low relative dielectric constant film 4. Therefore, the Si substrate 1 also functions as a third reinforcing material.

According to the structure, in the heating step in the process for manufacturing, for example, the semiconductor device 31, the deformation (stretching) of the Cu conductive layers 14, 26 in the low relative dielectric constant film 4 by the heat along the longitudinal direction can be suppressed by the Cu reinforcing contact plug 16 and each Cu reinforcing via plug 28. Additionally, the loads by the heat stresses generated in the conductive portions such as the Cu conductive layers 14, 26 and Cu conductive plugs 15, 27 are diffused by the Cu reinforcing contact plug 16 and each Cu reinforcing via plug 28, alleviated or absorbed, or can be allowed to escape.

Moreover, for example, the thermal expansion of the low relative dielectric constant film 4 along the thickness direction can be suppressed by the Cu reinforcing contact plug 16 and each Cu reinforcing via plug 28. Additionally, the load by the heat stress generated in the low relative dielectric constant film 4 by the thermal expansion of the low relative dielectric constant film 4 is diffused, alleviated or absorbed, or can be allowed to escape by the Cu reinforcing contact plug 16 and each Cu reinforcing via plug 28. Accordingly, the load by the thermal expansion of the low relative dielectric constant film 4 can be inhibited from being concentrated on the conductive portions such as the Cu conductive layers 14, 26 and Cu conductive plugs 15, 27.

In this manner, in the semiconductor device 31 of the present embodiment, the possibility that the horizontal and vertical load stresses are concentrated on the Cu conductive contact plug 15 and Cu conductive via plug 27 can be reduced by the Cu reinforcing contact plug 16 and Cu reinforcing via plug 28. Especially, the possibility that the horizontal and vertical load stresses are concentrated on upper and lower ends of each of the Cu conductive contact plug 15 and Cu conductive via plug 27.

Moreover, as shown in FIG. 9, when the horizontal and vertical load stresses are applied to the Cu reinforcing contact plug 16 and Cu reinforcing via plugs 28, the drag against the stress is generated in the respective reinforcing plugs 16, 28 themselves. As shown by the solid-line arrows in FIG. 9, the direction of the drag generated in the reinforcing plugs 16, 28 themselves is opposite to that of the horizontal and vertical load stresses applied to the reinforcing plugs 16, 28 shown by the broken-line arrows in FIG. 9. Therefore, the horizontal and vertical load stresses applied to the reinforcing plugs 16, 28 can be reduced by the drags against the heat stresses generated in the reinforcing plugs 16, 28 themselves. Additionally, the horizontal and vertical load stresses applied to the reinforcing plugs 16, 28 can be cancelled out by the drags against the heat stresses generated in the reinforcing plugs 16, 28 themselves. In this manner, in the semiconductor device 31 of the present embodiment, the loads by the heat stresses generated in the conductive portions such as the Cu conductive layers 14, 26 and Cu conductive plugs 15, 27 can be reduced or cancelled out by the drags against the heat stresses generated in the reinforcing plugs 16, 28.

That is, in the semiconductor device 31 structured as described above, the horizontal and vertical load stresses generated inside can be reduced by the whole effective wiring area 29 including the Cu reinforcing contact plug 16 and Cu reinforcing via plugs 28. The loads applied to the Cu conductive contact plug 15 and Cu conductive via plug 27 are reduced by the Cu reinforcing contact plug 16 and Cu reinforcing via plug 28. Therefore, there is hardly a possibility that the Cu conductive contact plug 15 or the Cu conductive via plug 27 is deteriorated by the applied load.

In this manner, in the semiconductor device 31 of the present embodiment, there is hardly a possibility that the Cu conductive contact plug 15 or the Cu conductive via plug 27 is destroyed by the horizontal and vertical load stresses generated by the heat. Moreover, there is also hardly a possibility that the barrier metal film with which the Cu conductive contact plug 15 and Cu conductive via plug 27 are coated is destroyed by the horizontal and vertical load stresses. That is, there is hardly a possibility that the conductive portion (Cu wiring layers 13, 25) comprised of the Cu conductive layers 14, 26 and Cu conductive plugs 15, 27 is destroyed. Accordingly, there is hardly a possibility of occurrence of open defects of the wiring layers 13, 25, short-circuit between the conductive portions provided adjacent to each other, or device defect in the device 31 by the projecting of the wiring material of Cu into the low relative dielectric constant film (interlayer insulating film) 4 from the conductive plugs 15, 27. That is, the semiconductor device 31 of the present embodiment hardly has a possibility of occurrence of fatal plug defects. Additionally, there is hardly a possibility that the fatal defects are generated in the effective wiring area 29 actually functioning as the essential wiring.

Therefore, the semiconductor device 31 of the present embodiment hardly has a possibility that the fatal defect is caused in the device and the manufacturing process. As a result, there is hardly a possibility of deterioration of capability and quality of the semiconductor device 31 or reliability of the semiconductor device 31. Additionally, there is hardly a possibility of deterioration of yield of the semiconductor device 31 because of the manufacturing of defective products or deterioration of production efficiency of the semiconductor device 31.

Next, tests carried out by the present inventors and results will be described with reference to FIG. 9 and Tables 1 to 3.

First, here, to evaluate an effect of stress alleviation by the Cu reinforcing via plugs 28, the interlayer insulating film 4 of the first layer was formed in a TEOS film having a Young's modulus of about 60 GPa, and the interlayer insulating film 4 of the second layer was formed in a low relative dielectric constant film having a small Young's modulus. Additionally, each diameter of the Cu conductive contact plug 15, Cu reinforcing contact plug 16, Cu conductive via plug 27, and Cu reinforcing via plug 28 was formed in about 0.13 μm. Moreover, the interval B between the plugs 27, 28 shown in FIG. 9 and the number of plugs 27, 28 were set as shown in Tables 1 to 3, and the Cu wiring layers (Cu dual damascene wirings) 13, 25 were formed. Furthermore, each of the Cu wiring layers 13, 25 was formed as a single wiring. In this case, a wiring width of a wiring pattern of each of the Cu wiring layers 13, 25 was set to about 0.13 μm, and a wiring length was set to about 100 μm. It is to be noted that although not shown, the interval between the Cu reinforcing via plugs 28 conforms to the interval B.

Moreover, a so-called borderless chain pattern was formed in which the Cu wiring layer 13 of the first layer was electrically connected to the Cu wiring layer 25 of the second layer in a stacking direction via a single Cu conductive via plug 27 having an electric circuit function. A scale of the plug having the electric circuit function of this pattern was set to 10 k plugs. A terminal end (not shown) of each of the Cu wiring layers 13, 25 was connected to four terminals, and electric resistance fluctuations of the Cu wiring layers 13, 25 as the two-layer wiring layer (multi-layered wiring layer) were measured. Furthermore, a large number of borderless chain patterns of the plugs were provided at an interval of about 2 μm.

Furthermore, the top barrier film (layer) and capping film (layer) which were reinforcing materials were formed in the same type of films. Concretely, the respective films were formed/divided in three different types of films including an SiC-based film whose forming material had a Young's modulus of about 30 GPa, an MSQ-based film indicating about 20 GPa, and a p-SiH$_4$ film indicating about 60 GPa. The Young's modulus was measured using Nano Indenter manufactured by MTS Systems Co.

Based on the above-described settings, for a purpose of evaluating the reliability of the effective wiring area 29 and further the whole semiconductor device 31, after adding ten thermal cycles at room temperature to about 400° C. in a multi-layered wiring process step, an electric resistance change was measured. This result is also shown in Table 1. Evaluations were carried out by the following standards. The Cu wiring layers 13, 25 indicating an electric resistance increase ratio of 10% or more after the test are assumed as defective. Moreover, a yield of 90% or less in the manufacturing process of the semiconductor device 31 was evaluated as X, a yield of 90 to 99% was evaluated as Δ, and a yield of 99% or more was evaluated as ○.

TABLE 1

Top Barrier Layer Young's Modulus: 30 GPa

| Number of plugs | Plug interval (μm) | Evaluation result |
|---|---|---|
| 1 | — | X |
| 2 | 0.26 | X |
|   | 0.39 | X |
| 3 | 0.26 | ○ |
|   | 0.39 | ○ |
|   | 0.52 | ○ |
|   | 1.04 | ○ |
| 4 | 0.26 | ○ |
|   | 0.39 | ○ |
|   | 0.52 | ○ |
|   | 1.04 | ○ |
| 5 | 0.26 | ○ |
|   | 0.39 | ○ |
|   | 0.52 | ○ |
|   | 1.04 | ○ |

TABLE 2

Top Barrier Layer Young's Modulus: 20 GPa

| Number of plugs | Plug interval (μm) | Evaluation result |
|---|---|---|
| 5 | 0.26 | Δ |
|   | 0.39 | Δ |
|   | 0.52 | X |
|   | 1.04 | X |

TABLE 3

Top Barrier Layer Young's Modulus: 60 GPa

| Number of plugs | Plug interval (μm) | Evaluation result |
|---|---|---|
| 1 | — | X |
| 2 | 0.26 | X |
|   | 0.39 | X |
| 3 | 0.26 | ○ |
|   | 0.39 | ○ |
|   | 0.52 | ○ |
|   | 1.04 | ○ |

As shown in Tables 1 to 3, as a result of this test, comparative materials (samples) not including the Cu reinforcing plug 28 and having the number of plugs of 1 were all defective regardless of the Young's modulus of the top barrier layer or the capping layer. On the other hand, for samples each of which included three or more plugs (two or more Cu reinforcing plugs 28) including the Cu conductive plug 27 and in which the interval between the Cu conductive plugs 27 or the Cu reinforcing plugs 28 was about 1 μm or less, when the Young's modulus of the top barrier layer or the capping layer was about 30 GPa or more, the yield was all 99% or more. That is, it was possible to obtain remarkably satisfactory results. It is to be noted that although not shown, according to additional tests carried out by the present inventors, when three or more plugs including the Cu conductive plug 27 are provided, and even when the interval between the Cu conductive plugs 27 or the Cu reinforcing plugs 28 is about 1.5 μm depending on the diameter of each plug, the yield of the sample is 99% or more. That is, it was possible to obtain the remarkably satisfactory results.

Moreover, as seen from Table 2, even when five plugs including the Cu conductive plug 27 (four Cu reinforcing plugs 28) were provided, and when the Young's modulus of the top barrier layer or the capping layer was below about 30 GPa, the yield dropped, and it was impossible to obtain satisfactory results. From this, it has been found that the reinforcing film (reinforcing material) in contact with the lower end (bottom portion) of the Cu reinforcing plug 28 needs to have the strength indicated by the Young's modulus of about 30 GPa or more.

In this manner, according to the present test, it has been found that by the appropriate settings of the intervals B, C between the respective plugs 15, 16, 27, 28 and the Young's modulus of the reinforcing material to appropriate values, it is possible to form the semiconductor device 31 having a high reliability.

It is to be noted that the smaller the intervals B, C between the Cu reinforcing plugs 16, 28 are, the greater an effect of reducing the stress becomes. Additionally, for the appropriate number of plugs and interval for each of the horizontal and vertical load stresses, the following values are preferable from the above-described results of the tests.

For a purpose of alleviating the vertical load stress, the plug interval B is preferably about 5 μm or less. Even when only one Cu reinforcing plug 16, 28 is provided, the vertical load stress can be alleviated. On the other hand, also in consideration of the alleviation of the horizontal load stress, it is preferable that three or more plugs including the Cu conductive plugs 15, 27 having the electric circuit function (two or more Cu reinforcing plugs 28) be provided. Moreover, the Cu conductive plugs 15, 27 and Cu reinforcing plugs 16, 28 are preferably provided so that the plug interval B, C is about 1 μm or less. Additionally, the plug interval B, C may be about 1 μm (defined interval) or less as described above, and does not have to be equal. Even for a purpose of alleviating either the vertical load stress or the horizontal load stress, it has been found that a range in which the plugs are provided, shown by A in FIG. 9, may be about 5 μm or less. Furthermore, although not shown, in an area where there is not any electric connection and conductive wirings intersect with one another, it has been found that deterioration is not recognized in the stress alleviation effect depending on the strength of each wiring without providing any reinforcing plug in the defined interval.

As described above, according to the first embodiment, in the semiconductor device 31 including the interlayer insulating film comprised of the low relative dielectric constant film 4, the durability of the Cu wiring layers 13, 25 against the load by the heat stress generated in the conductive portions such as the Cu wiring layers 13, 25 and the low relative dielectric constant film 4 is enhanced, and the reliability is enhanced. It is to be noted that, for example, in the wiring layer including no reinforcing plug, the stress concentrated on the single conductive plug (horizontal load stress) may also be diffused by dividing the wiring layer into short wirings in a multi-layered structure. Additionally, with the division into the short wirings, two layers are required for holding a conductive function for one layer, and therefore design is largely restricted. On the other hand, in the semiconductor device 31 of the present embodiment, the reinforcing plugs 16, 28 are formed so as to avoid the conductive wiring in the underlayers. Accordingly, it is possible to fulfill a stress reduction function with respect to both the vertical and horizontal load stresses. Therefore, according to the semiconductor device 31 of the present embodiment, without increasing the number of wiring layers, it is possible to provide the semiconductor device 31 including the multi-layered wiring layer comprised of a Cu wiring layer/low-k film structure having a high reliability.

(Second Embodiment)

Figure 10:
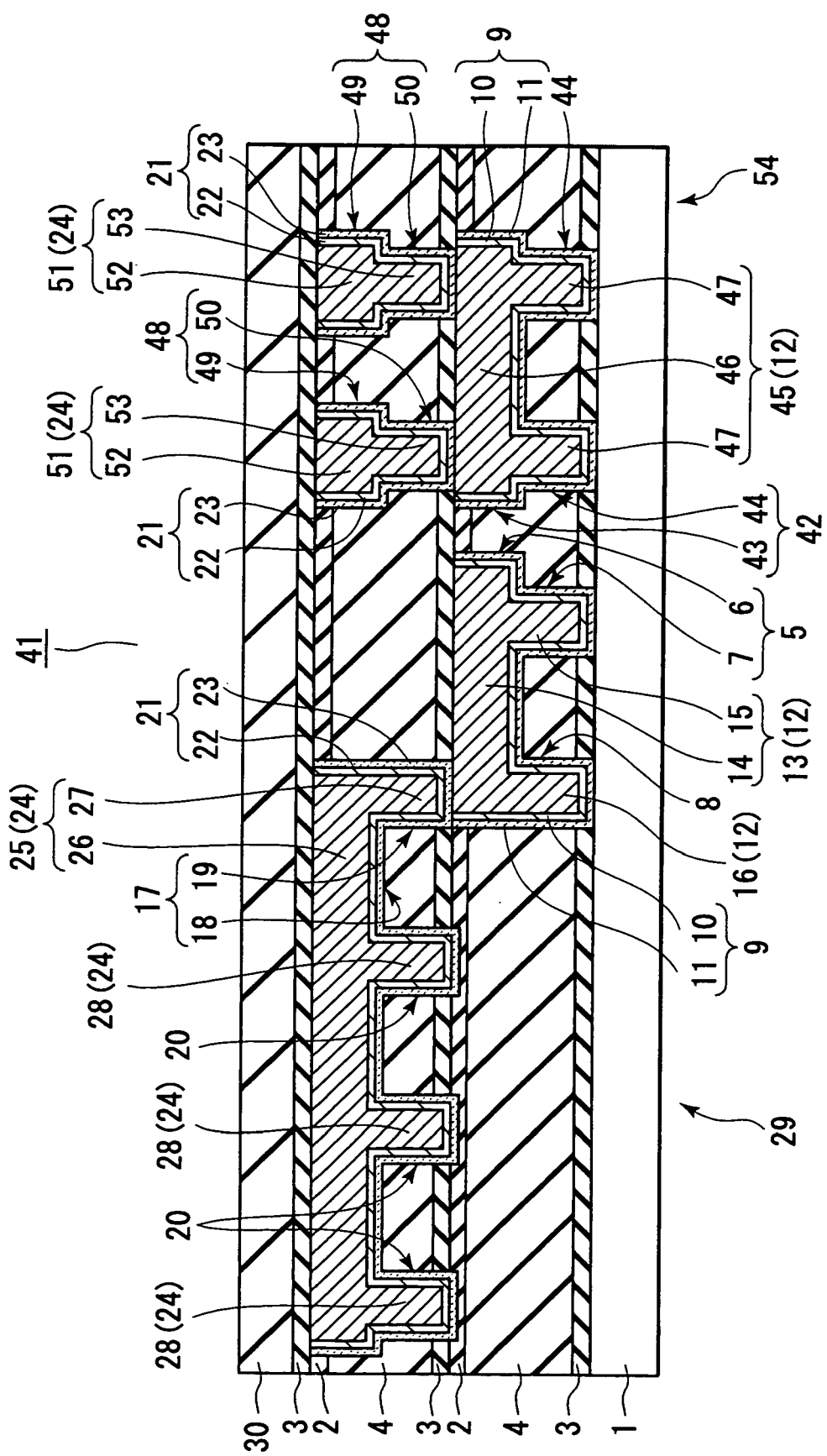
FIG. 10 is a sectional view showing the semiconductor device according to a second embodiment.
Figure 11:
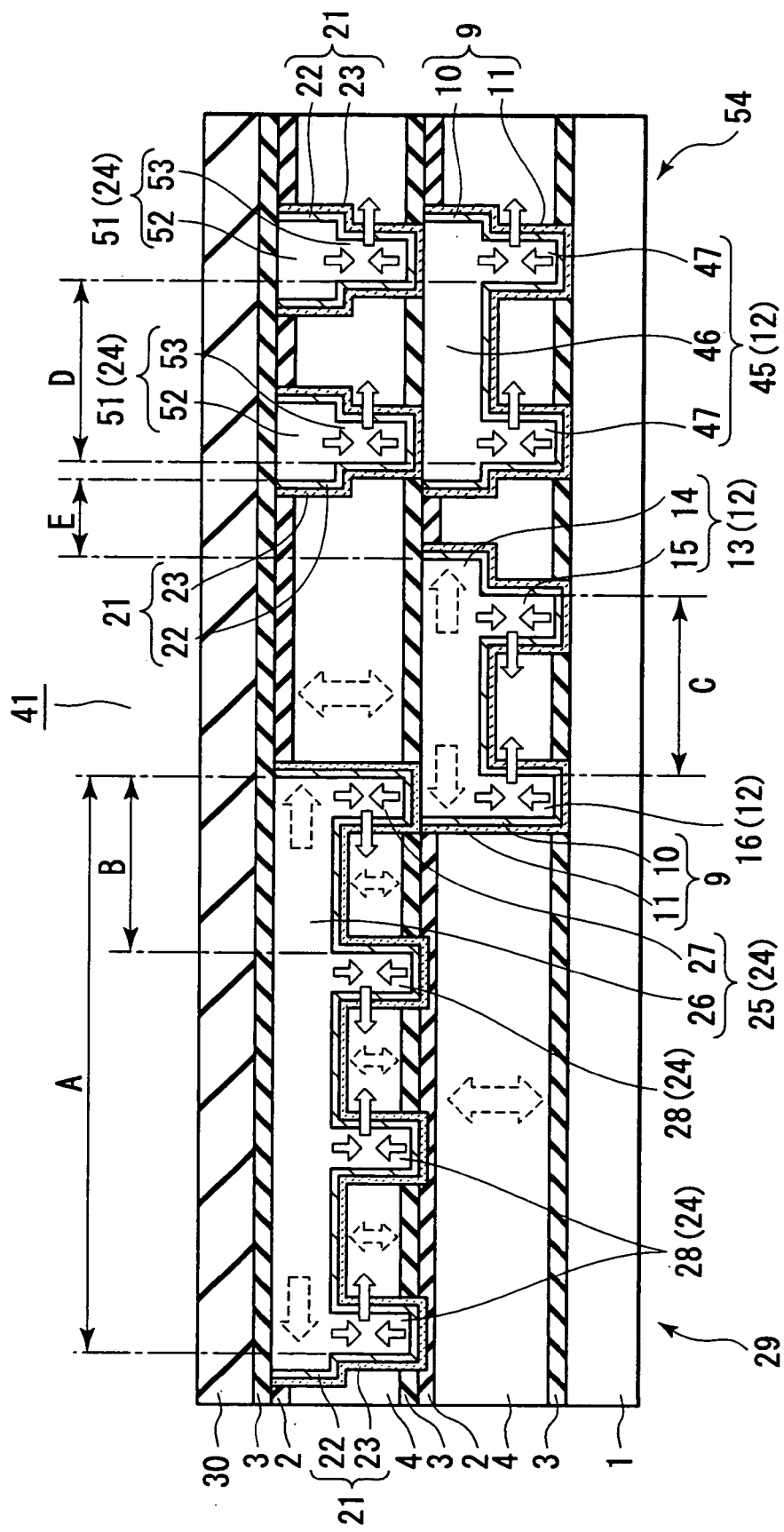
FIG. 11 is a sectional view schematically showing the wiring structure inside the semiconductor device according to the second embodiment and the heat stress generated in the device.
Figure 12:
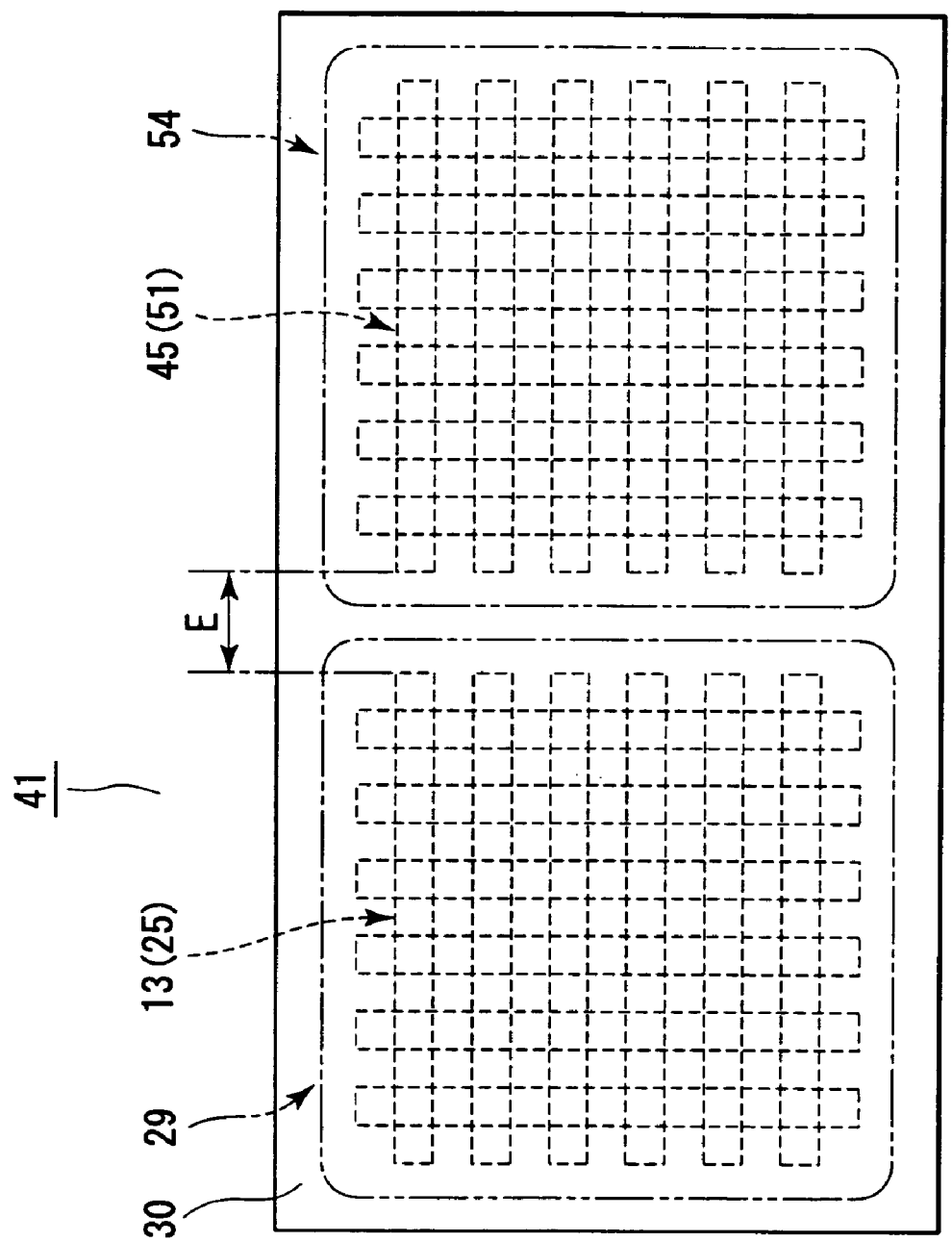
FIG. 12 is a plan view showing areas where a wiring layer and reinforcing wiring layer of the semiconductor device according to the second embodiment are provided.

Next, a second embodiment according to the present invention will be described with reference to FIGS. 10 to 12. FIG. 10 is a sectional view showing the semiconductor device according to the second embodiment. FIG. 11 is a sectional view schematically showing the wiring structure inside the semiconductor device according to the second embodiment and the heat stress generated in the device. FIG. 12 is a plan view showing areas where the wiring layer and reinforcing layer of the semiconductor device according to the second embodiment are provided. It is to be noted that the same components as those of the first embodiment are denoted with the same reference numerals, and the detailed description will be omitted.

In the present embodiment, as shown in FIG. 10, characteristics lie in that a reinforcing wiring area (sacrifice multi-layered wiring) 54 is formed in a space area (field area) of the low relative dielectric constant film 4 in a broad range in which the Cu wiring layers 13, 25 are not formed. The reinforcing wiring area (sacrifice multi-layered wiring) 54 is comprised of reinforcing wiring layers (reinforcing conductive layer, sacrifice wiring) which do not have any electric circuit function and which are connected to one another in a stacking direction using reinforcing plugs 47, 53. An example of the two-layer structure will concretely be described hereinafter.

As shown in FIG. 10, in the first layer, a reinforcing wiring layer 45 of the first layer comprised of one reinforcing metal layer 46 and two reinforcing plugs (second reinforcing plugs) 47 is provided in the vicinity of the Cu wiring layer 13. In the same manner as the Cu wiring layer 13, the reinforcing wiring layer 45 is formed of Cu. The reinforcing wiring layer 45 is formed in the dual damascene structure in which the reinforcing metal layer 46 and reinforcing plugs 47 are integrated. Therefore, a recess for the reinforcing wiring layer 42 of the first layer in which the reinforcing wiring layer 45 of the first layer is formed is formed in the two-stage structure including a recess for the reinforcing metal layer 43 in the top and a recess for the reinforcing plug 44 in the bottom. In this case, the recess 43 is formed integrally with the recess 44. The recess 44 is formed extending through the SiCN film 3 of the first layer so as to expose the surface of the Si substrate 1 so that each of the reinforcing plugs 47 can substantially contact the Si substrate 1. The recess 42 of the first layer is formed in parallel with the recess 5 of the first layer using the RIE process.

Outside the reinforcing wiring layer 45, the barrier metal film 9 comprised of the laminate film of the Ta film 10 and TaN film 11 is provided. Each reinforcing plug 47 is formed extending through the SiCN film 3 of the first layer having a Young's modulus of about 30 GPa or more so as to indirectly contact the surface of the Si substrate 1 via the barrier metal film 9 in the same manner as the Cu conductive contact plug 15 and Cu reinforcing contact plug 16. That is, the reinforcing plug 47 is formed to be substantially connected to the Si substrate 1 and the SiCN film 3 of the first layer via the barrier metal film 9 in the lower end (bottom portion). It is to be noted that when the reinforcing plug 47 of the reinforcing wiring area 54 is connected to the Si substrate 1 as the reinforcing material, an area of the Si substrate 1 connected to the contact plug 15 in the effective wiring area 29 is electrically insulated from that of the Si substrate 1 connected to the reinforcing plug 47.

Moreover, the reinforcing metal layer 46 is formed to be electrically cut from the Cu wiring layer 13. That is, the reinforcing wiring layer 45 is insulated from the Cu wiring layer 13. Therefore, the reinforcing wiring layer 45 is formed as a dummy wiring (sacrifice wiring) which does not actually function as the wiring. The reinforcing plug 47 of the first layer may also be referred to as the reinforcing contact plug or the sacrifice contact plug.

The reinforcing wiring layer 45 and barrier metal film 9 of the first layer are formed in parallel with the formation of the Cu wiring layer 13 and barrier metal film 9 of the first layer. Moreover, in the following description, the reinforcing wiring layer 45, reinforcing metal layer 46, and reinforcing plugs 47 will be referred to as the Cu reinforcing wiring layer 45, Cu reinforcing metal layer 46, and Cu reinforcing contact plugs 47, respectively.

In the second layer, a reinforcing wiring layer 51 of the second layer comprised of one reinforcing metal layer 52 and one reinforcing plug (second reinforcing plug) 53 is provided. The reinforcing wiring layer 51 of the semiconductor device is provided continuing from the reinforcing wiring layer 45 of the first layer along the stacking direction of the interlayer insulating film (low relative dielectric constant film) 4. The reinforcing wiring layer 51 is formed of Cu in the same manner as the Cu wiring layer 25. The reinforcing wiring layer 51 is formed in the dual damascene structure in which the reinforcing metal layer 52 and reinforcing plug 53 are integrated. Therefore, a recess for the reinforcing wiring layer 48 of the second layer in which the reinforcing wiring layer 51 of the second layer is formed is formed in the two-stage structure including a recess for the reinforcing metal layer 49 in the top and a recess for the reinforcing plug 50 in the bottom. In this case, the recess 49 is formed integrally with the recess 50. The recess 50 is formed extending through the SiCN film 3 of the second layer so as to expose the Cu reinforcing wiring layer 45 (Cu reinforcing metal layer 46) of the first layer so that the reinforcing plug 53 can substantially contact the Cu reinforcing wiring layer 45 (Cu reinforcing metal layer 46) of the first layer. The recess 48 of the second layer is formed in parallel with the recess 17 of the second layer using the RIE process.

Outside the reinforcing wiring layer 51, the barrier metal film 21 comprised of the laminate film of the Ta film 22 and TaN film 23 is provided. Each reinforcing plug 53 is formed substantially extending through the SiCN film 3 of the second layer so as to indirectly contact the surface of the Cu reinforcing wiring layer 45 (Cu reinforcing metal layer 46) via the barrier metal film 21 in the same manner as the Cu conductive contact via plug 27. That is, the reinforcing plug 53 is formed to be substantially connected to the Cu reinforcing metal layer 46 and the SiCN film 3 of the second layer having a Young's modulus of about 30 GPa or more via the barrier metal film 21 in the lower end (bottom portion).

Moreover, the reinforcing metal layer 52 is formed to be electrically cut from the Cu wiring layer 25. That is, the reinforcing wiring layer 51 is insulated from the Cu wiring layer 25. Therefore, the reinforcing wiring layer 51 is formed as the dummy wiring (sacrifice wiring) which does not actually function as the wiring. The reinforcing plug 53 of the second layer may also be referred to as the reinforcing via plug or the sacrifice via plug.

The reinforcing wiring layer 51 and barrier metal film 21 of the second layer are formed in parallel with the formation of the Cu wiring layer 25 and barrier metal film 21 of the second layer. Moreover, in the following description, the reinforcing wiring layer 51, reinforcing metal layer 52, and reinforcing plug 53 will be referred to as the Cu reinforcing wiring layer 51, Cu reinforcing metal layer 52, and Cu reinforcing via plug 53, respectively.

In this manner, the Cu reinforcing wiring layer 45 of the first layer and the Cu reinforcing wiring layer 51 of the second layer are dummy wirings (sacrifice wirings) which do not actually function as the wirings. That is, the respective Cu reinforcing wiring layers 45, 51 comprise the reinforcing wiring area 54 including the two-layer structure for enhancing the mechanical strength of the adjacent effective wiring area 29. Therefore, as shown in FIG. 10, a semiconductor device 41 of the present embodiment includes the effective wiring area 29 and reinforcing wiring area 54 each including the two-layer laminate wiring structure. According to the structure, a possibility that the horizontal and vertical load stresses are concentrated on the effective wiring area 29 including the Cu wiring layer 13 and Cu wiring layer 25 can be reduced. Especially a possibility that the vertical load stress is concentrated on the effective wiring area 29 can be reduced. This will concretely be described hereinafter with reference to FIG. 11.

It is to be noted that in FIG. 11, for ease of seeing the direction of the main heat stress generated inside the semiconductor device 41, the hatching is omitted in drawing the low relative dielectric constant film 4, Cu wiring layer 13, Cu reinforcing contact plug 16, Cu wiring layer 25, Cu reinforcing via plugs 28, Cu reinforcing wiring layer 45, and Cu reinforcing wiring layer 51. The stresses (loads, drags) shown by the solid-line and broken-line arrows in FIG. 11 are similar to those shown by the solid-line and broken-line arrows in FIG. 9.

As shown in FIG. 11, in the semiconductor device 41 of the present embodiment, the Cu reinforcing metal layer 46 electrically disconnected from the Cu wiring layer 13 is provided in the vicinity of the Cu wiring layer 13 in the interlayer insulating film of the first layer including the low relative dielectric constant film 4. Two Cu reinforcing contact plugs 47 are formed integrally with the Cu reinforcing metal layer 46, and are substantially connected to the Si substrate 1 and the SiCN film 3 of the first layer. Accordingly, the Cu reinforcing metal layer 46 is substantially connected to the Si substrate 1 and the SiCN film 3 of the first layer via each Cu reinforcing contact plug 47. Similarly, two Cu reinforcing metal layers 52 electrically disconnected from the Cu wiring layer 25 are provided above the Cu reinforcing metal layer 46 in the interlayer insulating film of the second layer including the low relative dielectric constant film 4. The Cu reinforcing via plug 53 is formed integrally with each Cu reinforcing metal layer 52, and is substantially connected to the Cu reinforcing metal layer 46 (Cu reinforcing wiring layer 45) of the first layer and the SiCN film 3 of the second layer. Accordingly, each Cu reinforcing metal layer 52 is substantially connected to the Cu reinforcing metal layer 46 (Cu reinforcing wiring layer 45) of the first layer and the SiCN film 3 of the second layer via each Cu reinforcing via plug 53.

According to the structure, in the heating step in the process for manufacturing, for example, the semiconductor device 41, the thermal expansion of the low relative dielectric constant film 4 along the thickness direction can be suppressed by the Cu reinforcing contact plug 47 and each Cu reinforcing via plug 53. Additionally, the load by the heat stress generated in the low relative dielectric constant film 4 by the thermal expansion of the low relative dielectric constant film 4 is diffused by the Cu reinforcing contact plug 47 and each Cu reinforcing via plug 53, alleviated or absorbed, or can be allowed to escape. Accordingly, the load by the thermal expansion of the low relative dielectric constant film 4 can be inhibited from being concentrated on the conductive area (effective wiring area) 29 such as the Cu conductive layers 14, 26 and Cu conductive plugs 15, 27. The load by the heat stress generated in the low relative dielectric constant film 4 can be reduced by the drag against the heat stresses generated in the Cu reinforcing metal layers 46, 52 and the Cu reinforcing plugs 47, 53.

Next, the tests and results carried out by the present inventors will be described with reference to FIGS. 11 and 12, and Table 4.

By a test process similar to that of the first embodiment, pattern dependence evaluation was carried out with respect to vertical load stress resistance for the effective wiring area 29 of the semiconductor device 41. It is to be noted that an evaluation method also conformed to that of the first embodiment. Additionally, in the present test, for the interlayer insulating films 4 of the first and second layers, a methyl polysiloxane (MSQ)-based low relative dielectric constant film (low-k film) having physical values such as a Young's modulus of about 10 GPa and a coefficient of linear expansion of about 60 ppm was used. In the top barrier film 3, the SiCN film 3 having a Young's modulus of about 30 GPa was employed.

In the present test, the peripheral structure of the effective wiring area 29 having the electric circuit function was set as follows. Based on the test result of the first embodiment, four Cu conductive contact plugs 15 and Cu reinforcing contact plugs 16 in total, and four Cu conductive via plugs 27 and Cu reinforcing via plugs 28 in total were provided. An interval C between the Cu conductive contact plug 15 and the Cu reinforcing contact plug 16, or an interval between the Cu reinforcing contact plugs 16 was set to about 0.26 μm. On the other hand, in the Cu wiring layer 25 of the second layer, the Cu conductive via plugs 27 and Cu reinforcing via plugs 28 were provided at intervals shown in Table 4. Furthermore, as shown in FIGS. 11 and 12, the reinforcing wiring area (reinforcing multi-layered wiring area) 54 was provided at an interval (E) shown in Table 4 in the space area (field area) provided adjacent to the effective wiring area 29.

Moreover, the interval between the Cu reinforcing plugs 47 or 53 of the reinforcing wiring area 54 was set to be the same as the plug interval B formed in the effective wiring area 29 having the electric circuit function based on the test results of the first embodiment. Furthermore, the reinforcing wiring area 54 includes a structure in which the Cu reinforcing wiring layers 45, 51 are provided to substantially cross at right angles to each other between the layers. The wiring width was formed to be equal to the width of the space provided adjacent to each of the Cu reinforcing wiring layers 45, 51. That is, the reinforcing wiring area 54 was formed so that a so-called line and space pattern has an equal interval. Additionally, the Cu reinforcing wiring layers 45, 51 were formed so as to obtain a minimum rule width of a design rule determined for each layer.

As shown in FIG. 11, the interval between the Cu reinforcing contact plugs 47 or between the Cu reinforcing via plugs 53 was set to D. As shown in FIGS. 11 and 12, the interval between the Cu conductive layer 14 and Cu reinforcing metal layer 46 of the first layer was set to E. Additionally, sizes and shapes of wiring patterns of the Cu wiring layers 13, 25 and Cu reinforcing wiring layers 45, 51 shown in FIG. 12 do not agree with those of the Cu wiring layers 13, 25 and Cu reinforcing wiring layers 45, 51 shown in FIGS. 10 and 11. To easily see the drawing and to easily understand the scope of the present invention, the sizes and the shapes of the wiring patterns of the Cu wiring layers 13, 25 and Cu reinforcing wiring layers 45, 51 are intentionally varied in preparing FIG. 10 and FIGS. 11 and 12.

TABLE 4

| Distance between wiring layer/reinforcing wiring layer (μm) | Plug interval (μm) | Evaluation result |
|---|---|---|
| 2 | 3 | ○ |
|   | 5 | ○ |
|   | 10 | X |
|   | 20 | X |
| 5 | 3 | ○ |
|   | 5 | ○ |
|   | 10 | X |
|   | 20 | X |
| 7 | 3 | Δ |
|   | 5 | X |
|   | 10 | X |
|   | 20 | X |
| 10 | 3 | X |
|   | 5 | X |
|   | 10 | X |
|   | 20 | X |

As a result of the test based on the above-described setting, as shown in Table 4, it has been found that the plug interval B provided in the Cu wiring layer 25 is preferably about 5 μm or less. That is, from a viewpoint of the alleviation of the vertical load stress, the plug intervals B, C provided in the Cu wiring layers 13, 25 may be about 5 μm or less. Similarly, the plug interval D between the Cu reinforcing wiring layers (sacrifice multi-layered wirings) 45 or 51 is preferably about 5 μm or less. It has also been found that the interval (distance between the patterns) E between the Cu conductive layer 14 of the first layer of the effective wiring area 29 and the Cu reinforcing metal layer 46 of the first layer of the reinforcing wiring area 54 is preferably about 5 μm or less. Furthermore, it has been found that the interval (distance between the patterns) E between the Cu conductive layer 14 (26) of the effective wiring area 29 and the Cu reinforcing metal layer 46 (52) of the reinforcing wiring area 54 is more preferably about 5 μm or less in each layer in the multi-layered wiring structure of the wiring layer formed in the multi-layered structure such as the two-layer structure which is the sample of the present test. Furthermore, to alleviate the vertical load stress, the plug interval between the Cu conductive contact plug 15 and the Cu reinforcing contact plug 47, or the plug interval between the Cu conductive via plug 27 and the Cu reinforcing via plug 53 is set preferably to the defined interval (about 5 μm or less) obtained in the present embodiment.

Moreover, for the pattern shape of the reinforcing wiring area (reinforcing multi-layered wiring area) 54, it has been found that various shapes shown in FIGS. 16A to 18B described later may be used. Even in this case, an effect similar to that of the present embodiment can be obtained. This will be described later in a sixth embodiment in detail.

Furthermore, as described above, in the reinforcing wiring area 54, mainly the Cu reinforcing contact plug 47 and Cu reinforcing via plug 53 comprise a portion which has a reinforcing function. Accordingly, the Cu reinforcing wiring layers 45, 51 do not have to be formed with minimum rule line widths. Even when the Cu reinforcing wiring layers 45, 51 were formed in broad wirings, it was possible to obtain the satisfactory results as long as the interval D between the plugs 47 or 53 was within the defined range.

As described above, according to the second embodiment, the effect similar to that of the first embodiment can be obtained. Moreover, especially when the interval E between the Cu conductive layer 14 and the Cu reinforcing metal layer 46 is set to about 5 μm or less, the vertical load stress applied to the effective wiring area 29 can largely be reduced.

Moreover, in the reinforcing wiring area 54 which does not comprise the conduction path, the SiCN film 3 of each layer which is the top barrier layer and the SiC film 2 which is the capping layer are not necessarily required. Furthermore, according to the semiconductor device 41 of the present embodiment, without providing the reinforcing materials including the SiCN film 3 and SiC film 2, the vertical load stress applied to the effective wiring area 29 can be reduced. That is, the mechanical reinforcing function in the reinforcing wiring area 54 can be fulfilled for the following reasons.

As described above, each Cu reinforcing contact plug 47 of the Cu reinforcing wiring layer 45 of the first layer which is the dummy wiring (sacrifice wiring) is substantially connected to the Si substrate 1 via the barrier metal film 9. The Si substrate 1 naturally has a Young's modulus of about 30 GPa or more, and can function as the reinforcing material in the same manner as the SiCN film 3 and SiC film 2. Therefore, even when the SiCN film 3 of the first layer is omitted, each Cu reinforcing contact plug 47 is substantially connected to the reinforcing material. Accordingly, the Cu reinforcing wiring layer 45 (Cu reinforcing metal layer 46) of the first layer is substantially connected to the Si substrate 1 which is the reinforcing material via each Cu reinforcing contact plug 47.

Moreover, as described above, the Cu reinforcing wiring layer 51 of the second layer which is the dummy wiring is formed continuing from the Cu reinforcing wiring layer 45 of the first layer along the stacking direction of the interlayer insulating film (low relative dielectric constant film) 4. Each Cu reinforcing via plug 53 of the Cu reinforcing wiring layer 51 of the second layer is substantially connected to the Cu reinforcing wiring layer 45 (Cu reinforcing metal layer 46) of the first layer via the barrier metal film 21. The Cu reinforcing wiring layer 45 naturally has a Young's modulus of about 30 GPa or more, and can function as the reinforcing material in the same manner as the SiCN film 3 and SiC film 2. Therefore, even when the SiCN film 3 and SiC film 2 of the second layer are omitted, each Cu reinforcing contact plug 53 is substantially connected to the reinforcing material. Accordingly, the Cu reinforcing wiring layer 51 (Cu reinforcing metal layer 52) of the second layer is substantially connected to the Cu reinforcing wiring layer 45 (Cu reinforcing metal layer 46) of the first layer which is the reinforcing material via each Cu reinforcing via plug 53.

As described above, in the semiconductor device 41 of the present embodiment, the Cu reinforcing wiring layer 45 of the first layer is substantially connected to the Si substrate 1 which is the reinforcing material, and further the Cu reinforcing wiring layer 51 of the second layer is substantially connected to the Cu reinforcing wiring layer 45 of the first layer which is the reinforcing material. Therefore, even when the SiCN film 3 and SiC film 2 as the reinforcing materials are omitted, the mechanical reinforcing function in the reinforcing wiring area 54 can be fulfilled. Accordingly, the vertical load stress applied to the effective wiring area 29 can be reduced.

Moreover, according to the present embodiment, since the reinforcing wiring area 54 is provided, adhesion strength can be enhanced in an interface between the top barrier layer 3 or capping layer 2 and the low relative dielectric constant film 4, and it is also possible to provide the semiconductor device 41 including the multi-layered wiring layer comprised of the Cu wiring layer/low-k film structure having the high reliability.

(Third Embodiment)

Figure 13:
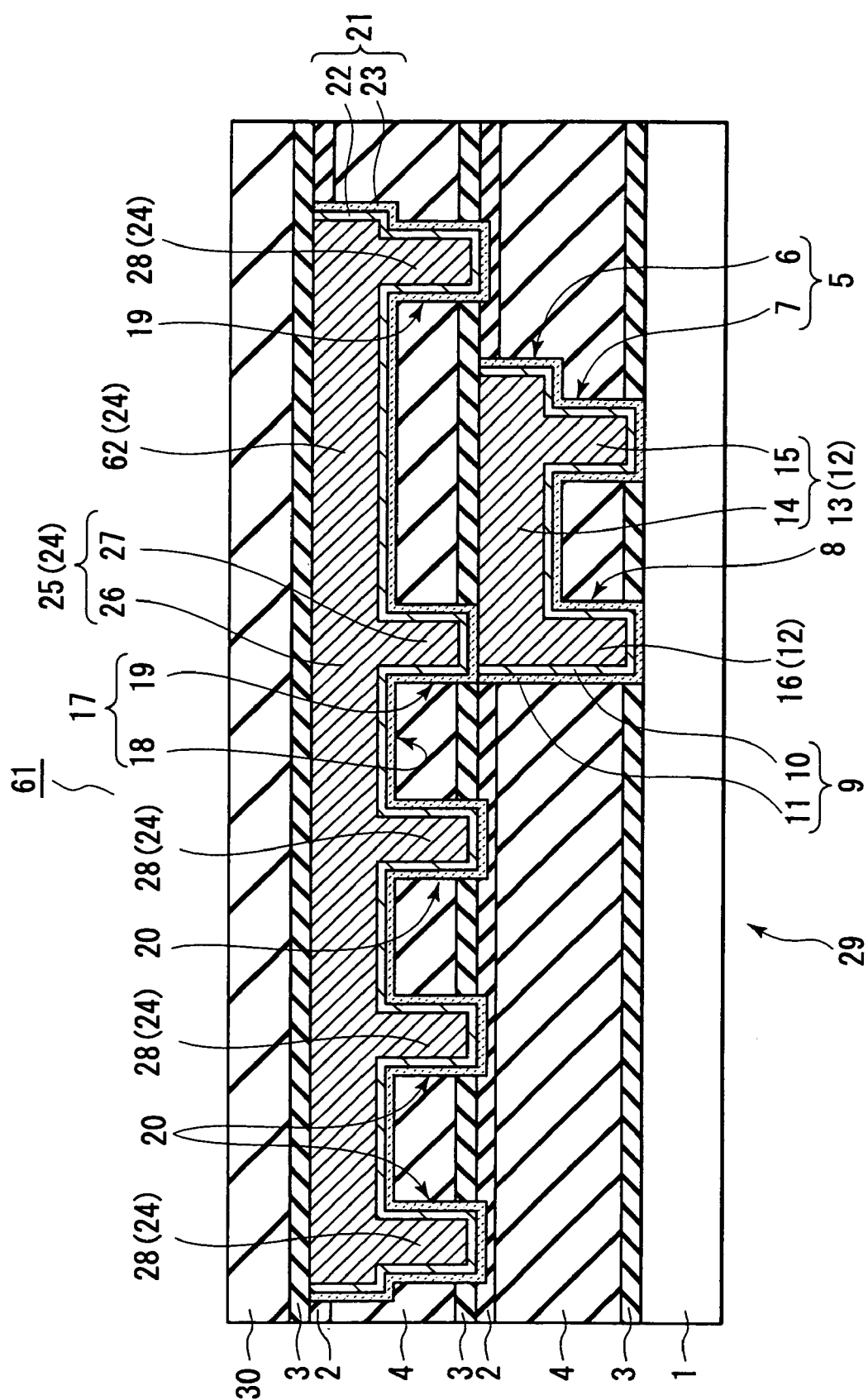
FIG. 13 is a sectional view showing the semiconductor device according to a third embodiment.

Next, a third embodiment according to the present invention will be described with reference to FIG. 13. FIG. 13 is a sectional view showing the semiconductor device according to the third embodiment. It is to be noted that the same components as those of the first embodiment are denoted with the same reference numerals, and the detailed description will be omitted.

As shown in FIG. 13, in a semiconductor device 61 of the present embodiment, another Cu reinforcing via plug 28 is added to the Cu wiring layer 25 of the second layer. This will concretely be described hereinafter.

Usually the via plug having the electric circuit function is preferably provided in an endmost portion of the wiring layer in each layer from a viewpoint of efficiency of wiring layout (design rule). Additionally, the wiring layer can sufficiently be extended in the interlayer insulating film in which the wiring layer is formed. In this area, the via plug having the electric circuit function is preferably provided in a position held between the reinforcing via plugs (sacrifice via plugs). That is, from a portion of the wiring layer in which the via plug having the electric circuit function is formed, an extended portion (reservoir) is formed on a side opposite to that on which the essential wiring layer is formed. Moreover, the reinforcing via plug is formed in this reservoir.

As shown in FIG. 13, in the semiconductor device 61, the Cu conductive layer 26 of the Cu wiring layer 25 of the second layer is extended and formed on the side opposite to that on which three Cu reinforcing via plugs 28 are formed. Moreover, one Cu reinforcing via plug 28 is formed in the end distant from the Cu conductive via plug 27 of a reservoir 62. This comprises a structure in which the Cu reinforcing via plugs 28 are provided on the opposite sides of the Cu conductive via plug 27.

As described above, according to the third embodiment, the effect similar to that of the first embodiment can be obtained. Moreover, since the Cu conductive via plug 27 includes a structure held (surrounded) by the Cu reinforcing via plugs 28 on the opposite sides, the horizontal and vertical load stresses applied to the Cu conductive via plug 27 are largely reduced. Therefore, in the semiconductor device 61 of the present embodiment, the durability of the Cu wiring layers 13, 25 is further enhanced against the load by the heat stress generated in the conductive portions such as the Cu wiring layers 13, 25 and the low relative dielectric constant film 4. That is, the reliability of the semiconductor device 61 is further enhanced.

(Fourth Embodiment)

Figure 14:
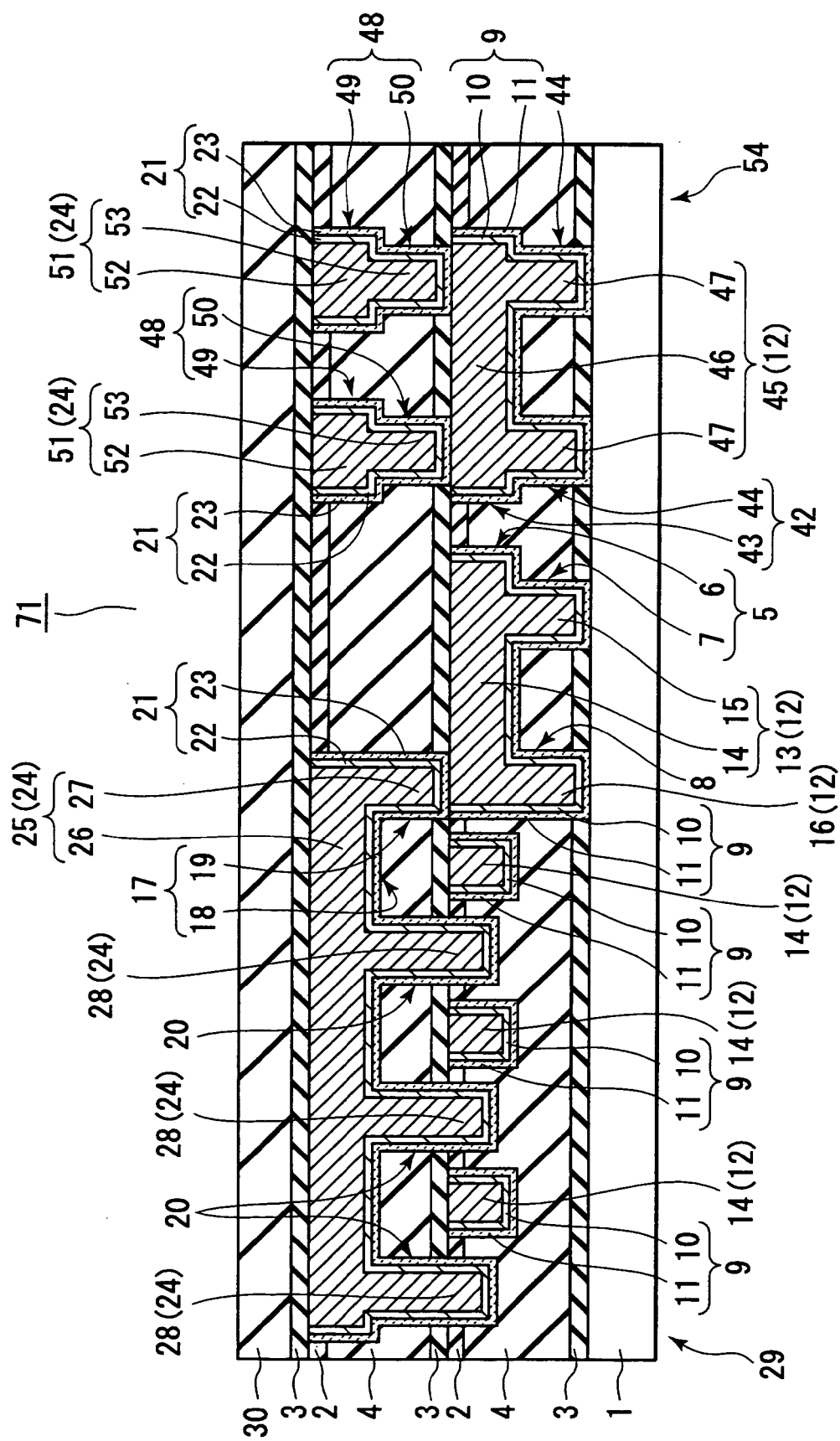
FIG. 14 is a sectional view showing the semiconductor device according to a fourth embodiment.

Next, a fourth embodiment according to the present invention will be described with reference to FIG. 14. FIG. 14 is a sectional view showing the semiconductor device according to the present embodiment. It is to be noted that the same components as those of the first embodiment are denoted with the same reference numerals, and the detailed description will be omitted.

As shown in FIG. 14, in a semiconductor device 71 of the present embodiment, each Cu reinforcing via plug 28 is extended downwards, and formed completely extending through the SiCN film 3 of the second layer and the SiC film 2 of the first layer. Moreover, the lower end of each Cu reinforcing via plug 28 projects into the low relative dielectric constant film (interlayer insulating film) 4 of the first layer. Therefore, each Cu reinforcing via plug 28 is substantially connected to the SiCN film 3 and SiC film 2 which are reinforcing materials (films) in an intermediate portion.

As described above, according to the fourth embodiment, the effect similar to that of the first and second embodiments can be obtained. Moreover, as shown in FIG. 14, the Cu reinforcing via plug 28 of the present embodiment may be formed in a position and shape such that the plug does not electrically contact the Cu conductive layer 14 (Cu wiring layer 13) formed in the low relative dielectric constant film (interlayer insulating film) 4 of the lower layer (first layer). This can substantially eliminate a possibility that electric defects such as the short-circuit between the layers in the device 71 occur. Moreover, the horizontal and vertical load stresses applied to the Cu wiring layer 25 of the second layer including the Cu conductive layer 26 and Cu conductive via plug 27 can be reduced.

(Fifth Embodiment)

Figure 15:
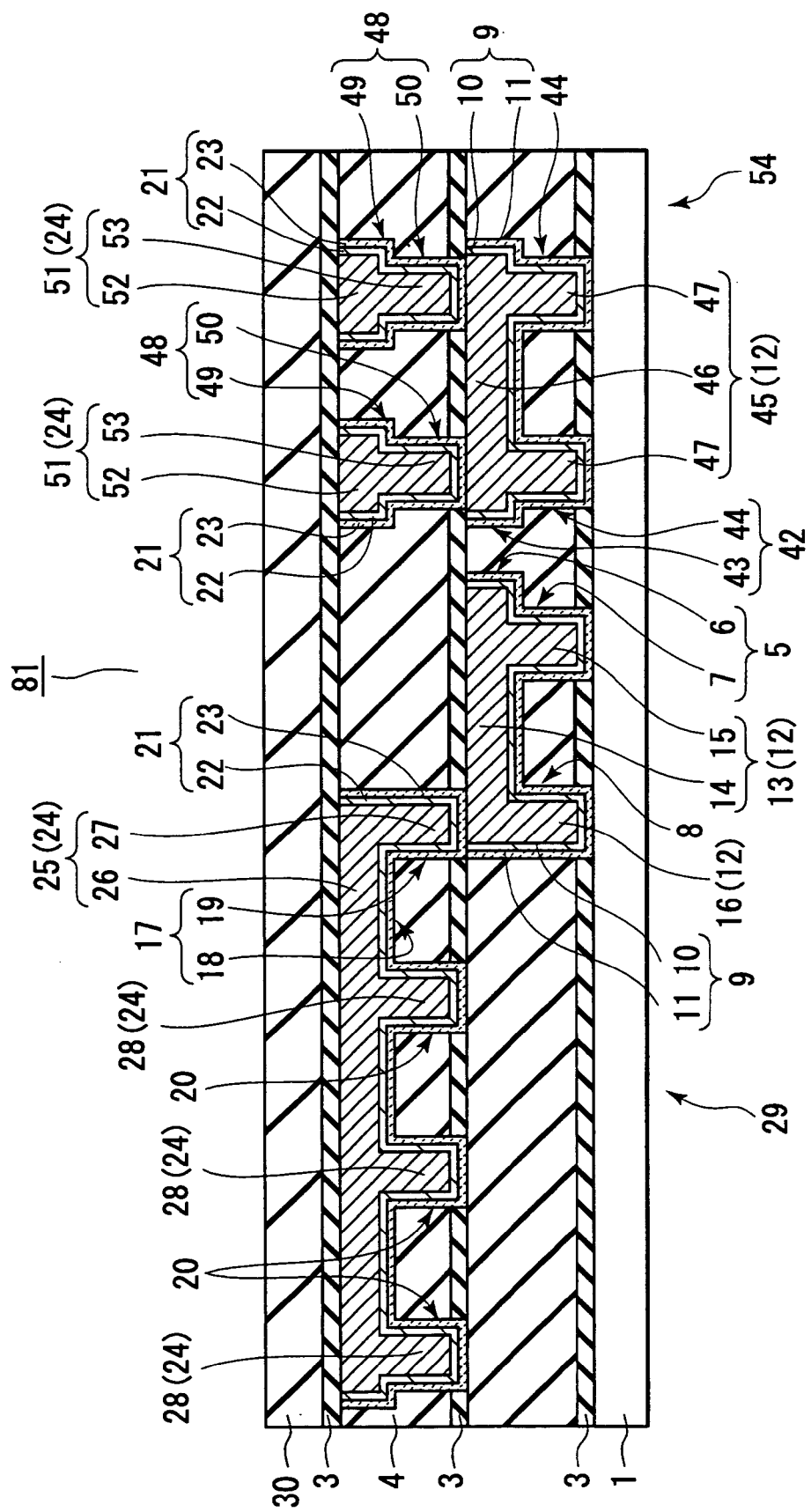
FIG. 15 is a sectional view showing the semiconductor device according to a fifth embodiment.

Next, a fifth embodiment according to the present invention will be described with reference to FIG. 15. FIG. 15 is a sectional view showing the semiconductor device according to the present embodiment. It is to be noted that the same components as those of the first embodiment are denoted with the same reference numerals, and the detailed description will be omitted.

As shown in FIG. 15, in a semiconductor device 81 of the present embodiment, the SiC film comprising the capping layer is not provided. As the reinforcing material, only the SiCN film 3 substantially connected to the Cu reinforcing via plugs 28, 53 is provided to directly contact the low relative dielectric constant film (interlayer insulating film) 4 of the first and second layers.

As described above, according to the fifth embodiment, the effect similar to that of the first to fourth embodiments can be obtained. Although the SiC film is omitted, the Cu reinforcing via plugs 28, 53 are substantially connected to the SiCN film 3 which is the reinforcing film. Therefore, the durability of the Cu wiring layers 13, 25 against the load by the heat stress generated in the conductive portions such as the Cu wiring layers 13, 25 and the low relative dielectric constant film 4 is enhanced. That is, the reliability of the semiconductor device 81 is enhanced.

Moreover, in the same manner as in the semiconductor device 41 of the second embodiment, also in the semiconductor device 81 of the present embodiment, the SiCN film 3 of each layer which is the top barrier layer is not necessarily required in the reinforcing wiring area 54 in which the conduction path is not comprised. Furthermore, without providing any SiCN film 3 that is the reinforcing material, the vertical load stress applied to the effective wiring area 29 can be reduced. That is, the mechanical reinforcing function in the reinforcing wiring area 54 can be fulfilled. The reason for this has been described in the second embodiment.

(Sixth Embodiment)

Figure 16A:
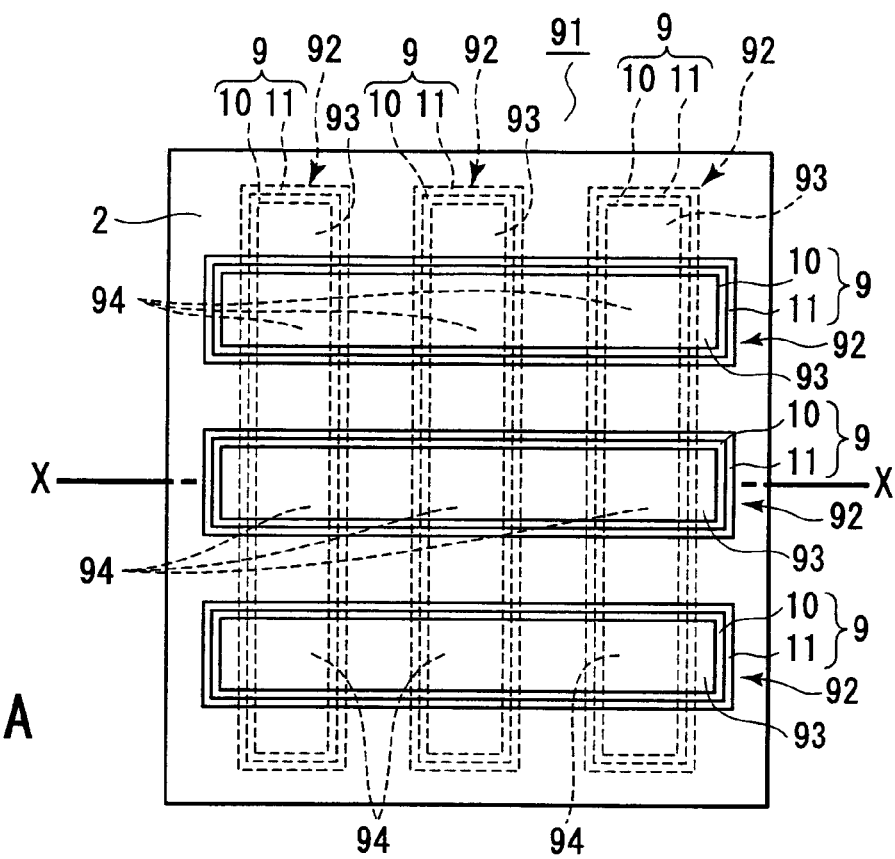
FIG. 16A is a plan view showing a pattern in which the reinforcing wiring layer of the semiconductor device according to a sixth embodiment is provided.
Figure 16B:
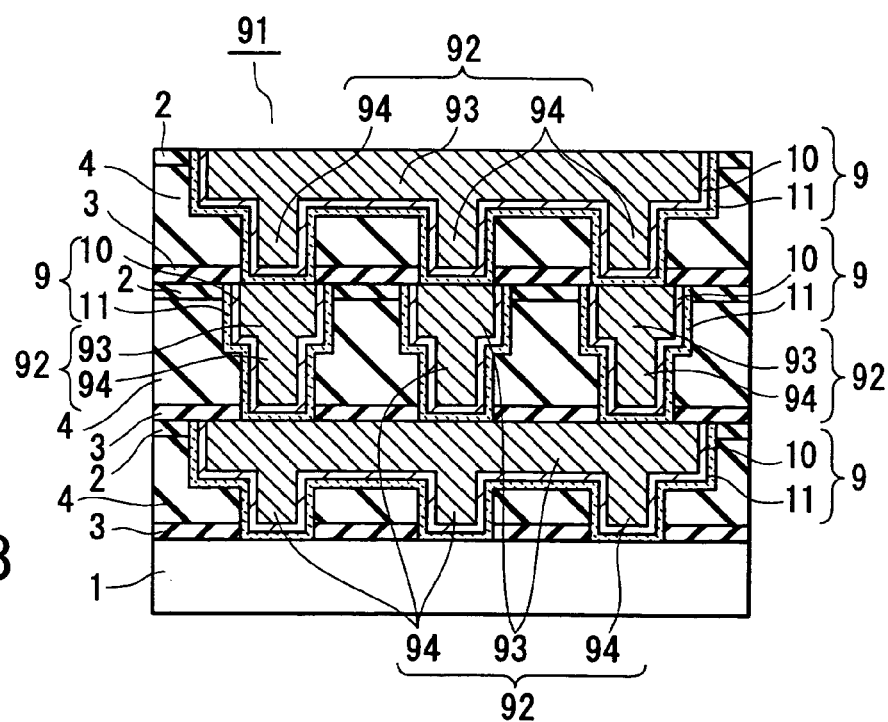
FIG. 16B is a sectional view showing a pattern in which the reinforcing wiring layer of the semiconductor device according to the sixth embodiment is provided.
Figure 17A:
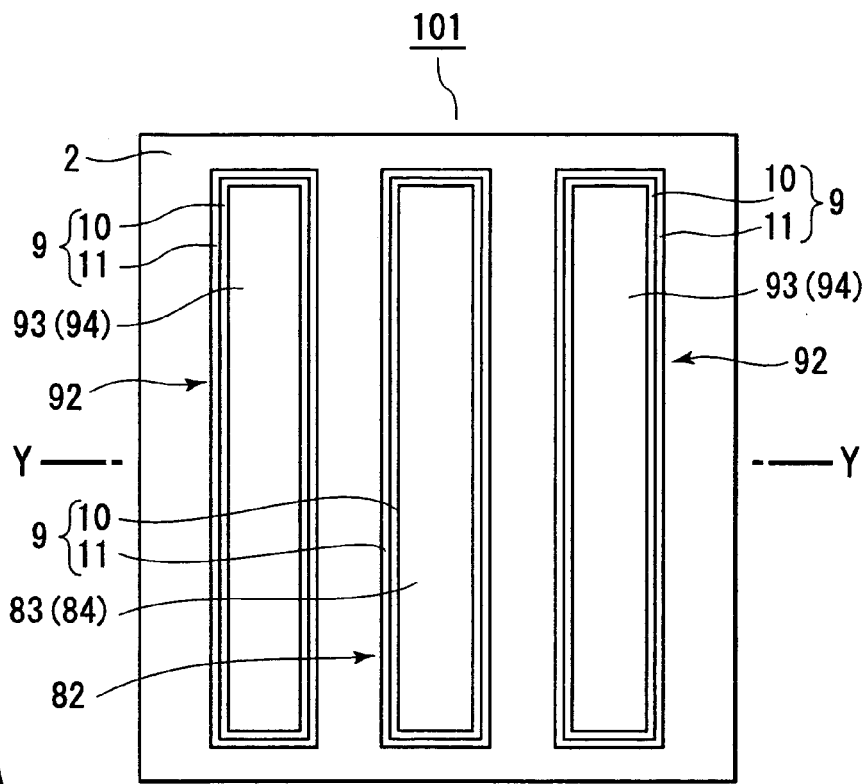
FIG. 17A is a plan view showing another pattern in which the reinforcing wiring layer of the semiconductor device according to the sixth embodiment is provided.
Figure 17B:
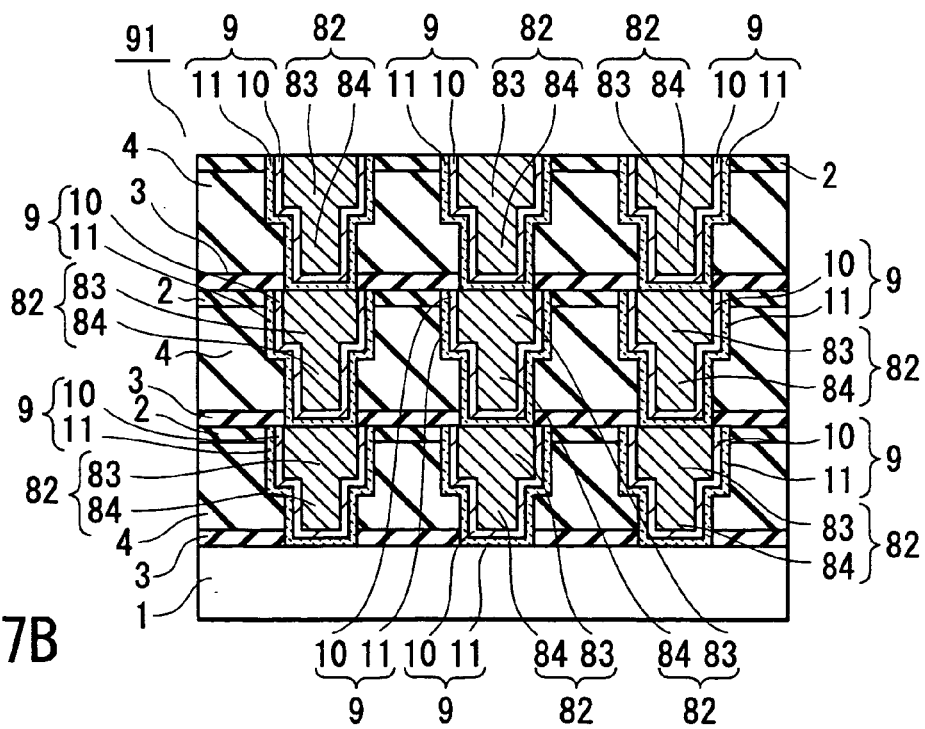
FIG. 17B is a sectional view showing another pattern in which the reinforcing wiring layer of the semiconductor device according to the sixth embodiment is provided.
Figure 18A:
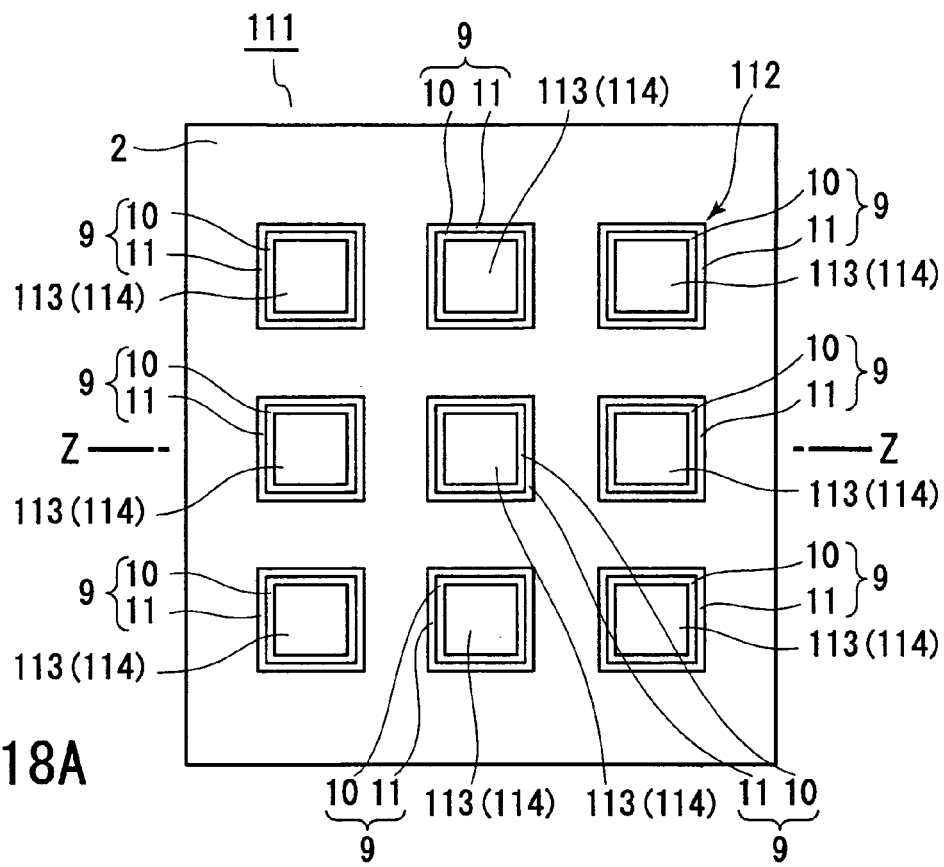
FIG. 18A is a plan view showing another pattern in which the reinforcing wiring layer of the semiconductor device according to the sixth embodiment is provided.
Figure 18B:
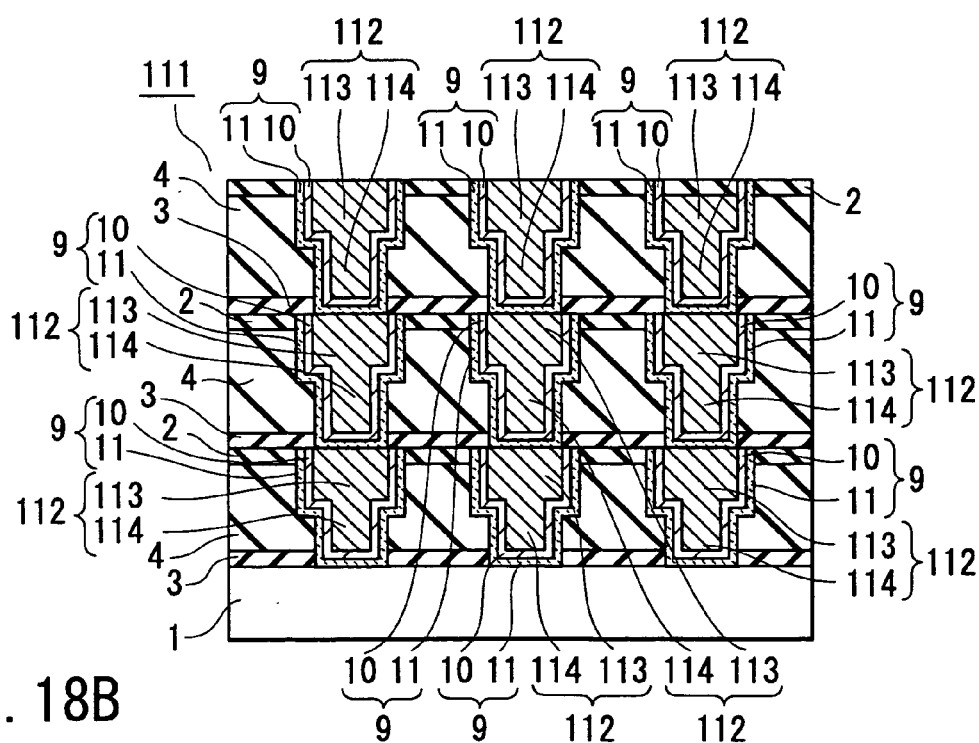
FIG. 18B is a sectional view showing another pattern in which the reinforcing wiring layer of the semiconductor device according to the sixth embodiment is provided.

Next, a sixth embodiment according to the present invention will be described with reference to FIGS. 16A, 16B, 17A, 17B, 18A, and 18B. FIG. 16A is a plan view showing a pattern in which the reinforcing wiring layer of the semiconductor device according to the sixth embodiment is provided. FIG. 16B is a sectional view showing a pattern in which the reinforcing wiring layer of the semiconductor device according to the sixth embodiment is provided. FIG. 17A is a plan view showing another pattern in which the reinforcing wiring layer of the semiconductor device according to the sixth embodiment is provided. FIG. 17B is a sectional view showing another pattern in which the reinforcing wiring layer of the semiconductor device according to the sixth embodiment is provided. FIG. 18A is a plan view showing still another pattern in which the reinforcing wiring layer of the semiconductor device according to the sixth embodiment is provided. FIG. 18B is a sectional view showing still another pattern in which the reinforcing wiring layer of the semiconductor device according to the sixth embodiment is provided. It is to be noted that the same components as those of the first embodiment are denoted with the same reference numerals, and the detailed description will be omitted.

In a semiconductor device 91 shown in FIGS. 16A and 16B, Cu reinforcing wiring layers 92 each including a Cu reinforcing metal layer 93 and a Cu reinforcing contact plug 94 (Cu reinforcing via plug 94) are stacked/formed in three layers (n−1 layer, n layer, n+1 layer). That is, the semiconductor device 91 includes the multi-layered reinforcing wiring structure. Moreover, as shown in FIGS. 16A and 16B, the Cu reinforcing wiring layer 92 of each layer is provided so that the longitudinal direction substantially crosses at right angles to that of the Cu reinforcing wiring layer 92 of the adjacent layer. It is to be noted that FIG. 16B is a sectional view along one-dot chain line X—X in FIG. 16A.

Moreover, in a semiconductor device 101 shown in FIGS. 17A and 17B, in the same manner as in the semiconductor device 91, the Cu reinforcing wiring layers 92 each including the Cu reinforcing metal layer 93 and Cu reinforcing contact plug 94 (Cu reinforcing via plug 94) are stacked/formed in three layers (n−1 layer, n layer, n+1 layer). That is, the semiconductor device 101 also includes the multi-layered reinforcing wiring structure. Additionally, in the semiconductor device 101, as shown in FIGS. 17A and 17B, the Cu reinforcing wiring layer 92 of each layer is provided substantially in the same position in the stacking direction so that all the longitudinal directions agree with one another in all the layers (extend substantially in parallel with one another). It is to be noted that FIG. 17B is a sectional view along one-dot chain line Y—Y in FIG. 17A.

Further in a semiconductor device 111 shown in FIGS. 18A and 18B, Cu reinforcing wiring layers 112 each including a Cu reinforcing contact plug (Cu reinforcing via plug) 114, and a Cu reinforcing metal layer 113 having substantially the same size and shape as those of the reinforcing plug 114 are stacked/formed in three layers (n−1 layer, n layer, n+1 layer). That is, the semiconductor device 111 also includes the multi-layered reinforcing wiring structure. It is to be noted that FIG. 18B is a sectional view along one-dot chain line Z—Z in FIG. 18A.

It is to be noted that in FIGS. 16A, 16B, 17A, 17B, 18A, and 18B, for the ease of seeing the drawing, the SiCN film 3 and passivation film 30 of the top layer are omitted from the drawing. The constitution of the effective wiring area of each of the respective semiconductor devices 91, 101, 111 is similar to that in which the effective wiring area 29 according to any one of the first to fifth embodiments is stacked in three layers, and is therefore omitted from the drawing.

As described above, according to the sixth embodiment, the effect similar to that of the second, fourth, and fifth embodiments can be obtained. Especially, as in the semiconductor devices 91, 101, 111 of the present embodiment, the Cu reinforcing wiring layers 92, 112 are appropriately formed in the appropriate sizes and shapes, and provided in the appropriate positions. Accordingly, while the reinforcing effect is held, restrictions on designs of the Cu reinforcing wiring layers (sacrifice multi-layered wirings) 92, 112 required by the design rule can be reduced. That is, while the mechanical reinforcing effects of the Cu reinforcing wiring layers 92, 112 are held, a degree of freedom in design can be enhanced. It is to be noted that in the multi-layered wiring structure in which the wiring layer is formed in the multi-layered structure, in each layer, an interval (distance between the patterns) between the Cu conductive layer of the effective wiring area (not shown) and the Cu reinforcing metal layer 93 or 113 of the reinforcing wiring area is more preferably about 5 μm or less.

(Seventh Embodiment)

Figure 19A:
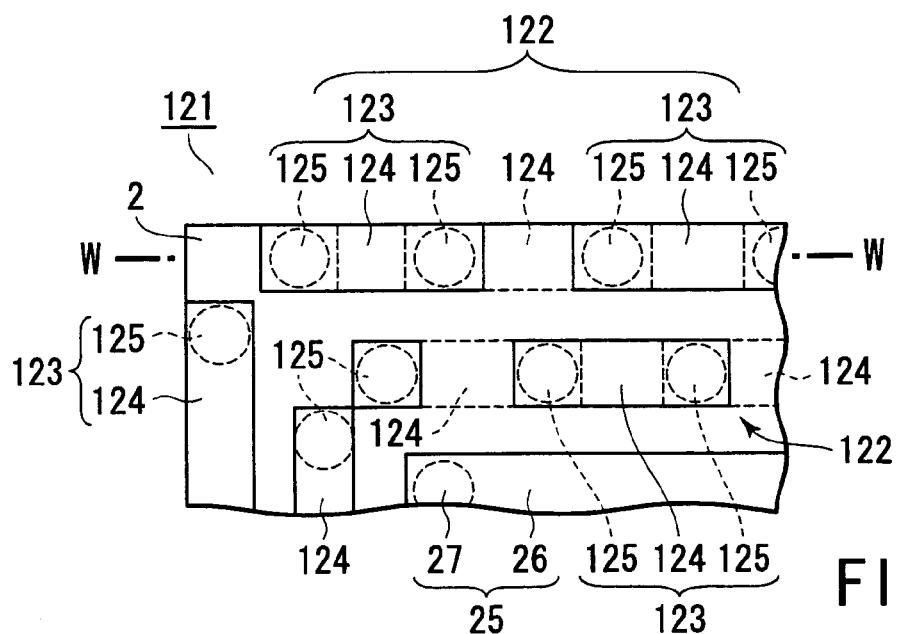
FIG. 19A is a plan view showing a pattern in which a dummy via chain of the semiconductor device according to a seventh embodiment is provided.
Figure 19B:
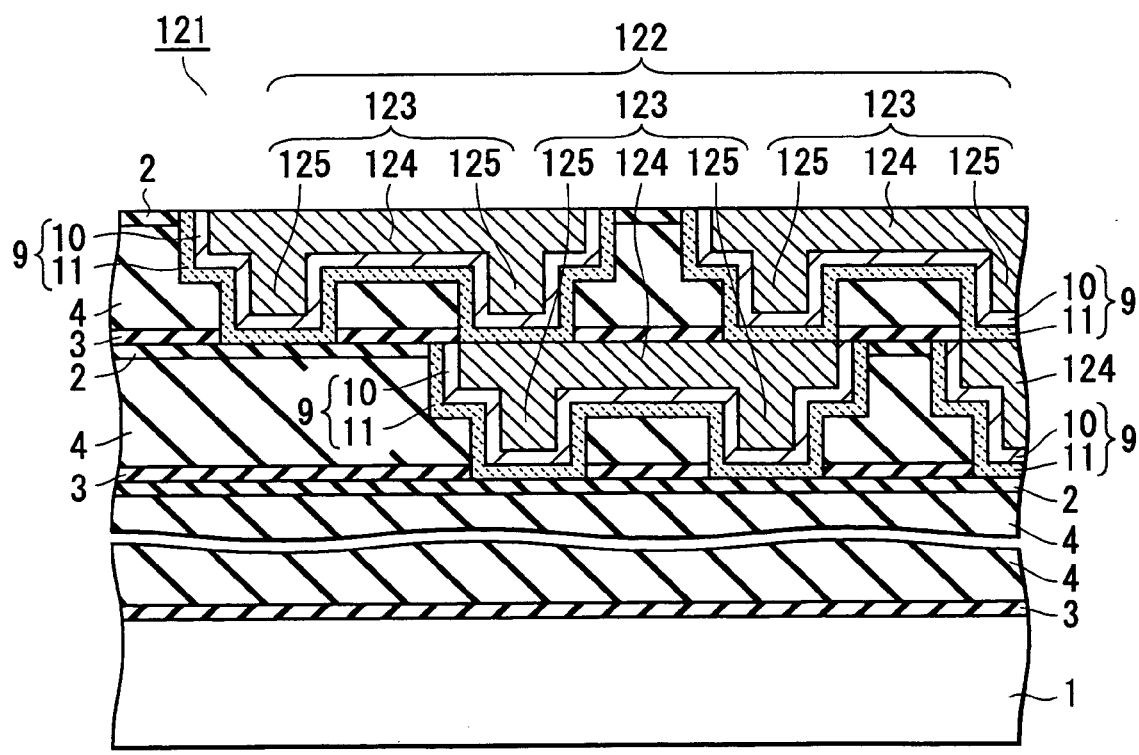
FIG. 19B is a sectional view showing a pattern in which the dummy via chain of the semiconductor device according to the seventh embodiment is provided.
Figure 20:
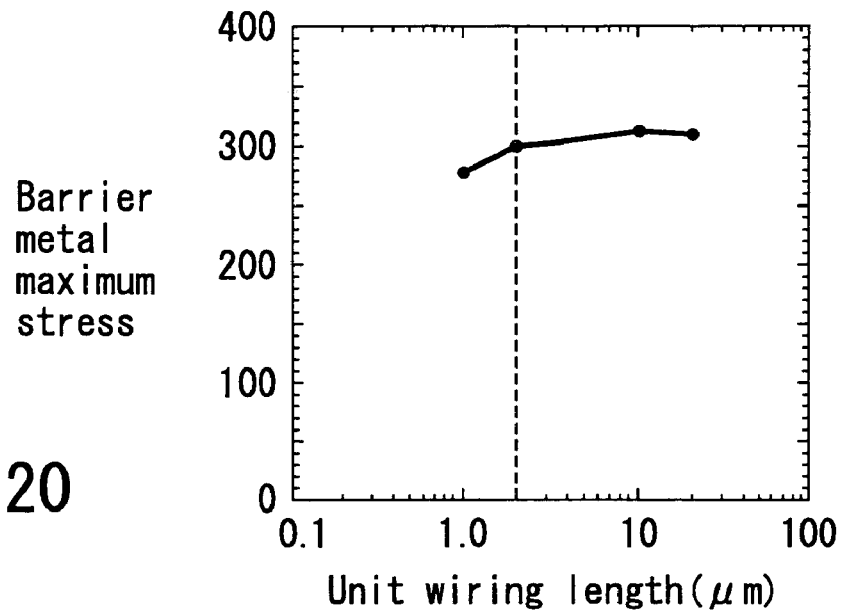
FIG. 20 is a characteristic diagram showing results of a simulation carried out by the present inventors according to the seventh embodiment in a graph.

Next, a seventh embodiment according to the present invention will be described with reference to FIGS. 19A, 19B, and 20. FIG. 19A is a plan view showing a pattern in which a dummy via chain of the semiconductor device according to the present embodiment is provided, and FIG. 19B is a sectional view. FIG. 20 is a characteristic diagram showing results of a simulation carried out by the present inventors according in a graph. It is to be noted that the same components as those of the first embodiment are denoted with the same reference numerals, and the detailed description will be omitted.

In the present embodiment, for example, in the semiconductor device including the Cu multi-layered wiring structure, an insulating film of at least one layer of a plurality of layers of insulating films (interlayer insulating films) in which the via plugs (contact plugs) of the effective wiring area are provided is formed using the low relative dielectric constant film whose Young's modulus is about 20 GPa or less. In this case, a dummy wiring (dummy via chain) comprised of a so-called via chain is provided in the vicinity of the effective wiring. This inhibits a possibility that cracks are generated in the barrier metal film with which the plug is coated and the insulating film around the plug.

First, a related art of the present embodiment will be described. As described above, the Young's modulus of most of general low relative dielectric constant films for use as the interlayer insulating film is as low as about 20 GPa or less, and the coefficient of linear expansion is as large as about 20 ppm or more. For example, the coefficient of linear expansion of Cu comprising the wiring material is about 16 ppm to 30 ppm at a temperature range of room temperature to about 500° C. On the other hand, for the barrier metal film for use between the Cu wiring and the interlayer insulating film, high-melting metals such as Ta and Ti and a compound are frequently used, and the coefficient of linear expansion is about 10 ppm or less. Therefore, in high-temperature processes such as anneal and sinter, in the barrier metal film held between Cu and the low relative dielectric constant insulating film, a large heat stress is caused by a difficult between the materials in the coefficient of linear expansion. When the heat stress is not less than a value predetermined in accordance with the type of the material of the barrier metal film, the cracks are generated in the barrier metal film. In general, the barrier metal film with which a side wall portion of the via plug is coated is thinner than the barrier metal film provided in another portion, and therefore the cracks are easily made.

Moreover, for example, for a purpose of preventing the interlayer insulating film from peeling by dishing or external stress at the time when CMP is carried out, a measure of laying the dummy wiring around a so-called isolated wiring is taken. A technique for laying the dummy wiring around the isolated wiring will briefly be described hereinafter with reference to FIGS. 44A and 44B.

Figure 44A:
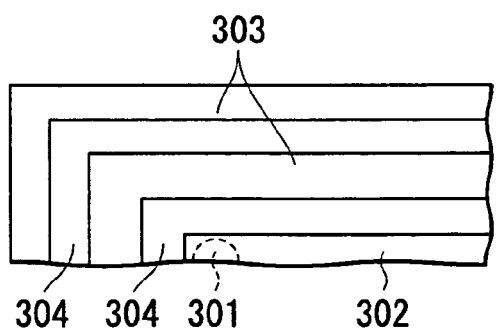
FIG. 44A is a plan view showing the wiring structure of the semiconductor device which is a comparative example for the seventh embodiment.
Figure 44B:
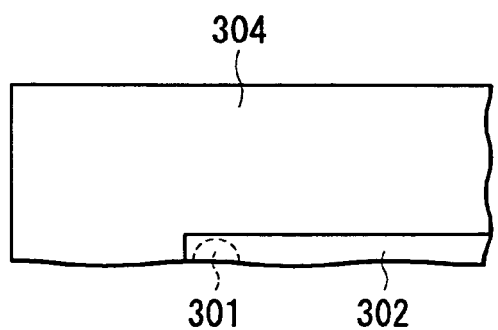
FIG. 44B is a plan view showing another wiring structure of the semiconductor device which is the comparative example for the seventh embodiment.

FIGS. 44A and 44B are plan views showing the wiring structure of the semiconductor device which is a comparative example with respect to the semiconductor device according to the present embodiment described later. In FIG. 44A, a seamless single structure including no via plug and including dummy wirings 303 having large wiring lengths is provided around an isolated wiring (effective wiring) 302 including a via plug 301. On the other hand, in FIG. 44B, the wiring structure is comprised only of the isolated wiring 302 including the via plug 301. In the respective semiconductor devices shown in FIGS. 44A and 44B, as interlayer insulating films 304 around the via plugs 301 and isolated wirings 302, a low relative dielectric constant insulating film having a Young's modulus of about 5 GPa and a coefficient of linear expansion of about 40 ppm is used. Additionally, in FIGS. 44A and 44B, for the ease of seeing the drawing, the barrier metal film is omitted from the drawing.

The present inventors obtained the heat stresses generated in the barrier metal films of the via plug 301 and isolated wiring 302 at the time of an anneal treatment with respect to the semiconductor devices shown in FIGS. 44A and 44B by the simulation. According to the result of the simulation, when the dummy wirings 303 are provided around the isolated wiring 302, the heat stress generated in the barrier metal film of the side wall portion of the via plug 301 has been found to be large as compared with when only the isolated wiring 302 is provided. That is, when the conventional single dummy wiring 303 having large wiring length is provided around the isolated wiring 302, the cracks are easily generated by the heat stress in the barrier metal film of the side wall portion of the via plug 301. When the cracks are generated in the barrier metal film, the cracks are developed even in the low relative dielectric constant insulating film 304, and there is a possibility that the insulating film 304 is also cracked. When the insulating film 304 is cracked, the wiring materials such as Cu in a compressive stress state at high temperature easily project into the film. Moreover, when the wiring material projects into the crack in the insulating film 304, short-circuit defect is generated, and the yield of the semiconductor device drops.

To solve the problem, in the present embodiment, the dummy wiring is comprised as a so-called dummy via chain, and the dummy via chain is provided in the vicinity of the effective wirings such as the isolated wiring. This suppresses a possibility that the barrier metal film or the insulating film with which the effective wiring or the via plug is coated is cracked. This will be described hereinafter in detail.

First, the structure of the dummy via chain of the seventh embodiment will be described with reference to FIGS. 19A and 19B. It is to be noted that FIG. 19B is a sectional view along broken line W—W in FIG. 19A. In FIG. 19A, for the ease of seeing the drawing, the barrier metal film 9 (10, 11) is omitted from the drawing.

As shown in FIG. 19A, in a semiconductor device 121 of the present embodiment, to surround the Cu wiring layer 25 which is the isolated wiring (effective wiring), a dummy via chain 122 which is the dummy wiring is provided to spread along the surface of the low relative dielectric constant film 4. For the dummy via chain 122 of the present embodiment, a plurality of Cu reinforcing wiring layers 123 each including one Cu reinforcing metal layer 124 and two Cu reinforcing via plugs 125 are connected to one another via the Cu reinforcing via plugs 125. As shown in FIG. 19B, the Cu reinforcing wiring layers 123 are stacked in two layers so as to continuously extend along a direction crossing at right angles to the stacking direction of the low relative dielectric constant film 4.

This will be described in more detail. A plurality of layer of the low relative dielectric constant film 4 is provided on the Si substrate 1. Moreover, the respective Cu reinforcing metal layers 124 are superposed upon one another in the stacking direction of the low relative dielectric constant films 4, and deviate from one another along a direction vertical to the stacking direction of the low relative dielectric constant films 4. A plurality of Cu reinforcing metal layers are provided in the low relative dielectric constant films 4 of two layers provided adjacent to each other among the low relative dielectric constant films 4. Each Cu reinforcing metal layer 124 is formed in a long shape so as to extend long from the diameter of the Cu reinforcing via plug 125 along the surface of the low relative dielectric constant film 4. Additionally, the Cu reinforcing metal layer 124 is formed to be sufficiently shorter than the Cu conductive layer 26. The Cu reinforcing metal layers 124 are connected to each other along the stacking direction of the low relative dielectric constant films 4 by the Cu reinforcing via plugs 125 provided integrally with the ends of the Cu reinforcing metal layers 124. A plurality of dummy via chains 122 comprised in this manner surround the Cu wiring layer 25 and spread along the surface of the low relative dielectric constant film 4 on the Si substrate 1 as shown in FIG. 19A.

It is to be noted that in actual, as shown in FIG. 19B, the Cu reinforcing metal layers 124 are connected to each other by the Cu reinforcing via plugs 125 via the barrier metal film 9 including the Ta film 10 and TaN film 11. And in FIG. 19B, for the ease of seeing the drawing, the SiCN film 3, and the passivation film 30 of the top layer are omitted from the drawing. Additionally, in the following description, for the sake of simplicity, the barrier metal film 9 is omitted and the connection of the Cu reinforcing metal layers 124 to each other will be described. As shown in FIG. 19B, the Cu reinforcing via plugs 125 which connect the Cu reinforcing metal layers 124 each other, in the present embodiment, are connected to the Cu reinforcing metal layers 124 and the SiCN film 3 which is the reinforcing material (reinforcing film). Therefore, the Cu reinforcing via plugs 125 of the present embodiment are actually similar to the reinforcing plugs such as the Cu reinforcing via plugs 53, 94, 114 of the second and fourth to sixth embodiments.

Moreover, a method for forming the dummy via chain 122 of the present embodiment is similar to that for forming the Cu reinforcing wiring layer 45 of the first layer and the Cu reinforcing wiring layer 51 of the second layer of the second embodiment. That is, since the method for forming the dummy via chain 122 is similar to that for forming the Cu wiring layer 13 of the first layer and the Cu wiring layer 25 of the second layer of the first to fifth embodiments, the description will be omitted.

Next, the simulation carried out by the present inventors will be described with reference to FIG. 20. The present inventors set the constitution and provided state of a plurality of dummy via chains 122 to those shown in FIGS. 19A and 19B. Subsequently, a maximum heat stress generated in the barrier metal film 9 (not shown) provided in the side wall portion of the Cu conductive via plug 27 of the Cu wiring layer 25 which was the isolated wiring in a case in which the semiconductor device 121 was subjected to the anneal treatment was calculated by the simulation. Furthermore, dependence of the maximum heat stress on the length (unit wiring length) of each Cu reinforcing metal layer 124 comprising the dummy via chain 122 was plotted, and shown in a graph. As a result, as clearly seen from FIG. 20, when the unit wiring length is about 2 μm or less, the heat stress generated in the barrier metal film 9 provided in the side wall portion of the Cu conductive via plug 27 is satisfactorily reduced.

Moreover, although not shown, the present inventors actually prepared three types of semiconductor devices including different dummy wirings to conduct experiments. One of the devices is a semiconductor device including a dummy via chain comprised of the Cu reinforcing metal layer 124 having a unit wiring length of about 1 μm as the dummy wiring. This semiconductor device is assumed as a first example. Another one is a semiconductor device including the dummy via chain comprised of the Cu reinforcing metal layer 124 having a unit wiring length of about 10 μm. This semiconductor device is assumed as a second example. In these two semiconductor devices, the respective dummy via chains are provided as shown in FIGS. 19A and 19B. Further remaining one is a semiconductor device as the comparative example, including a dummy wiring which does not have the reinforcing via plug. This semiconductor device is assumed as a third example. In the semiconductor device, the dummy wiring is provided as shown in FIG. 43A. The present inventors subjected these three types of semiconductor devices to the anneal treatment, and checked the yield thereafter.

As a result of the experiment, in the first example, the yield was substantially 100%. On the other hand, in the second and third examples, the barrier metal film provided in the side wall portion of the conductive via plug connected to the isolated wiring (effective wiring) was cracked, and the short-circuit defect was caused.

As described above according to the seventh embodiment, the effect similar to that of the first to sixth embodiments can be obtained. When the unit wiring length of the Cu reinforcing metal layer 124 comprising the dummy via chain 122 is set to about 2 μm or less, even with the use of the low relative dielectric constant film 4 as the interlayer insulating film, the heat stress generated in the barrier metal film 9 provided in the side wall portion of the Cu conductive via plug 27 during the high-temperature process such as the anneal and sinter can satisfactorily be reduced. This can substantially eliminate a possibility that the barrier metal film 9 provided around the Cu conductive via plug 27 (contact plug) is cracked. Additionally, a possibility that the low relative dielectric constant film 4 is cracked by the cracking of the barrier metal film 9 can substantially be eliminated. As a result, it is possible to obtain the semiconductor device 121 which is high in the quality, capability, reliability, and productivity.

(Eighth Embodiment)

Figure 23:
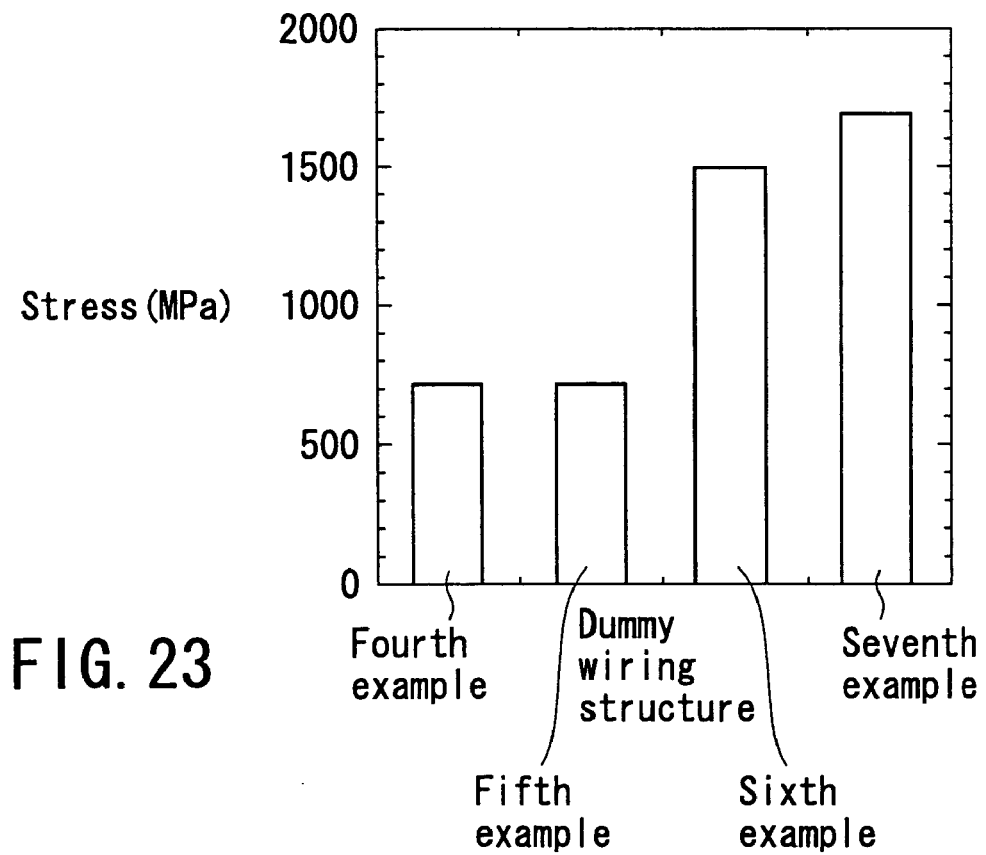
FIG. 23 is a characteristic diagram showing the results of the simulation carried out by the present inventors according to the eighth embodiment in a graph.
Figure 21A:
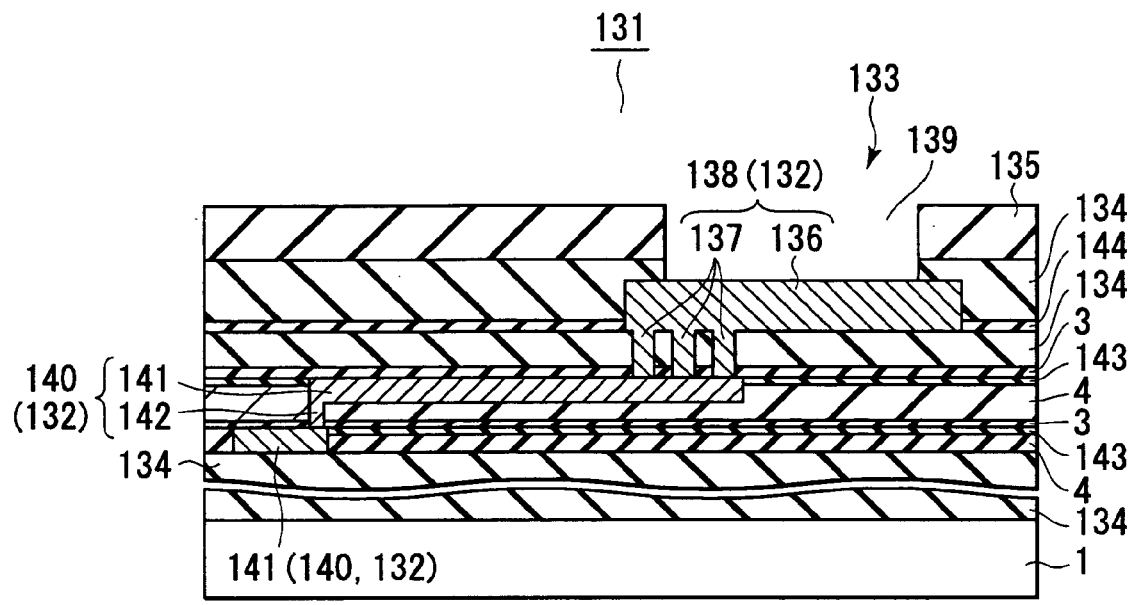
FIG. 21A is a sectional view showing a structure of an effective wiring in the vicinity of a pad portion of the semiconductor device according to an eighth embodiment.
Figure 21B:
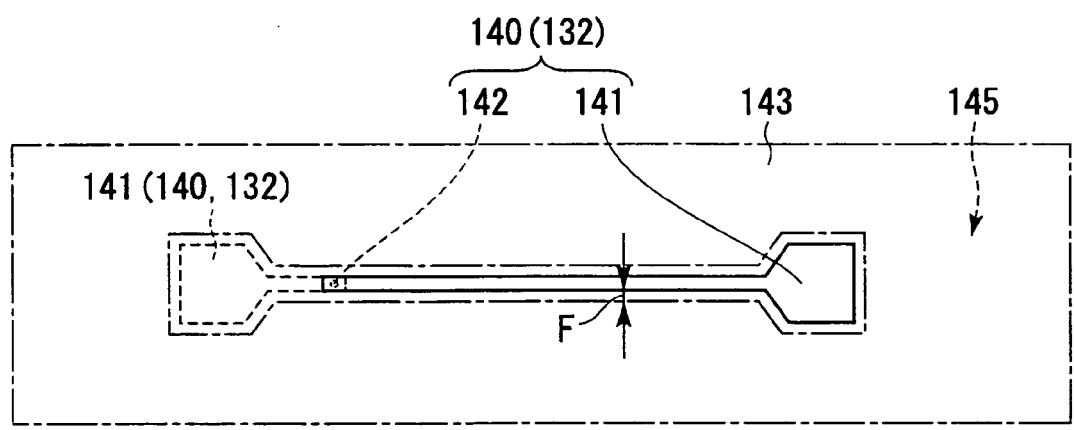
FIG. 21B is a plan view showing the structure of the effective wiring in the vicinity of the pad portion of the semiconductor device according to the eighth embodiment.
Figure 22A:
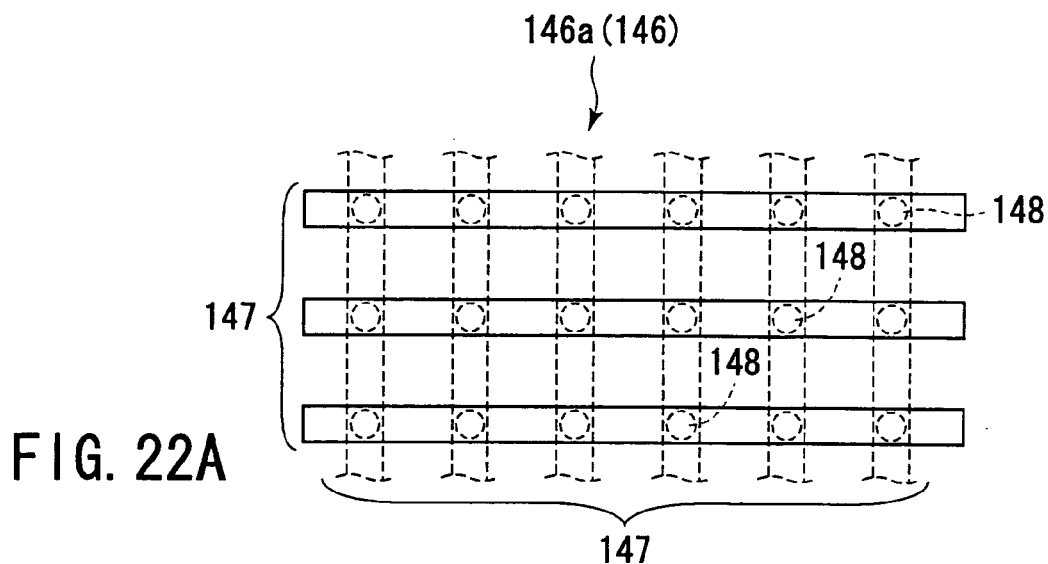
FIG. 22A is a plan view showing a pattern in which the dummy via chain of the semiconductor device according to the eighth embodiment is provided.
Figure 22B:
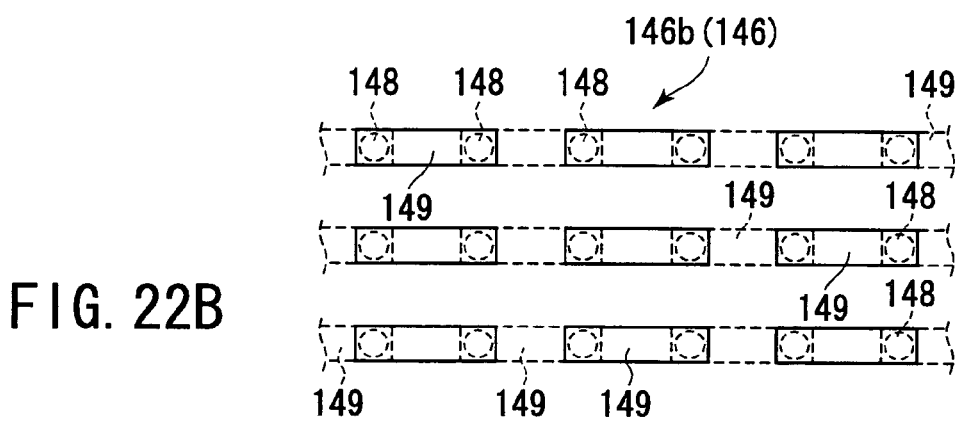
FIG. 22B is a plan view showing another pattern in which the dummy via chain of the semiconductor device according to the eighth embodiment is provided.
Figure 22C:
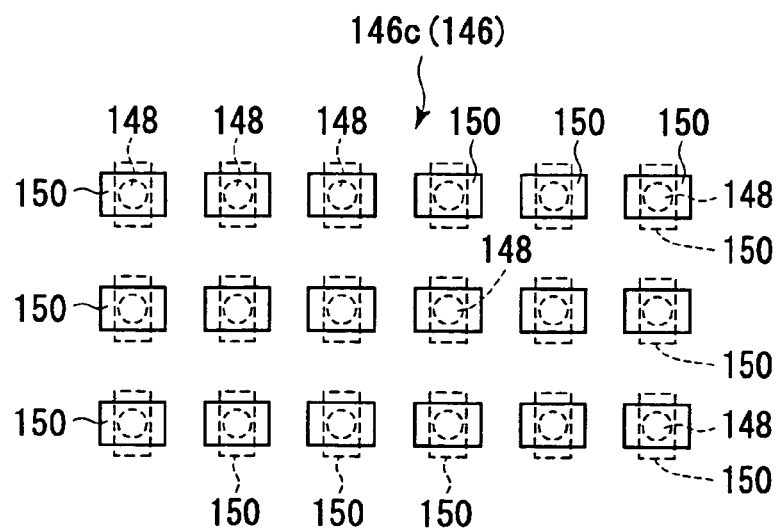
FIG. 22C is a plan view showing another pattern in which the dummy via chain of the semiconductor device according to the eighth embodiment is provided.

Next, an eighth embodiment of the present invention will be described with reference to FIGS. 21A to 23. FIG. 21A is a sectional view showing a structure of the effective wiring in the vicinity of a pad portion of the semiconductor device according to the eighth embodiment, and FIG. 21B is a plan view. FIGS. 22A, 22B, and 22C are plan views showing another pattern in which the dummy via chain of the semiconductor device according to the eighth embodiment is provided. FIG. 23 is a characteristic diagram showing the results of the simulation carried out by the present inventors in a graph. It is to be noted that the same components as those of the first embodiment are denoted with the same reference numerals, and the detailed description will be omitted.

In the present embodiment, a plurality of semiconductor devices were prepared in which some different types of dummy wirings including the dummy via chain 122 described in the seventh embodiment were provided in the vicinity of the effective wiring of the pad portion of the semiconductor device. Moreover, the semiconductor device in which any dummy wiring was not provided was prepared. Furthermore, these semiconductor devices were subjected to a heat treatment or wires were bonded to the pad portions of the semiconductor devices to conduct the tests, and the effects of the dummy wiring structures were compared with each other. Furthermore, a load simulation was carried out with respect to the pad portion of each semiconductor device, and the effects of the dummy wiring structures were compared with each other. This will be described hereinafter in detail.

FIG. 21A shows the structure of an effective wiring layer 132 in the vicinity of a pad portion 133 among effective wiring layers 132 provided over a multiplicity of layers in a semiconductor device 131 of the present embodiment. In the semiconductor device 131, a plurality of interlayer insulating films including the low relative dielectric constant film 4 or a TEOS film 134 are stacked in a plurality of layers on the Si substrate 1. Moreover, an SiN film 135 is provided on the surface of the TEOS film 134 of the top layer. A pad 136 is formed of Al, and provided in the TEOS film 134 of the top layer. The Al pad 136 is electrically connected to a Cu wiring layer 140 of the lower layer via a plurality of Al conductive via plugs 137 formed integrally with the pad. The Al pad 136 and a plurality of Al conductive via plugs 137 comprise a pad portion effective wiring layer 138 which is the effective wiring layer 132. Above the Al pad 136, a pad opening 139 is formed extending through the TEOS film 134 and SiN film 135 of the top layer.

Two layers of Cu conductive layers 141 comprising the Cu wiring layer 140 are stacked and provided under the pad portion effective wiring layer 138. These Cu conductive layers 141 are provided in the low relative dielectric constant films 4, and electrically connected to each other by a Cu conductive via plug 142. Among the respective Cu conductive layers 141, the Cu conductive layer 141 of the upper layer is formed to have a wiring length of about 100 μm and a wiring width of about 0.1 μm. It is to be noted that different from the first to fourth, sixth, and seventh embodiments, the SiCN film 3 and SiO$_2$ film 143 are stacked and provided between the low relative dielectric constant films 4 of the present embodiment, and between the low relative dielectric constant film 4 and the TEOS film 134 in which Al conductive via plugs 137 are provided. An SiN film 144 is provided between the TEOS film 134 in which the Al pad 136 is provided and the TEOS film 134 in which the Al conductive via plugs 137 are provided.

Moreover, FIG. 21B is a plan view of the vicinity of each Cu conductive layer 141 shown in FIG. 21A as seen from above the Cu conductive layer 141 of the upper layer. In FIG. 21B, an area surrounded with two inner and outer one-dot chain lines is a dummy wiring forming area (reinforcing wiring area) 145 in the present embodiment. In the present embodiment, an interval shown by F in FIG. 221B between each Cu conductive layer 141 and the inside of the dummy wiring forming area 145 is set to about 0.2 μm. It is to be noted that in FIGS. 21A and 21B, for the ease of seeing the drawing, the barrier metal film provided around each Cu conductive layer 141 and Cu conductive via plug 142 is omitted from the drawing.

Next, experiments carried out by the present inventors will be described. The present inventors actually prepared three types of semiconductor devices in which each of dummy wirings 146 including different shapes and arrangement patterns was provided in the dummy wiring forming area 145 in the low relative dielectric constant films 4 of two layers including the Cu conductive layer 141. In one of the semiconductor devices, as shown in FIG. 22A, a dummy wiring 146a in which a plurality of Cu reinforcing metal layers 147 having long shapes, extended long, and provided along directions crossing at right angles to each other in the upper and lower layers are connected to each other by a Cu reinforcing via plug (reinforcing plug) 148 is provided in the dummy wiring forming area 145. This is assumed as a fourth example.

Moreover, in another semiconductor device, as shown in FIG. 22B, a plurality of Cu reinforcing metal layers 149 having long shapes extended long and arranged along the same direction in both the upper and lower layers are connected to each other by two Cu reinforcing via plugs 148 to comprise a dummy via chain 146b which is the dummy wiring, and this dummy wiring is provided in the dummy wiring forming area 145. Additionally, the length (unit wiring length) of each Cu reinforcing metal layer 149 is about 1 μm, and the layer is sufficiently shorter than each Cu reinforcing metal layer 147 of the fourth example. The provided state and mutually connected state of the Cu reinforcing metal layers 149 are similar to those of the dummy via chain 122 of the seventh embodiment shown in FIG. 19B. This is assumed as a fifth example.

Further in the remaining semiconductor device, as shown in FIG. 22C, a plurality of Cu reinforcing metal layers 150 formed as insular isolated wirings isolated in both the upper and lower layers are connected to each other by one Cu reinforcing via plug 148 to comprise a dummy wiring 146c, and this wiring is provided in the dummy wiring forming area 145. Cu reinforcing metal layers 150 are provided in positions substantially superposed upon one another along the stacking direction (vertical direction) of the interlayer insulating films 4. The length of each Cu reinforcing metal layer 150 is substantially the same in size as the diameter of the Cu reinforcing via plug 148, and the metal layer is further shorter than each Cu reinforcing metal layer 149 of the fifth example. This is assumed as a sixth example.

A difference between each dummy wiring 146c of the sixth example and each dummy via chain 146b of the fifth example is clear from FIGS. 22B and 22C. In each dummy via chain 146b of the fifth example, as shown in FIG. 22B, at least three Cu reinforcing metal layers 149 provided adjacent to one another along the longitudinal direction in the upper and lower layers are connected to one another by each Cu reinforcing via plug 148. That is, among the Cu reinforcing metal layers 149 of the upper and lower layers, the Cu reinforcing metal layers 149 provided along the longitudinal direction of the dummy via chain 146b are connected to other Cu reinforcing metal layers 149 which are adjacent to the Cu reinforcing metal layers 149 in the upper or lower layers, via the Cu reinforcing via plug 148. On the other hand, in the dummy wirings 146c of the sixth example, as shown in FIG. 22C, among the Cu reinforcing metal layers 150 of the upper and lower layers, only the Cu reinforcing metal layers 150 superposed upon each other in the stacking direction of the interlayer insulating films 4 are connected to each other via the Cu reinforcing via plug 148. That is, the Cu reinforcing metal layers 150 of the upper layer are not connected to each other. Similarly, the Cu reinforcing metal layers 150 of the lower layer are not connected to each other.

It is to be noted that as a comparative example with respect to the fourth to sixth examples, the present inventors also prepared a semiconductor device in which any dummy wiring was not provided in the dummy wiring forming area 145. This is assumed as a seventh example. The present inventors subjected the semiconductor devices of the fourth to seventh examples to a heat treatment test (sinter) in a forming gas at about 370° C. for about one hour. Moreover, an optical microscope and scanning electron microscope (not shown) were used to observe the semiconductor devices (samples) of the fourth to seventh examples after the test. As a result, the following facts were observed.

For the samples of the fourth and seventh examples, the cracks were observed in the barrier metal film provided in the side wall portion of the Cu conductive via plug 142 integrally formed with the Cu conductive layer 141 of the upper layer having a length of about 100 μm. Similarly, the cracks were observed in the low relative dielectric constant film 4 around the side wall portion of the Cu conductive via plug 142. On the other hand, in the respective samples of the fifth and sixth examples, the cracks were not observed in the barrier metal film and the low relative dielectric constant film 4. As described in the seventh embodiment with reference to FIG. 20, this is supposedly because the effect of suppressing the heat stress generated in the side wall portion of the Cu conductive via plug 142 increases, when the length (unit wiring length) of each Cu reinforcing metal layer 149, 150 comprising the dummy wiring 146b, 146c is about 2 μm or less.

Moreover, the present inventors also carried out a bonding adhesion test of the pad portion 133 with respect to the semiconductor devices of the fourth to seventh examples. Concretely, first an about 50 g load was applied to a wire of aluminum (Al wire) (not shown), and the wire was bonded to the Al pad 136. Thereafter, a tensile load was applied to the Al wire to test an adhesion force. As a result, the following facts were revealed.

In the samples of the fourth and fifth examples, it was possible to obtain a satisfactory adhesion force. On the other hand, the samples of the sixth and seventh examples were defective products. After the test, the optical microscope and scanning electron microscope were used to observe the samples of the sixth and seventh examples. Then, in the samples of the sixth and seventh examples, the TEOS film 134 right under the Al pad 136 was cracked. Moreover, when the tensile load was applied to the Al wire, the Al pad 136 was found to peel from the TEOS film 134 together with the Al wire.

Table 5 shows the results of the above-described test. In Table 5, ○ means that any defect described above is not generated in the sample, and X means that the defect is generated in the sample.

TABLE 5

|  | Sinter test | Bonding test |
|---|---|---|
| Fourth example | X | ○ |
| Fifth example | ○ | ○ |
| Sixth example | ○ | X |
| Seventh example | X | X |

It is seen from Table 5 that the dummy wiring structure of the fifth example including the dummy via chain 146b shown in FIG. 22B has strong resistance even to insulating film destruction caused by the heat stress or by the external stress.

Next, the simulation carried out by the present inventors will be described with reference to FIG. 23. The present inventors simulated the stress concentration generated in the TEOS film 134 right under the Al pad 136 at the time of the application of the about 50 g load to the Al pad 136 with respect to the semiconductor devices (samples) of the fourth to seventh examples. According to the simulation, it was possible to obtain the results shown in each bar graph of FIG. 23.

Concretely, in the samples of the fourth and fifth examples, the size of the stress generated in the TEOS film 134 right under the Al pad 136 was about 700 MPa. This can be considered to be caused for the following reason. In the dummy wiring structures of the fourth and fifth examples, as apparent from FIGS. 22A and 22B, the Cu reinforcing metal layers 147 or 149 of the upper and lower layers are connected to each other by the Cu reinforcing via plug 148, and the dummy wirings 146a, 146b form a long-distance network. Accordingly, the load applied to the effective wiring layer 132 in the vicinity of the pad portion 133 from the outside can be diffused in a broad range and received by the dummy wirings 146a, 146b. As a result, it can be considered that the large stress concentration is not easily caused in the TEOS film 134 right under the Al pad 136.

On the other hand, in the sample of the sixth example, the size of the stress generated in the TEOS film 134 right under the Al pad 136 was about 1500 MPa. That is, in the sample of the sixth example, the stress having a size about twice that of each sample of the fourth or fifth example was concentrated on the TEOS film 134 right under the Al pad 136. This can be considered to be caused for the following reason. In the dummy wiring structure of the sixth example, as apparent from FIG. 22C, among the Cu reinforcing metal layers 150 of the upper and lower layers, only the Cu reinforcing metal layers 150 superposed upon each other in the vertical direction are connected to each other by the Cu reinforcing via plug 148 in one-to-one correspondence. Moreover, the Cu reinforcing metal layers 150 of the upper layer or the lower layer are not connected to each other in each layer. That is, in the dummy wiring structure of the sixth example, the dummy wirings 146c are individually segmented. Accordingly, the dummy wiring structure of the sixth example has a small stress alleviation capability as compared with the dummy wiring structures of the fourth and fifth examples. As a result, it can be considered that the large stress concentration easily occurs in the TEOS film 134 right under the Al pad 136.

Moreover, in the sample of the seventh example, the size of the stress generated in the TEOS film 134 right under the Al pad 136 was about 1700 MPa, and was largest in the samples of the fourth to seventh examples. This can be considered to be caused for the following reason. Since the dummy wiring is not provided in the sample of the seventh example, there is hardly a capability of alleviating the stresses in the Al pad 136 and the TEOS film 134 right under the pad. As a result, it is considered that almost all of the load applied to the Al pad 136 is transmitted to the TEOS film 134 right under the Al pad 136.

As described above, according to the eighth embodiment, the effect similar to that of the first to seventh embodiments can be obtained. Moreover, the dummy wiring 146 is comprised as the dummy via chain 146b, and is provided in the vicinity of the pad portion 133. This can substantially eliminate a possibility that the defect is generated in the pad portion 133. Additionally, the yield of the semiconductor device is enhanced, and it is possible to obtain the semiconductor device which is high in the quality, capability, reliability, and productivity.

(Ninth Embodiment)

Next, a ninth embodiment of the present invention will be described with reference to FIGS. 24A to 27C. FIGS. 24A to 27C are plan views showing the arrangement pattern and shape of the dummy via chain according to the present embodiment. It is to be noted that the same components as those of the first embodiment are denoted with the same reference numerals, and the detailed description will be omitted.

In the present embodiment, various arrangement patterns of the dummy via chain in the plan view will be described. The effect similar to that of each dummy via chain 122 or 146b described in the seventh and eighth embodiments can be obtained.

First, each dummy via chain 161 shown in FIGS. 24A to 24C will be described. In FIGS. 24A to 24C, the dummy via chain 161a, 161b, 161c are shown, which are comprised of a plurality of Cu reinforcing metal layers 162 having long shapes and Cu reinforcing via plugs (reinforcing plugs) 163, in the same manner as in the dummy via chains 122, 146b of the seventh and eighth embodiments.

A dummy via chain 161a shown in FIG. 24A is comprised and provided in the same manner as the dummy via chain 146b of the eighth embodiment shown in FIG. 22B. Concretely, a plurality of dummy via chains 161a are provided in parallel with one another along a direction vertical to the stacking direction of the interlayer insulating films (not shown). A plurality of Cu reinforcing metal layers 162 of the upper and lower layers comprising the dummy via chains 161a are all extended long and formed in the same direction. Concretely, each Cu reinforcing metal layer 162 is extended long and formed along the longitudinal direction of each dummy via chain 161a. Moreover, the Cu reinforcing metal layers 162 are arranged in one row so that the longitudinal direction extends along the longitudinal direction of the dummy via chain 161a.

Moreover, each Cu reinforcing metal layer 162 of the lower layer shown by a broken line in FIG. 24A is provided to deviate from each Cu reinforcing metal layer 162 of the upper layer along the longitudinal direction of a dummy via chain 161b so that the layer is superposed upon the ends of each Cu reinforcing metal layer 162 of the upper layer shown by a solid line in FIG. 24A. Furthermore, between the dummy via chains 161a provided adjacent to each other, the Cu reinforcing metal layers 162 of the upper layer deviate from one another along the longitudinal direction of each dummy via chain 161a. In this case, the Cu reinforcing metal layers 162 of the upper layer are provided so that the ends are substantially linearly positioned along the direction crossing at right angles to the longitudinal direction of each dummy via chain 161a. Similarly, between the dummy via chains 161a provided adjacent to each other, the Cu reinforcing metal layers 162 of the lower layer deviate from one another along the longitudinal direction of each dummy via chain 161a. In this case, the Cu reinforcing metal layers 162 of the lower layer are provided so that the ends are substantially linearly positioned along the direction crossing at right angles to the longitudinal direction of each dummy via chain 161a.

Moreover, in the dummy via chain 161b shown in FIG. 24B, the Cu reinforcing metal layers 162 of the upper layer are arranged in two rows along the longitudinal direction. The Cu reinforcing metal layers 162 are provided so that the longitudinal direction extends along the longitudinal direction of the dummy via chain 161b. The Cu reinforcing metal layers 162 of the upper layer provided adjacent to each other along the direction crossing at right angles to the longitudinal direction of the dummy via chain 161b are provided to deviate from each other along the longitudinal direction of the dummy via chain 161b. In this case, the Cu reinforcing metal layers 162 of the upper layer are provided so that the ends are substantially linearly positioned along the direction crossing at right angles to the longitudinal direction of each dummy via chain 161b. Moreover, a plurality of Cu reinforcing metal layers 162 of the lower layer are provided along the longitudinal direction of the dummy via chain 161b so that the layers are superposed upon the ends of each Cu reinforcing metal layer 162 of the upper layer provided in this manner. The Cu reinforcing metal layers 162 of the lower layer are provided so that the longitudinal direction extends along the direction crossing at right angles to the longitudinal direction of the dummy via chain 161b.

Furthermore, in a dummy via chain 161c shown in FIG. 24C, the Cu reinforcing metal layers 162 of the upper layer are arranged in a plurality of rows along the direction crossing at right angles to the longitudinal direction. Additionally, for the Cu reinforcing metal layers 162 of the upper layer, the Cu reinforcing metal layers 162 provided adjacent to each other along the direction crossing at right angles to the longitudinal direction are provided to deviate from each other along the longitudinal direction of each Cu reinforcing metal layer 162. In this case, the Cu reinforcing metal layers 162 of the upper layer are provided so that the ends are substantially linearly positioned along the direction crossing at right angles to the longitudinal direction of each Cu reinforcing metal layer 162. Moreover, a plurality of Cu reinforcing metal layers 162 are provided in the lower layer so that the layers are superposed upon the ends of each Cu reinforcing metal layer 162 of the upper layer provided in this manner. A plurality of Cu reinforcing metal layer 162 is provided in the lower layer. The respective Cu reinforcing metal layers 162 of the lower layer are arranged so that the longitudinal directions extend along the direction crossing at right angles to the longitudinal direction of each Cu reinforcing metal layer 162 of the upper layer. Moreover, when the Cu reinforcing metal layer 162 of the lower layer is connected to that of the upper layer via each Cu reinforcing via plug 163, the dummy via chain 161c extends along the longitudinal directions of the Cu reinforcing metal layers 162 of the upper and lower layers. Accordingly, the dummy via chains 161c are provided so as to two-dimensionally spread in the direction crossing at right angles to the stacking direction of the interlayer insulating films along the surface of the interlayer insulating film.

Next, each dummy via chain 161 shown in FIGS. 25A and 25B will be described. FIGS. 25A and 25B show the dummy via chain 161 comprised using a plurality of L-shaped Cu reinforcing metal layers 164 and Cu reinforcing via plugs 163.

In a dummy via chain 161d shown in FIG. 25A, a plurality of L-shaped Cu reinforcing metal layers 164 are arranged in one row along the longitudinal direction in the upper layer. The Cu reinforcing metal layers 164 of the upper layer are all provided in the same posture. In more detail, the Cu reinforcing metal layers 164 of the upper layer are arranged so that one side extends along the longitudinal direction of the dummy via chain 161d and the other side extends along the direction crossing at right angles to the longitudinal direction of the dummy via chain 161d. Moreover, a plurality of Cu reinforcing metal layers 164 are arranged in the lower layer so as to deviate from the Cu reinforcing metal layers 164 of the upper layer provided in this manner along the longitudinal direction of the dummy via chain 161d. In this case, the Cu reinforcing metal layers 164 of the lower layer are provided so that the ends are superposed upon the ends of each Cu reinforcing metal layer 164 of the upper layer. Moreover, for the directions, the Cu reinforcing metal layers 164 of the lower layer are reversed with respect to those of the upper layer.

Moreover, a dummy via chain 161e shown in FIG. 25B includes a structure comprised using the L-shaped Cu reinforcing metal layers 164 in the dummy via chain 161c shown in FIG. 24C instead of the Cu reinforcing metal layers 162 having long shapes. Additionally, in the dummy via chain 161e, different from the dummy via chain 161d shown in FIG. 25A, the Cu reinforcing metal layers 164 of the upper and lower layers are all directed/provided in the same direction. In the same manner as the dummy via chain 161c shown in FIG. 24C, the dummy via chain 161e is also provided so as to two-dimensionally spread in the direction crossing at right angles to the stacking direction of the interlayer insulating films along the surfaces of the interlayer insulating films.

Next, dummy via chains 161 shown in FIGS. 26A and 26B will be described. FIGS. 26A and 26B show the dummy via chain 161 comprised using a plurality of Cu reinforcing metal layers 162 having long shapes, Cu reinforcing metal layers 165 having quadrangular frame shapes, and Cu reinforcing via plugs 163.

In a dummy via chain 161f shown in FIG. 26A, a plurality of Cu reinforcing metal layers 165 having the quadrangular frame shapes are arranged along the longitudinal direction of the chain in one row in the upper layer. These Cu reinforcing metal layers 165 of the upper layer are all arranged in the same posture. In more detail, the Cu reinforcing metal layers 165 of the upper layer are arranged so that two opposite sides of each layer extend along the longitudinal direction of the dummy via chain 161f and two remaining sides extend in the direction crossing at right angles to the longitudinal direction of the dummy via chain 161f. Moreover, with respect to the Cu reinforcing metal layers 165 of the upper layer arranged in this manner, a plurality of Cu reinforcing metal layers 162 having long shapes are arranged deviating along the longitudinal direction of the dummy via chain 161d. In this case, the Cu reinforcing metal layers 162 of the lower layer are arranged so that the ends are superposed upon the ends of each Cu reinforcing metal layer 165 of the upper layer. The Cu reinforcing metal layers 162 of the lower layer are arranged in two rows with substantially the same width as that of the Cu reinforcing metal layer 165 of the upper layer so that the longitudinal direction extends along that of the dummy via chain 161f.

Moreover, in a dummy via chain 161g shown in FIG. 26B, a plurality of Cu reinforcing metal layers 165 are arranged along a predetermined direction in a plurality of rows in the upper layer. These Cu reinforcing metal layers 165 of the upper layer are all arranged in the same posture. In more detail, the Cu reinforcing metal layers 165 of the upper layer are arranged so that two opposite sides of each layer extend along one direction and two remaining sides extend along the other direction. Moreover, between the adjacent rows of the Cu reinforcing metal layers 165, the Cu reinforcing metal layers 165 of the upper layer are arranged so as to deviate from each other along the longitudinal direction of each row. In this case, the Cu reinforcing metal layers 165 of the upper layer are arranged so that corners of the layers are substantially linearly positioned along the direction crossing at right angles to the longitudinal direction of each row. Moreover, with respect to the Cu reinforcing metal layers 165 of the upper layer arranged in this manner, a plurality of Cu reinforcing metal layers 162 having the long shapes are arranged in the lower layer. In this case, the Cu reinforcing metal layers 162 of the lower layer are arranged so that the ends of each layer are superposed upon the corners of each Cu reinforcing metal layer 165 of the upper layer. The Cu reinforcing metal layers 162 of the lower layer are also arranged in two rows with substantially the same width as that of the Cu reinforcing metal layer 165 of the upper layer so that the longitudinal direction extends along that of each row including a plurality of Cu reinforcing metal layers 165. Furthermore, each Cu reinforcing metal layer 162 of the lower layer is provided in a position in which the Cu reinforcing metal layers 165 provided adjacent to each other can be connected to each other via each Cu reinforcing via plug 163 in the direction crossing at right angles to the longitudinal direction of the row of the Cu reinforcing metal layers 165. In the same manner as the dummy via chains 161c and 161e shown in FIGS. 24C and 25B, respectively, the dummy via chain 161e is also provided so as to two-dimensionally spread in the direction crossing at right angles to the stacking direction of the interlayer insulating films along the surfaces of the interlayer insulating films.

Next, the dummy via chains 161 shown in FIGS. 27A and 27B will be described. FIGS. 27A and 27B show the dummy via chains 161 comprised using a plurality of Cu reinforcing metal layers 165 having quadrangular frame shapes and Cu reinforcing via plugs 163.

A dummy via chain 161h shown in FIG. 27A includes a structure comprised using the Cu reinforcing metal layers 165 having the quadrangular frame shapes in the dummy via chain 161f shown in FIG. 26A instead of the Cu reinforcing metal layers 162 of the lower layer having the long shapes.

Moreover, a dummy via chain 161i shown in FIG. 27B includes a structure comprised using the Cu reinforcing metal layers 165 having the quadrangular frame shapes in the dummy via chain 161g shown in FIG. 26B instead of the Cu reinforcing metal layers 162 of the lower layer having the long shapes.

As described above, according to the ninth embodiment, the effect similar to that of the first to eighth embodiments can be obtained. The dummy via chains 161d, 161e comprised using the L-shaped Cu reinforcing metal layers 164 can bear external forces added from more various directions as compared with the dummy via chains 161a, 161b, 161c comprised only of the Cu reinforcing metal layers 162 having the long shapes. Similarly, the dummy via chains 161f, 161g comprised using the Cu reinforcing metal layers 165 having the quadrangular frame shapes can bear the external forces added from more various directions in at least the upper layer as compared with the dummy via chains 161d, 161e comprised only of the L-shaped Cu reinforcing metal layers 164. Furthermore, the dummy via chains 161h, 161i comprised only of the Cu reinforcing metal layers 165 having the quadrangular frame shapes can bear the external forces added from more various directions in both the upper and lower layers as compared with the dummy via chains 161f, 161g comprised by combinations of the Cu reinforcing metal layers 165 with the Cu reinforcing metal layers 162 having the long shapes.

It is to be noted that in the dummy via chains 161f, 161g, 161h, 161i shown in FIGS. 26A, 26B, 27A, and 27B, instead of the Cu reinforcing metal layer 165 having the quadrangular frame shape, a Cu reinforcing metal layer 166 having a quadrangular shape may also be used. When the Cu reinforcing metal layer 166 having the quadrangular shape is used instead of the Cu reinforcing metal layer 165 having the quadrangular frame shape, it is possible to prepare a dummy via chain capable of bearing the external forces applied from further more various directions as compared with the dummy via chains 161*f*, 161*g*, 161*h*, 161*i* comprised of the Cu reinforcing metal layers 165.

Furthermore, the dummy via chains 161*a* to 161*i* shown in FIGS. 24A, 24B, 24C, 25A, 25B, 26A, 26B, 27A, and 27B may wholly be displaced, inclined, or rotated in various directions along the surfaces of the interlayer insulating films as long as the structure of the single unit is the same. For example, the dummy via chains 161*a* to 161*i* may also be rotated by about 90° with respect to the directions shown in FIGS. 24A, 24B, 24C, 25A, 25B, 26A, 26B, 27A, and 27B. Even in this arrangement, the effect similar to that of the dummy via chains 161*a* to 161*i* can be obtained.

(Tenth Embodiment)

Next, a tenth embodiment according to the present invention will be described with reference to FIGS. 28A to 40. FIGS. 28A, 28B, 29A, 29B, 30, 31, 32A, 32B, 33, 34, 35, 36, 37, 38, 39, and 40 are sectional views showing the structures of the dummy via chains of the semiconductor devices according to the present embodiment. It is to be noted that the same components as those of the first embodiment are denoted with the same reference numerals, and the detailed description will be omitted.

In the present embodiment, various structure and arrangement patterns, in the sectional view, of the dummy via chains capable of obtaining the effects similar to those of the dummy via chains 122, 146*b*, 161 described in the seventh to ninth embodiments will be described.

First, dummy via chains 171 shown in FIGS. 28A, 28B, 29A, and 29B will be described. FIGS. 28A, 28B, 29A, and 29B show dummy via chains 171*a*, 171*b*, 171*c*, 171*d* each comprised of two reinforcing metal layers 172 and at least one via plug 173.

Figure 28A:
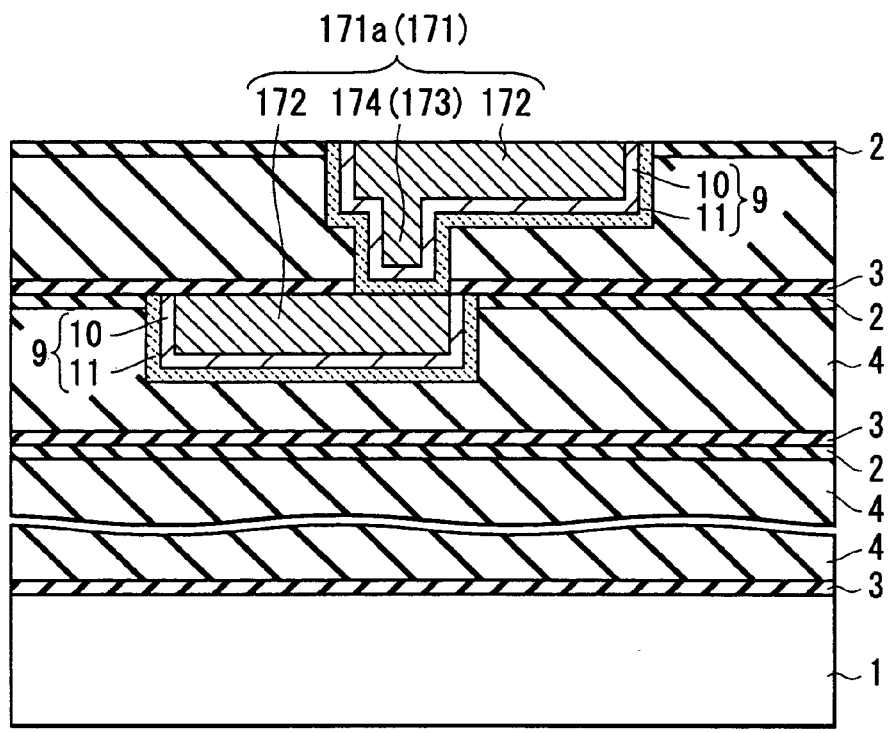
FIG. 28A is a sectional view showing a structure of the dummy via chain of the semiconductor device according to a tenth embodiment.

In the dummy via chain 171*a* shown in FIG. 28A, one reinforcing metal layer 172 is each provided in the interlayer insulating film (low relative dielectric constant film) 4 of two layers provided adjacent to each other. The reinforcing metal layer 172 of the upper layer is connected to that of the lower layer via one via plug 173 provided integrally with the metal layer. The reinforcing metal layers 172 of the upper and lower layers are formed so as to extend in opposite directions substantially centering on the via plug 173. The dummy via chain 171*a* substantially comprises a minimum unit in the dummy via chains capable of including various constitutions. It is to be noted that in the dummy via chain 171*a*, the via plug 173 is connected to the reinforcing metal layer 172 and the SiCN film 3 which is the reinforcing material (film). Accordingly, the via plug 173 of the dummy via chain 171*a* is the reinforcing plug 174 similar to the Cu reinforcing via plug 53, 94, 114, 125, 148, 163 of the second and fourth to ninth embodiments described above.

Figure 28B:
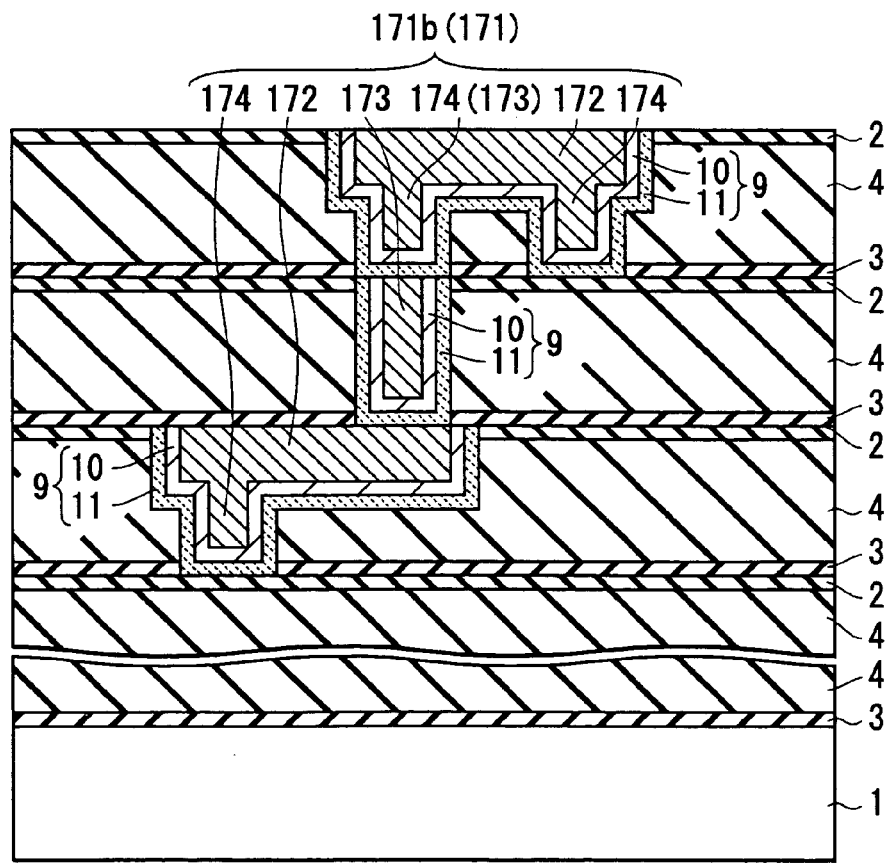
FIG. 28B is a sectional view showing another structure of the dummy via chain of the semiconductor device according to the tenth embodiment.

Moreover, in the dummy via chain 171*b* shown in FIG. 28B, one reinforcing metal layer 172 is each provided in the low relative dielectric constant films 4 of the upper and lower layers among three continuous the low relative dielectric constant films 4. Two reinforcing plugs 174 are provided integrally in the reinforcing metal layer 172 of the upper layer. One reinforcing plug 174 is provided integrally in the reinforcing metal layer 172 of the lower layer. The reinforcing metal layer 172 of the lower layer is connected to that of the lower layer via the via plug 173 provided in the low relative dielectric constant film 4 of the intermediate layer, and one reinforcing plug 174 provided in the reinforcing metal layer 172 of the upper layer. In the same manner as in the dummy via chain 171*a*, in the dummy via chain 171*b*, the reinforcing metal layers 172 of the upper and lower layers are formed so as to extend in the opposite directions substantially centering on the via plug 173.

As in the dummy via chain 171*b*, the reinforcing metal layers 172 of the upper and lower layers do not have to be necessarily provided in the low relative dielectric constant films 4 of two layers provided adjacent to each other. One or more layers of the low relative dielectric constant films 4 in which any reinforcing metal layer 172 is provided may be provided between the reinforcing metal layers 172 of the upper and lower layers. It is also assumed that there is the low relative dielectric constant film 4 in which any effective wiring is not provided in a plurality of layers of the low relative dielectric constant films 4 including the dummy via chains 171. In this case, the reinforcing metal layer 172 does not have to be provided in the low relative dielectric constant film 4 in which any effective wiring is not provided. The reinforcing metal layer 172 may be provided only in at least the low relative dielectric constant film 4 in which the effective wiring is provided. This also applies to a case in which three or more reinforcing metal layers 172 are provided in a plurality of layers of the low relative dielectric constant films 4.

That is, the number of reinforcing metal layers 172 provided in the dummy via chain 171 does not have to necessarily agree with the number of layers of interlayer insulating films 4 in which the dummy via chain 171 is provided. The number of reinforcing metal layers 172 provided in the dummy via chain 171 may be smaller than that of layers of interlayer insulating films 4 in which the dummy via chain 171 is provided. Alternatively, the number of reinforcing metal layers 172 provided in the dummy via chain 171 may be larger than that of layers of interlayer insulating films 4 in which the dummy via chain 171 is provided. It is assumed that a plurality of reinforcing metal layers 172 are provided in a plurality of layers of interlayer insulating films 4 which are not continuous along the stacking direction of the interlayer insulating films 4. In this case, the via plug 173 is provided in the interlayer insulating film 4 in which the reinforcing metal layer 172 is not provided, so that the reinforcing metal layer 172 may be connected to another reinforcing metal layer along the stacking direction of the interlayer insulating films 4.

Figure 29A:
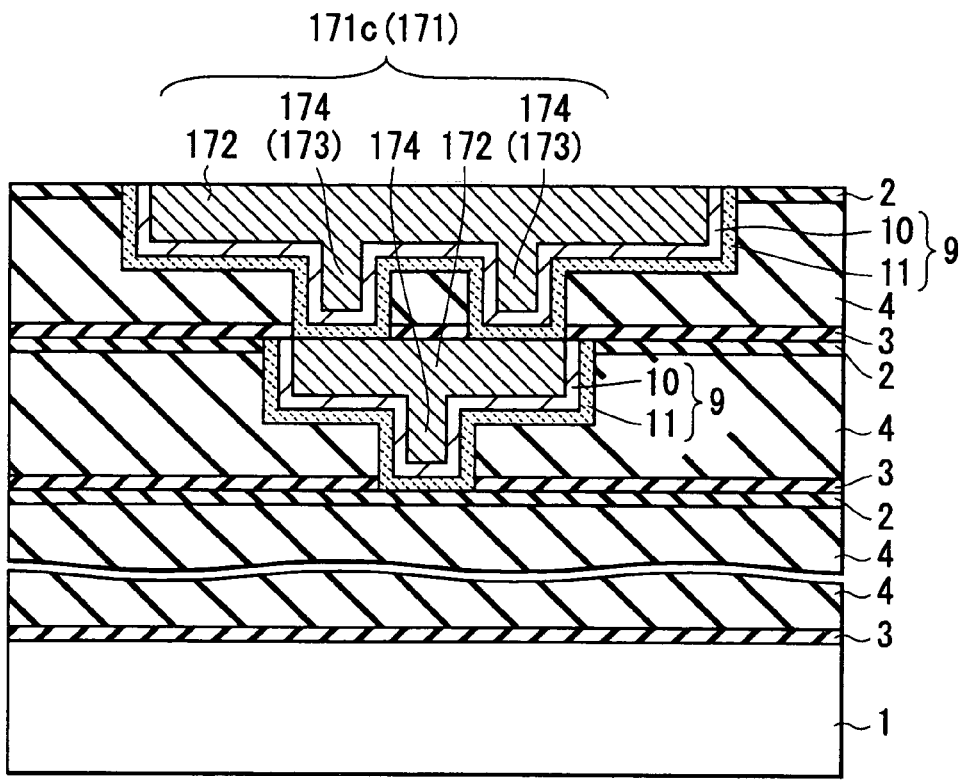
FIG. 29A is a sectional view showing still another structure of the dummy via chain of the semiconductor device according to the tenth embodiment.

Moreover, in the dummy via chain 171*c* shown in FIG. 29A, different from the dummy via chains 171*a*, 171*b*, the reinforcing metal layers 172 of the upper and lower layers are arranged so that centers in the longitudinal directions substantially agree with each other. Additionally, the reinforcing metal layer 172 of the upper layer is formed to be longer than that of the lower layer. That is, the reinforcing metal layer 172 of the upper layer and the reinforcing metal layer 172 of the lower layer are provided with substantially deviating from each other along a direction vertical to the stacking direction of the interlayer insulating film 4.

Figure 29B:
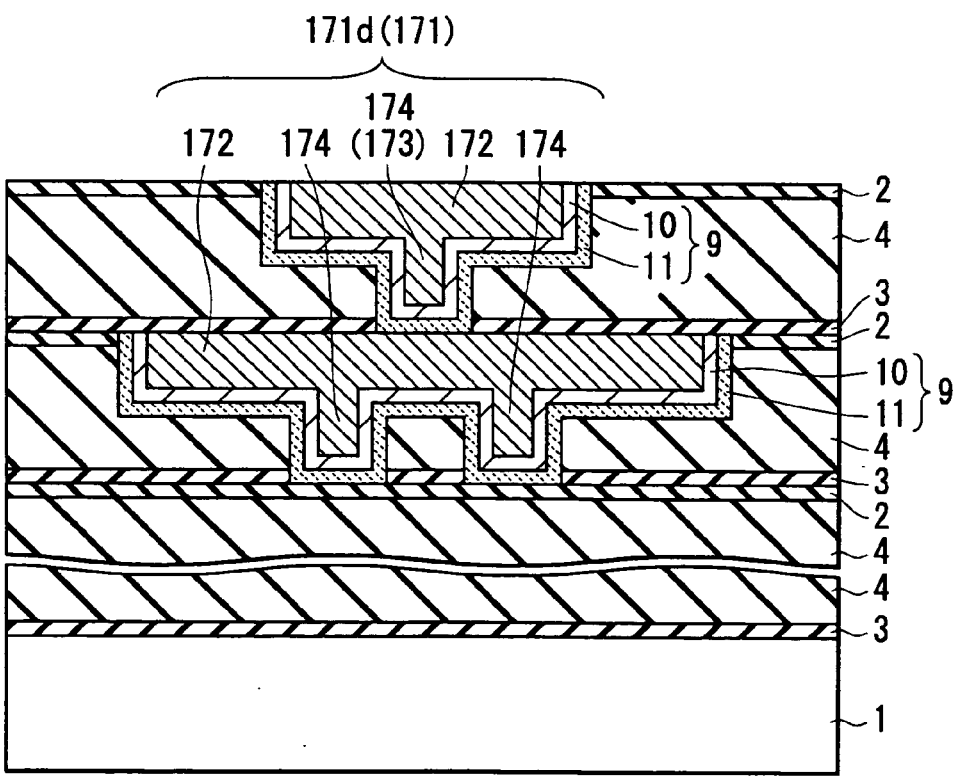
FIG. 29B is a sectional view showing still another structure of the dummy via chain of the semiconductor device according to the tenth embodiment.

Similarly, also in the dummy via chain 171*d* shown in FIG. 29B, different from the dummy via chains 171*a*, 171*b*, the reinforcing metal layers 172 of the upper and lower layers are arranged so that the centers in the longitudinal directions substantially agree with each other. Additionally, different from the dummy via chain 171*c* shown in FIG. 29A, the reinforcing metal layer 172 of the upper layer is formed to be shorter than that of the lower layer. However, in that constitution, the reinforcing metal layer 172 of the upper layer and the reinforcing metal layer 172 of the lower layer are provided with substantially deviating from each other along a direction vertical to the stacking direction of the interlayer insulating film 4, similar to the dummy via chain 171*c* described above.

As in the dummy via chains 171c, 171d, the reinforcing metal layers 172 of the upper and lower layers are arranged so that the centers of the longitudinal directions substantially agree with each other. Even in this case, the length of the reinforcing metal layer 172 of the upper layer is set to be different from that of the reinforcing metal layer 172 of the lower layer. Accordingly, in the same manner as in the dummy via chains 171a, 171b, a plurality of dummy via chains 171c or 171d may be connected to each other and extended in either the stacking direction of the interlayer insulating films 4 or the direction crossing at right angles to the stacking direction of the interlayer insulating films 4 using the via plugs 173.

Figure 30:
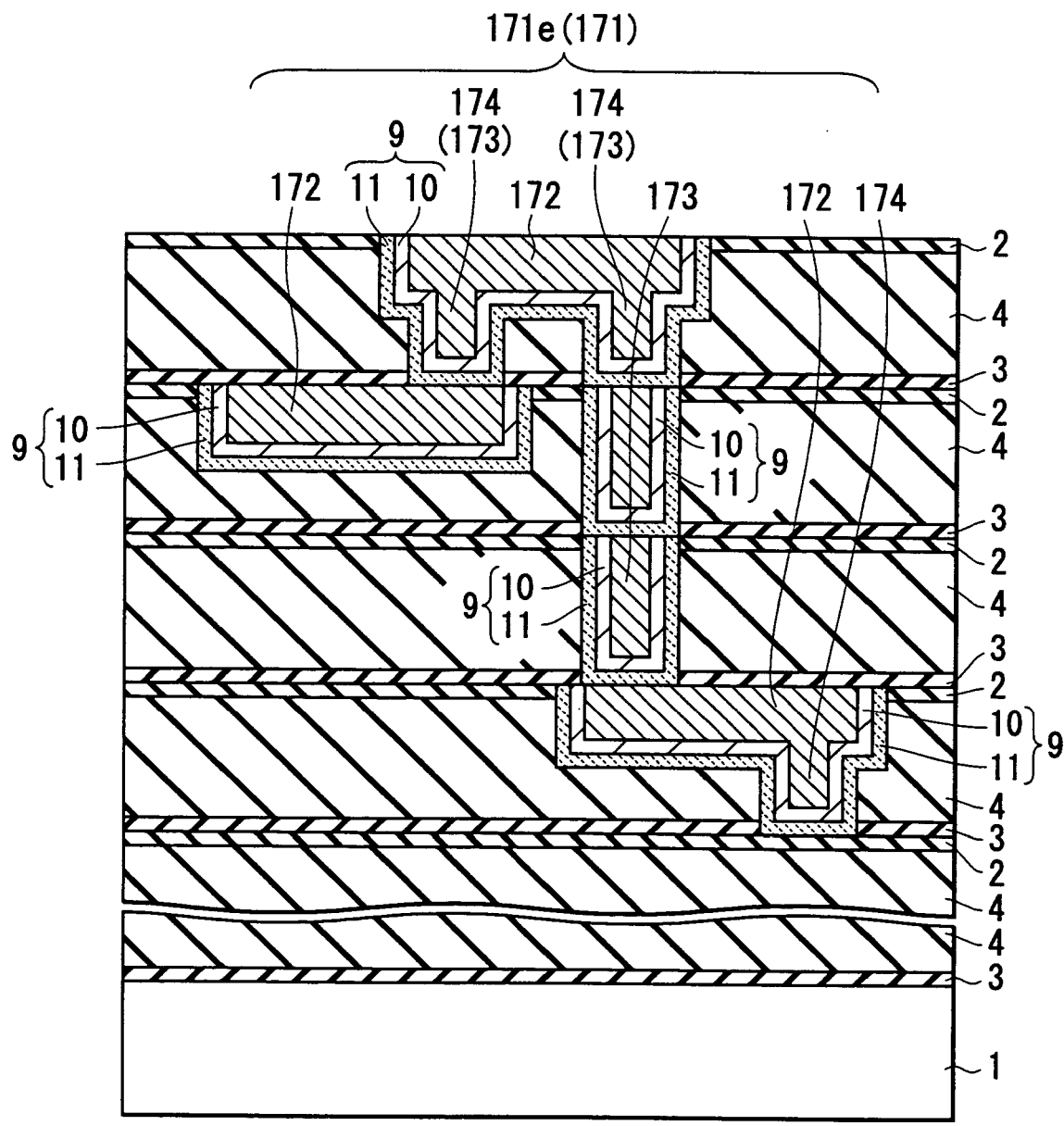
FIG. 30 is a sectional view showing still another structure of the dummy via chain of the semiconductor device according to the tenth embodiment.
Figure 31:
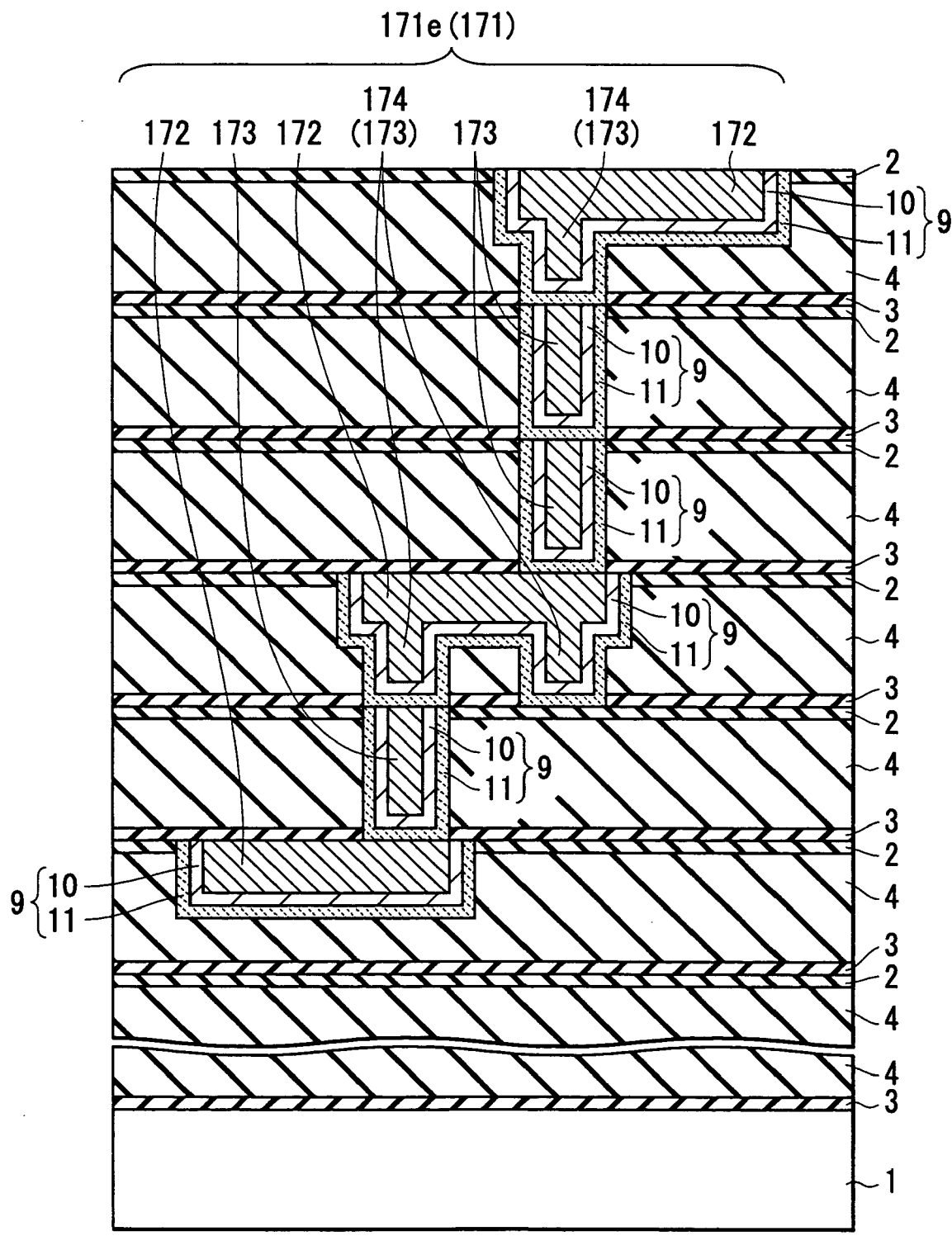
FIG. 31 is a sectional view showing still another structure of the dummy via chain of the semiconductor device according to the tenth embodiment.

Next, the dummy via chains 171 shown in FIGS. 30 and 31 will be described. FIGS. 30 and 31 show the dummy via chains 171e, 171f each comprised of three reinforcing metal layers 172 and at least two via plugs 173.

In the dummy via chain 171e shown in FIG. 30, one reinforcing metal layer 172 is provided in each of the low relative dielectric constant films 4 of a top layer, a second layer from the top, and a bottom layer among four continuous the low relative dielectric constant films 4. The reinforcing metal layer 172 of the top layer is connected to that of the second layer from the top via one reinforcing plug 174 (via plug 173). Moreover, the reinforcing metal layer 172 of the top layer is connected to that of the bottom layer via one reinforcing plug 174 and two via plugs 173. Different from the dummy via chain 122 of the seventh embodiment shown in FIGS. 19A and 19B, the reinforcing metal layer 172 provided in a middle portion in the direction crossing at right angles to the stacking direction of the low relative dielectric constant films 4 is provided in the layer above the layers of the reinforcing metal layers 172 provided in the opposite ends. Even in the dummy via chain 171e comprised in this manner, needless to say, the effect similar to that of the dummy via chain 122 of the seventh embodiment can be obtained.

Moreover, in the dummy via chain 171f shown in FIG. 31, one reinforcing metal layer 172 is provided in each of the low relative dielectric constant films 4 of the top layer, bottom layer, and third layer from the bottom among six continuous the low relative dielectric constant films 4. The reinforcing metal layer 172 of the top layer is connected to that of the third layer from the bottom via one reinforcing plug 174 and two via plugs 173. The reinforcing metal layer 172 of the third layer from the bottom is connected to that of the top layer via one reinforcing plug 174 and one via plug 173. Different from the dummy via chain 122 of the seventh embodiment and the dummy via chain 171e shown in FIG. 30, the dummy via chain 171f is formed extending so as to be inclined with respect to the stacking direction of the low relative dielectric constant films 4. That is, in the dummy via chain 171f, the reinforcing metal layers 172 are arranged and connected so as to extend simply in an oblique direction to the other end from one end. Even in the dummy via chain 171f comprised in this manner, needless to say, the effect similar to that of the dummy via chain 122 or 171e can be obtained.

Figure 32A:
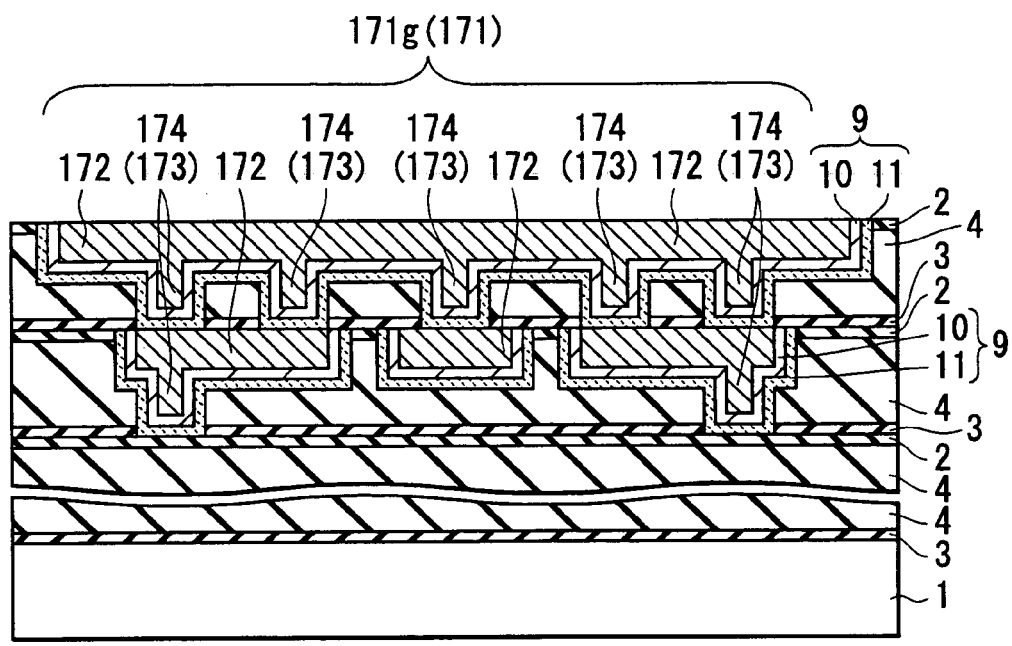
FIG. 32A is a sectional view showing still another structure of the dummy via chain of the semiconductor device according to the tenth embodiment.
Figure 32B:
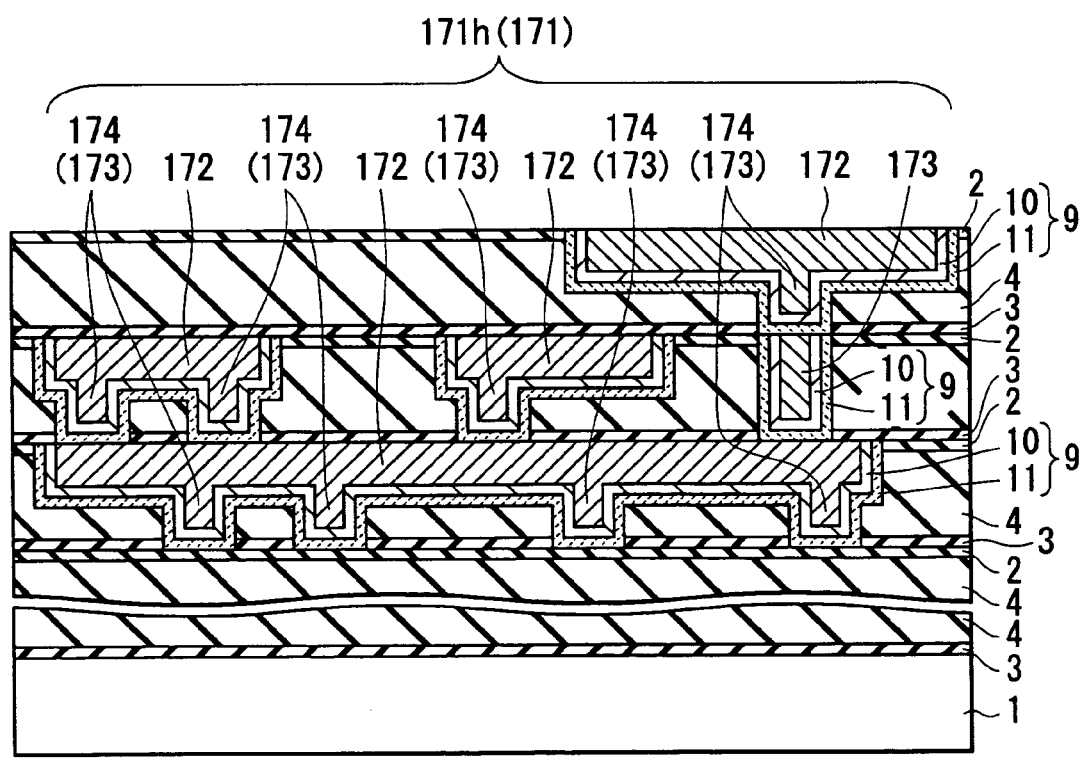
FIG. 32B is a sectional view showing still another structure of the dummy via chain of the semiconductor device according to the tenth embodiment.

Next, the dummy via chains 171 shown in FIGS. 32A and 32B will be described. FIGS. 32A and 32B show dummy via chains 171g, 171h each comprised of four reinforcing metal layers 172 and a plurality of reinforcing plugs 174.

In the dummy via chain 171g shown in FIG. 32A, four reinforcing metal layers 172 are provided in the low relative dielectric constant films 4 of two layers provided adjacent to each other. One reinforcing metal layer 172 is provided in the low relative dielectric constant film 4 of the upper layer. Moreover, three reinforcing metal layers 172 are provided in the low relative dielectric constant film 4 of the lower layer. The reinforcing metal layer 172 of the upper layer is connected to the reinforcing metal layers 172 of the lower layer via five reinforcing plugs 174. In the same manner as in the dummy via chain 171c shown in FIG. 29A, in the dummy via chain 171g, the length of the reinforcing metal layer 172 of the upper layer is formed to be larger than the total length of the reinforcing metal layers 172 of the lower layer. That is, the reinforcing metal layer 172 of the upper layer and the reinforcing metal layer 172 of the lower layer are provided with substantially deviating from each other along a direction vertical to the stacking direction of the interlayer insulating film 4. Accordingly, a plurality of dummy via chains 171g can be connected to each other and extended using the via plug 173 in either the stacking direction of the low relative dielectric constant films 4 or the direction crossing at right angles to the stacking direction of the low relative dielectric constant films 4.

Moreover, in the dummy via chain 171h shown in FIG. 32B, four reinforcing metal layers 172 are provided in the low relative dielectric constant films 4 of three layers provided adjacent to one another. One reinforcing metal layer 172 is provided in each of the low relative dielectric constant films 4 of the top and bottom layers. Moreover, two reinforcing metal layers 172 are provided in the low relative dielectric constant film 4 of the intermediate layer. The reinforcing metal layer 172 of the top layer is connected to that of the bottom layer via one reinforcing plug 174 and one via plug 173. The reinforcing metal layer 172 of the intermediate layer is connected to that of the bottom layer via one or two reinforcing plugs 174.

The dummy via chain 171h is formed such that the reinforcing metal layer 172 of the top layer projects outwards from above each reinforcing metal layer 172 of the bottom layer. That is, the reinforcing metal layer 172 of the most upper layer and the reinforcing metal layer 172 of the lower layer of the most upper layer are provided with substantially deviating from each other along a direction vertical to the stacking direction of the interlayer insulating film 4. Accordingly, a plurality of dummy via chains 171h can be connected to each other and extended using the via plug 173 in either the stacking direction of the low relative dielectric constant films 4 or the direction crossing at right angles to the stacking direction of the low relative dielectric constant films 4.

Figure 33:
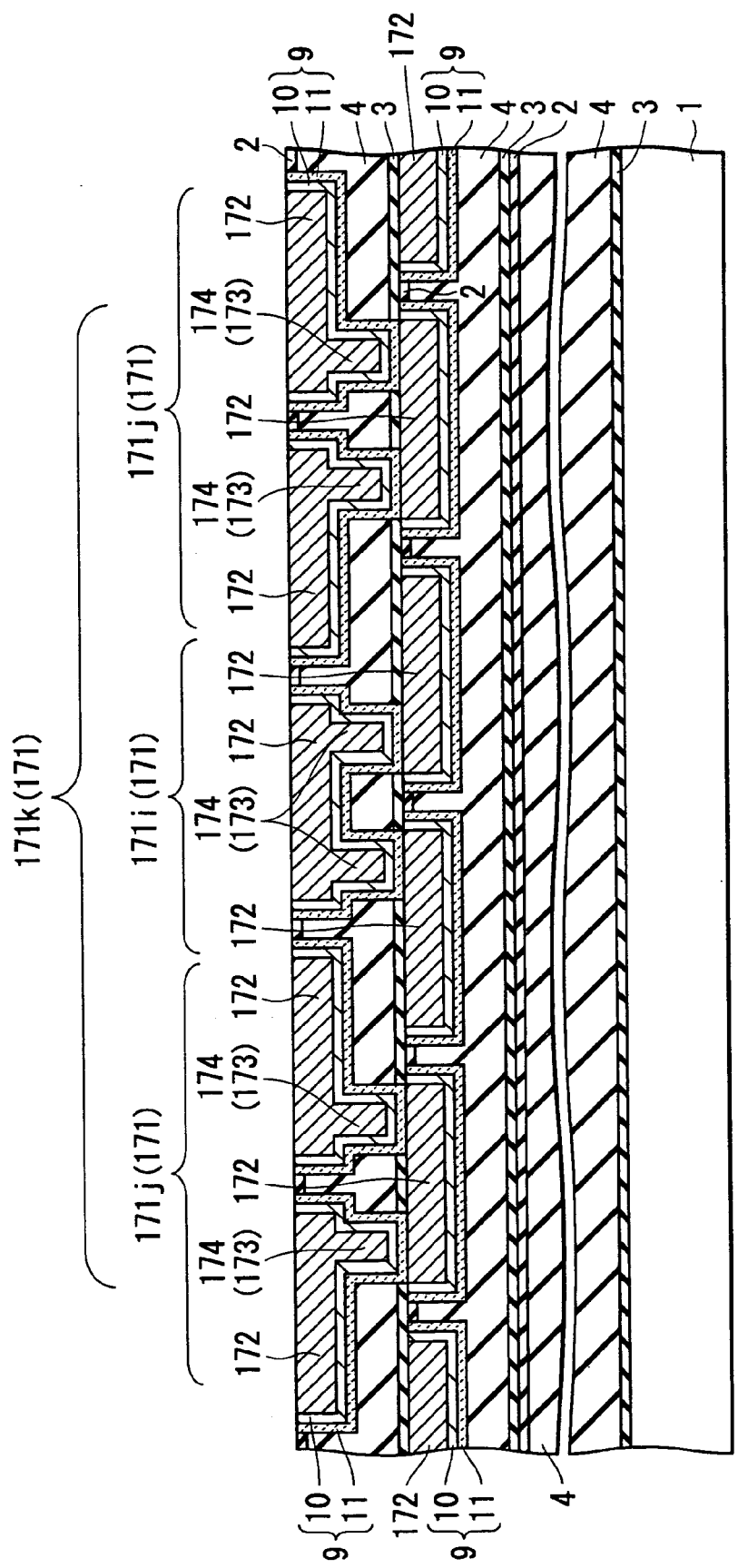
FIG. 33 is a sectional view showing still another structure of the dummy via chain of the semiconductor device according to the tenth embodiment.
Figure 34:
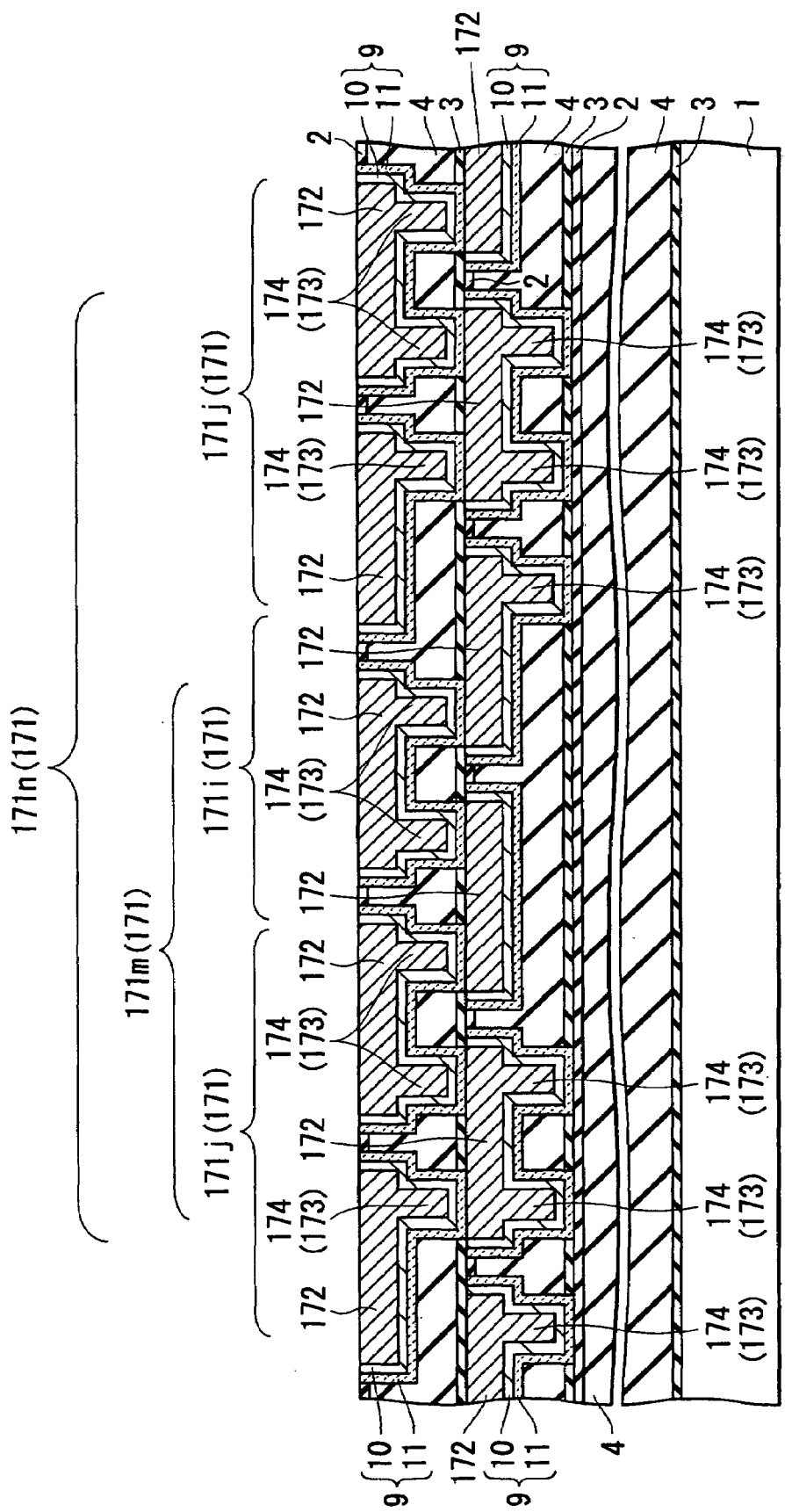
FIG. 34 is a sectional view showing still another structure of the dummy via chain of the semiconductor device according to the tenth embodiment.
Figure 35:
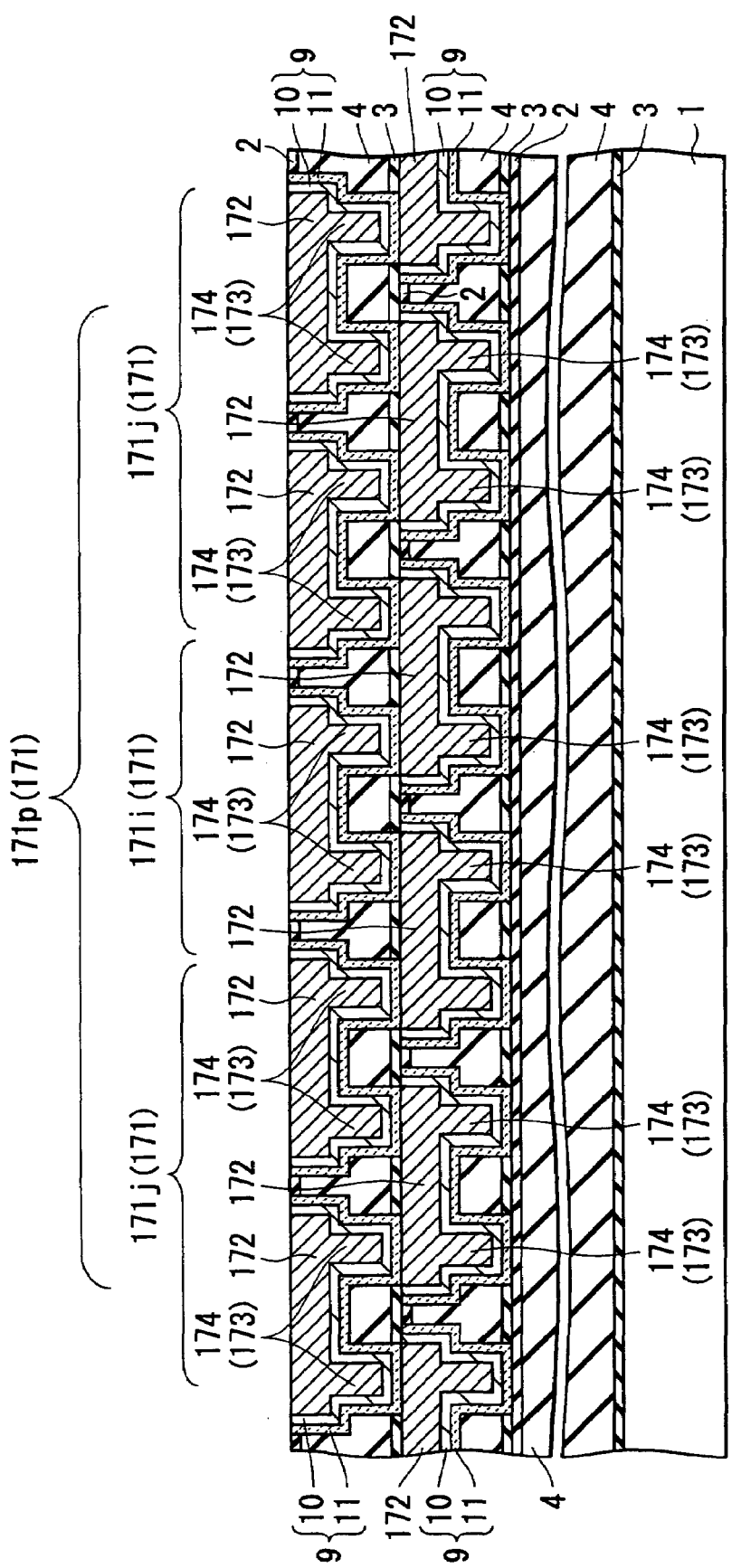
FIG. 35 is a sectional view showing still another structure of the dummy via chain of the semiconductor device according to the tenth embodiment.

Next, the dummy via chains 171 shown in FIGS. 33, 34, 35 will be described. FIGS. 33, 34, 35 show dummy via chains 171i, 171j, 171k, 171m, 171n, 171p provided so as to extend along the direction crossing at right angles to the stacking direction of the low relative dielectric constant films 4.

FIG. 33 shows a constitution in which two types of dummy via chains 171i, 171j are alternately arranged so as to extend along the direction crossing at right angles to the stacking direction of the low relative dielectric constant films 4. Each of the dummy via chains 171i, 171j includes a constitution in which three reinforcing metal layers 172 are provided in the low relative dielectric constant films 4 of two layers provided adjacent to each other. In the same manner as in the dummy via chain 171e shown in FIG. 30, in one dummy via chain 171i, the reinforcing metal layer 172 provided in the middle portion is provided in the layer above that in which the reinforcing metal layers 172 are provided in the opposite ends. In the same manner as in the dummy via chain 122 of the seventh embodiment shown in FIGS. 19A and 19B, in the other dummy via chain 171j, the reinforcing metal layers 172 provided in the opposite ends are provided in the layer below that in which the reinforcing metal layer 172 is provided in the middle portion.

The dummy via chains 171*i*, 171*j* comprised in this manner are alternately combined and arranged as shown in FIG. 33. In this case, the dummy via chains 171*i*, 171*j* provided adjacent to each other are arranged so that the ends of the chains are superposed upon each other along the stacking direction of the low relative dielectric constant films 4. This can obtain an effect close to that in a case in which the adjacent dummy via chains 171*i*, 171*j* are connected to each other substantially by a via plug (a reinforcing plug). That is, the dummy via chains 171*i*, 171*j* are assumed as one unit dummy via chain, and it can be assumed that a dummy via chain 171*k* comprised of a plurality of dummy via chains 171*i*, 171*j* is provided in the low relative dielectric constant films 4 of two adjacent layers.

Moreover, FIG. 34 shows a constitution in which the dummy via chains 171*i*, 171*j* provided adjacent to each other in the dummy via chain 171*k* shown in FIG. 33 are mutually connected by the reinforcing plug 174. That is, one dummy via chain 171*i* is connected to one dummy via chain 171*j* via one reinforcing plug 174 to comprise the dummy via chain 171*m* which is provided so as to extend along the direction crossing at right angles to the stacking direction of the low relative dielectric constant films 4. The dummy via chains 171*m* are arranged in such a manner that the ends of the dummy via chains 171*m* provided adjacent to each other are superposed upon each other along the stacking direction of the low relative dielectric constant films 4. Accordingly, in the same manner as the dummy via chain 171*k*, each dummy via chain 171*m* is assumed as one unit dummy via chain, and it can be assumed that the dummy via chain 171*n* comprised of a plurality of dummy via chains 171*m* is provided in the low relative dielectric constant films 4 of the two adjacent layers. It is to be noted that the reinforcing metal layers 172 of the opposite ends in the layer under each dummy via chain 171*m* are connected to the reinforcing material (film) 3 via one or two reinforcing plugs 174.

The dummy via chain 171*m* comprised in this manner is tougher than the dummy via chains 171*i*, 171*j*, and has a large drag against the external force. Additionally, the dummy via chain 171*n* comprised of a plurality of dummy via chains 171*m* has the drag against the external force, which is larger than that of the dummy via chain 171*k* comprised of a plurality of dummy via chains 171*i*, 171*j*. As a result, the dummy via chain 171*n* has a stress alleviation capability higher than that of the dummy via chain 171*k*.

Furthermore, FIG. 35 shows a constitution in which all the dummy via chains 171*i*, 171*j* provided adjacent to each other in the dummy via chain 171*k* shown in FIG. 33 are mutually connected by the reinforcing plug 174. That is, a plurality of dummy via chains 171*i* are connected to a plurality of dummy via chains 171*j* via one reinforcing plug 174 to comprise the dummy via chain 171*p* which is provided so as to extend along the direction crossing at right angles to the stacking direction of the low relative dielectric constant films 4. It is to be noted that the reinforcing metal layers 172 in the layer below that of the dummy via chains 171*i*, 171*j* are all connected to the reinforcing material (film) 3 via two second reinforcing plugs 174. The dummy via chain 171*p* comprised in this manner is is further tougher and further higher in the stress alleviation capability than the dummy via chain 171*n*.

Moreover, as in the dummy via chains 171*a*, 171*b*, 171*c*, 171*d* shown in FIGS. 28A, 28B, 29A, and 29B, instead of the dummy via chains 171*i*, 171*j*, the dummy via chain comprised of two reinforcing metal layers 172 and at least one via plug 173 is used. Even in this case, needless to say, the effects similar to those of the dummy via chains 171*k*, 171*n*, 171*p* shown in FIGS. 33, 34, and 35 can be obtained.

Figure 36:
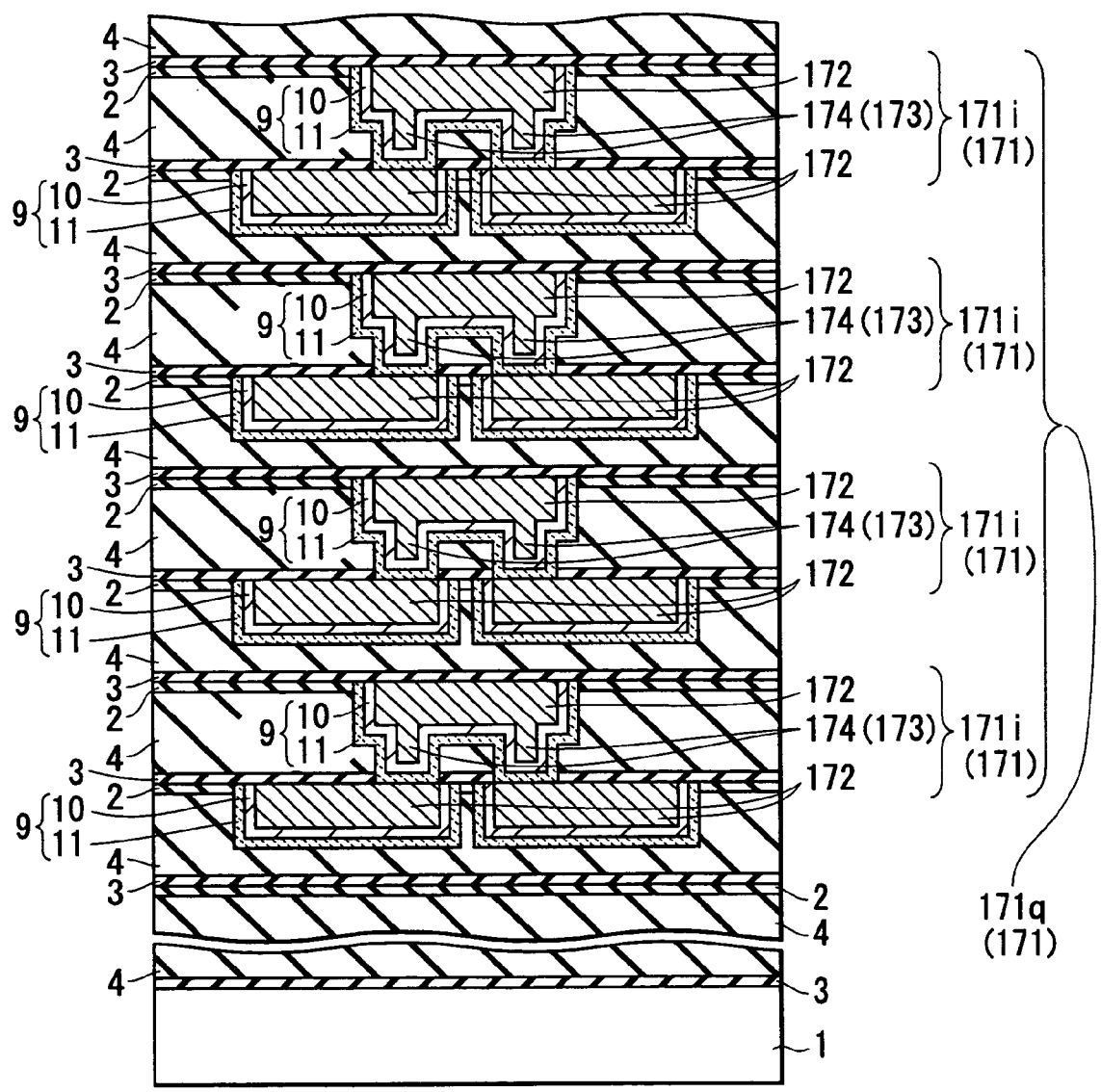
FIG. 36 is a sectional view showing still another structure of the dummy via chain of the semiconductor device according to the tenth embodiment.
Figure 37:
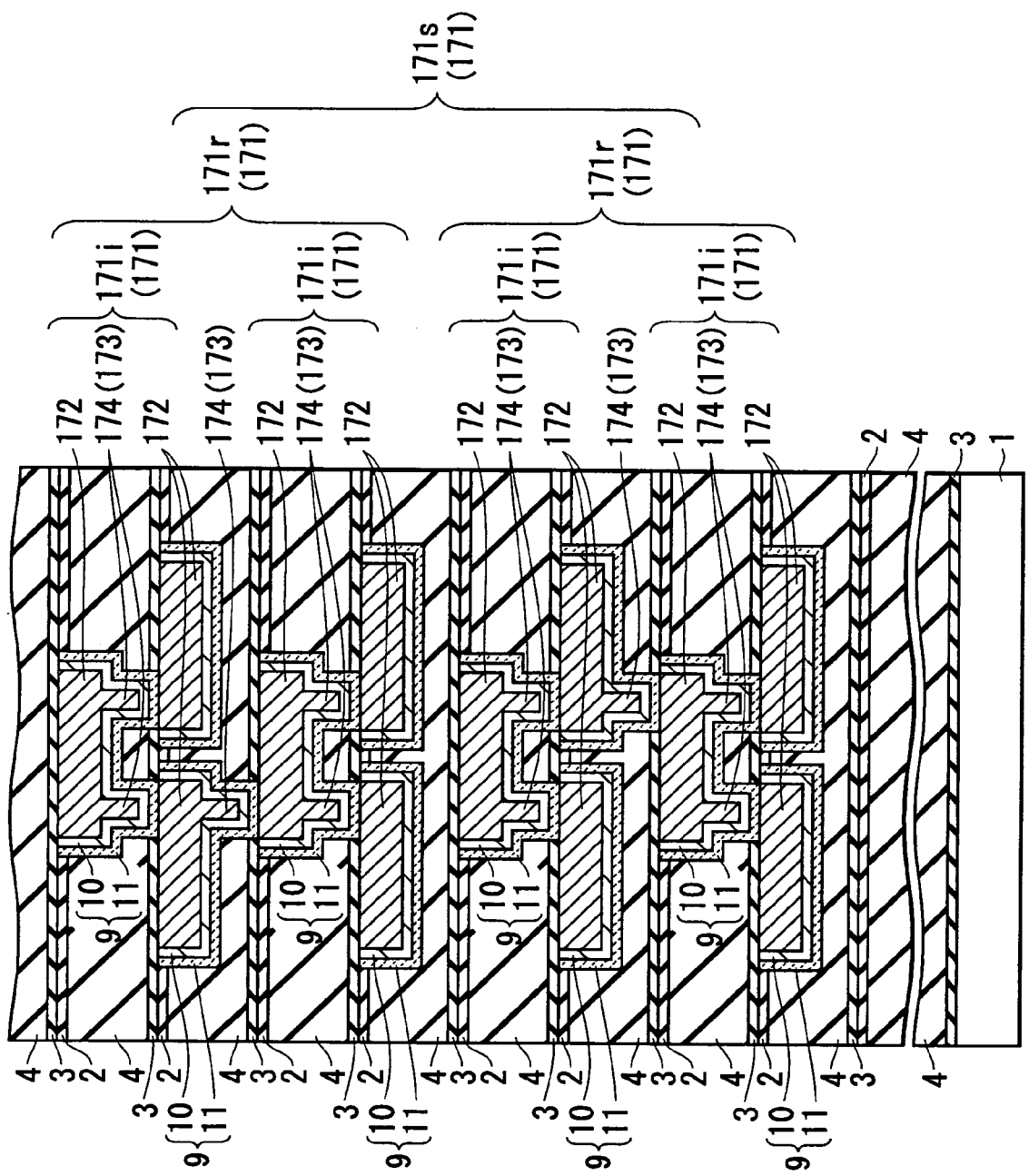
FIG. 37 is a sectional view showing still another structure of the dummy via chain of the semiconductor device according to the tenth embodiment.
Figure 38:
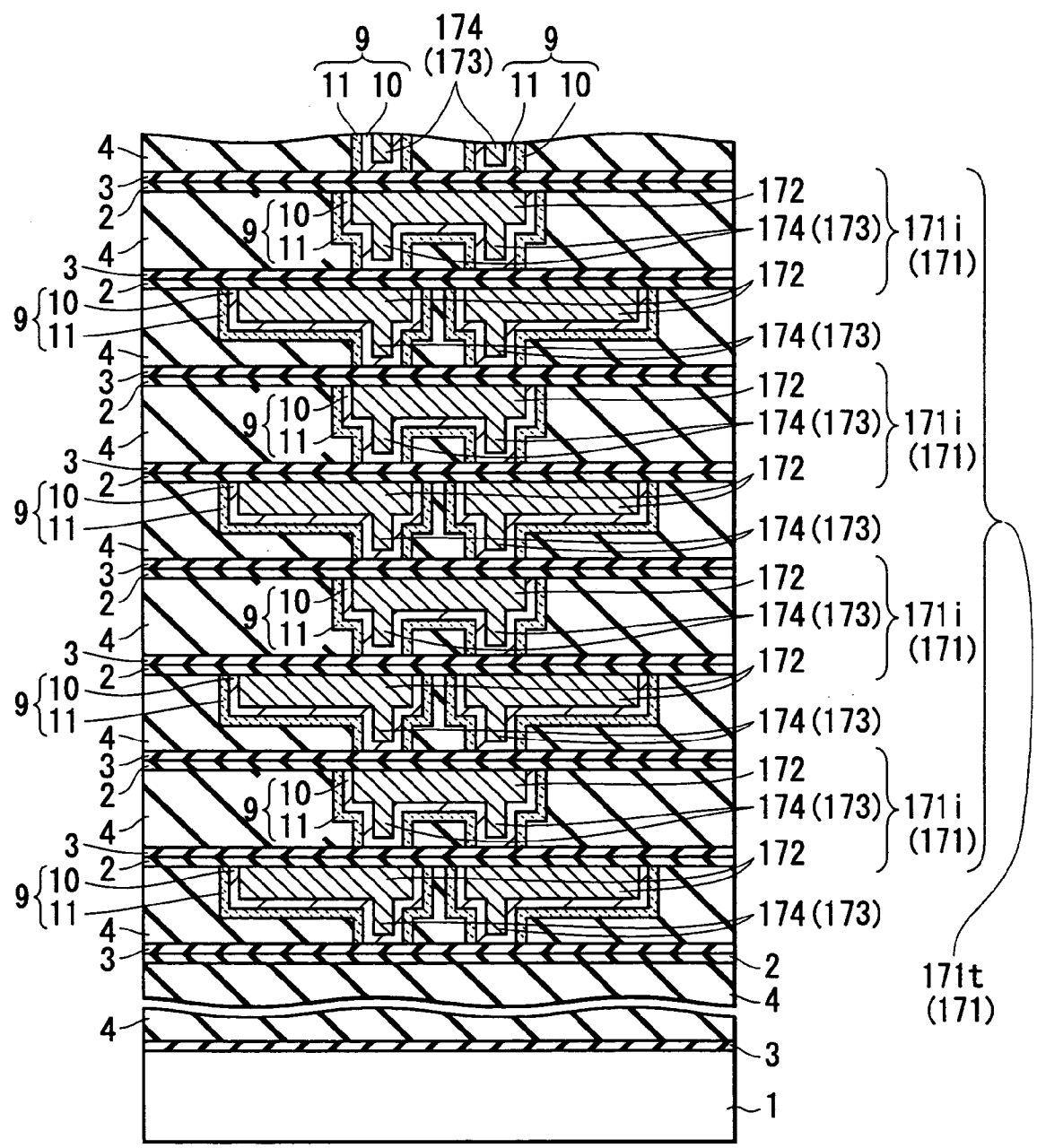
FIG. 38 is a sectional view showing still another structure of the dummy via chain of the semiconductor device according to the tenth embodiment.

Next, the dummy via chains 171 shown in FIGS. 36, 37, and 38 will be described. FIGS. 36, 37, and 38 show dummy via chains 171*q*, 171*r*, 171*s*, 171*t* provided so as to extend along the stacking direction of the low relative dielectric constant films 4.

FIG. 36 shows a constitution in which a plurality of dummy via chains 171*i* shown in FIG. 33 are arranged in the low relative dielectric constant films 4 of a plurality of layers provided adjacent to one another so as to be substantially linearly superposed upon one another along the stacking direction. According to the constitution, it is possible to obtain an effect close that in a case in which the adjacent dummy via chains 171*i* are connected to each other substantially via the via plug 173 along the stacking direction of the low relative dielectric constant films 4. That is, each dummy via chain 171*i* is assumed as one unit dummy via chain, and it can be assumed that the dummy via chain 171*q* comprised of a plurality of dummy via chains 171*i* is provided in the low relative dielectric constant films 4 of eight adjacent layers.

Moreover, FIG. 37 shows a constitution in which the adjacent dummy via chains 171*i* are connected to each other via one reinforcing plug 174 in the dummy via chain 171*q* shown in FIG. 36. That is, two adjacent dummy via chains 171*i* are connected to each other via one second reinforcing plug 174 to comprise the dummy via chain 171*r* which is provided so as to extend along the stacking direction of the low relative dielectric constant films 4. Accordingly, in the same manner as the dummy via chain 171*q*, each dummy via chain 171*r* is assumed as one unit dummy via chain, and it can be assumed that the dummy via chain 171*s* comprised of a plurality of dummy via chains 171*r* is provided in the low relative dielectric constant films 4 of a plurality of adjacent layers.

The dummy via chain 171*r* comprised in this manner is tougher and larger in the drag against the external force than the dummy via chain 171*i*. Additionally, the dummy via chain 171*s* comprised of a plurality of dummy via chains 171*r* is larger in the drag against the external force than the dummy via chain 171*q* comprised of a plurality of dummy via chains 171*i*. As a result, the dummy via chain 171*s* is higher in the stress alleviation capability than the dummy via chain 171*q*.

Moreover, FIG. 38 shows a constitution in which all the adjacent dummy via chains 171*i* are connected to each other by two reinforcing plugs 174 in the dummy via chain 171*q* shown in FIG. 36. That is, a plurality of dummy via chains 171*i* are connected to one another via two reinforcing plugs 174 to comprise the dummy via chain 171*t* which is provided so as to extend along the stacking direction of the low relative dielectric constant films 4. It is to be noted that the reinforcing metal layers 172 of the opposite ends in the lowest layer that of the dummy via chain 171*t* are all connected to the reinforcing material (film) 3 via one reinforcing plugs 174, respectively. The dummy via chain 171*t* comprised in this manner is further tougher and further higher in the stress alleviation capability than the dummy via chain 171*q*.

Figure 39:
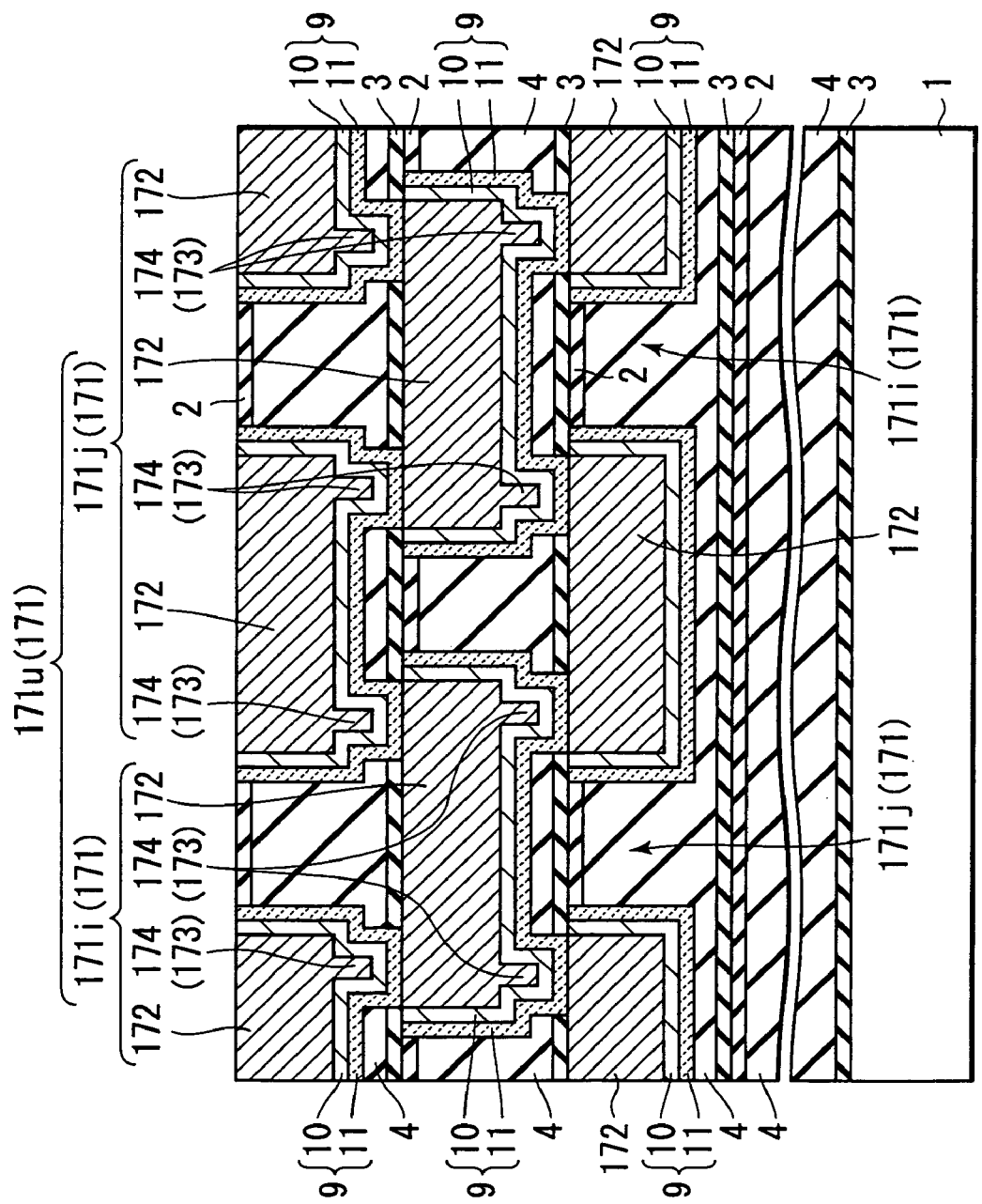
FIG. 39 is a sectional view showing still another structure of the dummy via chain of the semiconductor device according to the tenth embodiment.

Furthermore, FIG. 39 shows a constitution in which the dummy via chains 171*i*, 171*j* shown in FIG. 33 described above are stacked in the adjacent three low relative dielectric constant films 4 along the stacking direction of the low relative dielectric constant films 4. Adjacent each the dummy via chain 171*i*, 171*j* is connected to each other via the reinforcing plugs 174 (via plugs 173). Accordingly, the dummy via chains 171*i*, 171*j* are extended along two direction of the stacking direction of the low relative dielectric constant films 4 and the direction crossing at right angles to the stacking direction of the low relative dielectric constant films 4.

It is to be noted that the constitution of the dummy via chains 171 shown in FIG. 39 is correspond to a constitution which only a plurality of the reinforcing metal layers 172 of the upper-layer side of the dummy via chains 171*i*, 171*j* shown in FIG. 33 are connected to the under side of the reinforcing metal layers 172 of the lower-layer side of the dummy via chains 171*i*, 171*j* via the reinforcing plugs 174 (via plugs 173), as to the stacking direction of the low relative dielectric constant films 4. Or, the constitution of the dummy via chains 171 shown in FIG. 39 is correspond to a constitution which only a plurality of the reinforcing metal layers 172 of the lower-layer side of the dummy via chains 171*i*, 171*j* shown in FIG. 33 are connected to the up side of the reinforcing metal layers 172 of the upper-layer side of the dummy via chains 171*i*, 171*j* via the reinforcing plugs 174 (via plugs 173), as to the stacking direction of the low relative dielectric constant films 4. Accordingly, the dummy via chains 171*u* is comprised of a plurality of the dummy via chain 171*i*, 171*j* and a plurality of the reinforcing metal layers 172, which has a three-layered construction. The dummy via chain 171*u* comprised in this manner is further tougher and further higher in the stress alleviation capability than the dummy via chain 171*k* shown in FIG. 33.

Moreover, as in the dummy via chains 171*a*, 171*b*, 171*c*, 171*d* shown in FIGS. 28A, 28B, 29A, and 29B, instead of the dummy via chains 171*i*, 171*j*, the dummy via chain comprised of two reinforcing metal layers 172 and at least one via plug 173 is used. Even in this case, needless to say, the effects similar to those of the dummy via chains 171*q*, 171*s*, 171*t*, 171*u*, shown in FIGS. 36, 37, 38, and 39 can be obtained.

Figure 40:
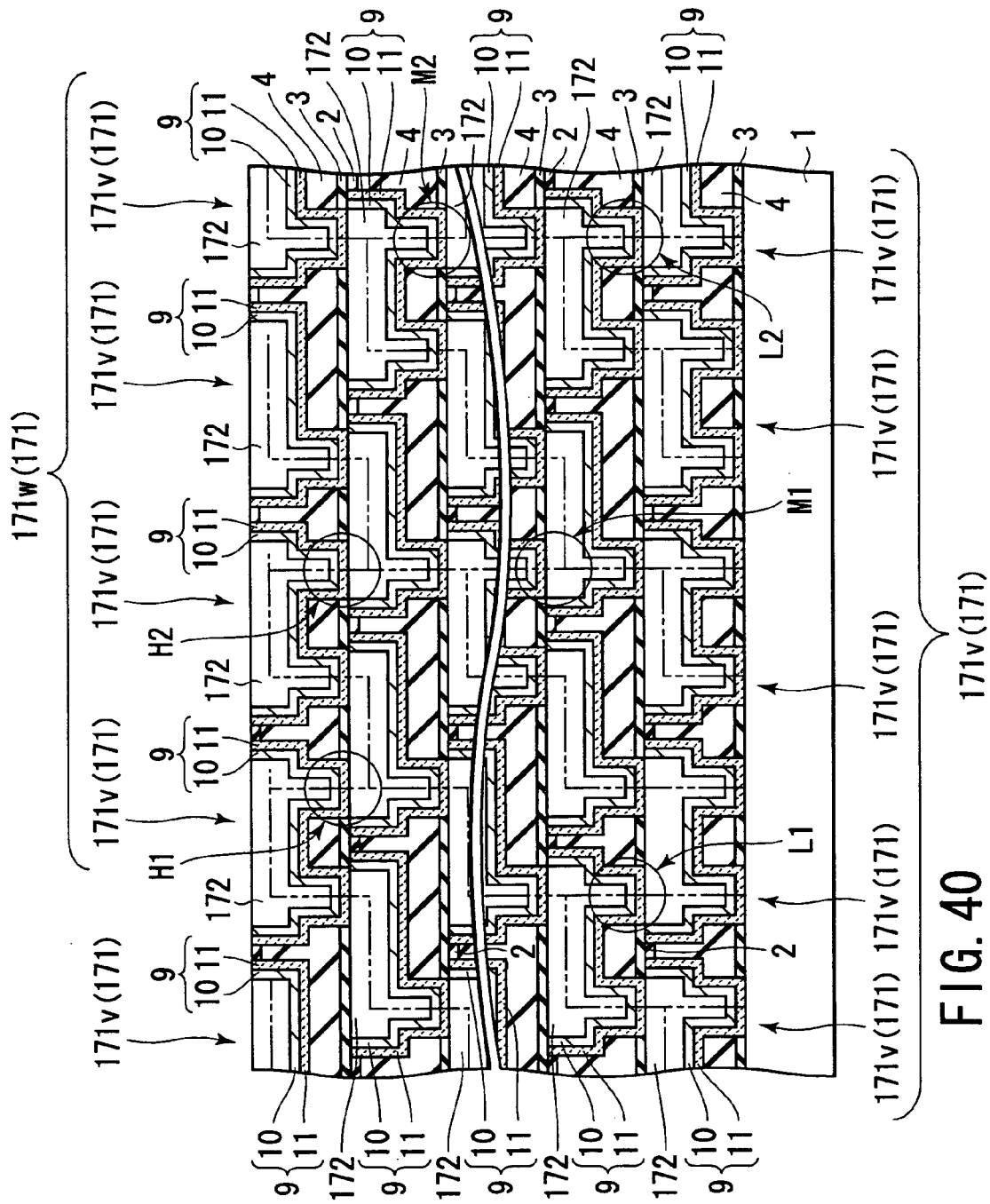
FIG. 40 is a sectional view showing still another structure of the dummy via chain of the semiconductor device according to the tenth embodiment.

Next, the dummy via chain 171 shown in FIG. 40 will be described. FIG. 40 shows dummy via chains 171*v*, 171*w* arranged so as to extend along both the stacking direction of the low relative dielectric constant films 4 and the direction crossing at right angles to the stacking direction of the low relative dielectric constant films 4.

In FIG. 40, as shown by two-dot chain lines in FIG. 40, continuing from the Si substrate 1, a plurality of dummy via chains 171*v* are arranged so as to extend along both the stacking direction of the low relative dielectric constant films 4 and the direction crossing at right angles to the stacking direction of the low relative dielectric constant films 4. That is, the dummy via chains 171*v* are arranged on the Si substrate, extending so as to be inclined with respect to the stacking direction of the low relative dielectric constant films 4. In more detail, in the dummy via chains 171*v*, the reinforcing metal layers 172 are arranged and connected to one another so as to extend upwards simply obliquely toward the other end (upper end) from one end (lower end).

For some of the dummy via chains 171*v*, as shown by a part H1, H2 surrounded with a solid-line circle in FIG. 40, between the dummy via chains 171*v* provided adjacent to each other in the vertical direction, the reinforcing metal layer 172 of the top layer is connected to that of the layer right under the top layer via the reinforcing plug 174 (via plug 173). Similarly, for some of the dummy via chains 171*v*, as shown by a part M1, M2 surrounded with a solid-line circle in FIG. 40, between the dummy via chains 171*v* provided adjacent to each other, the reinforcing metal layers 172 provided adjacent to each other in the vertical direction in the intermediate layer are connected to each other via the reinforcing plug 174. Similarly, for some of the dummy via chains 171*v*, as shown by a part L1, L2 surrounded with a solid-line circle in FIG. 40, between the dummy via chains 171*v* provided adjacent to each other in the vertical direction, the reinforcing metal layer 172 of the bottom layer is connected to that of the layer right on the bottom layer via the reinforcing plug 174.

According to the constitution, each dummy via chain 171*v* is regarded as one unit dummy via chain, and it can be assumed that the dummy via chain 171*w* comprised of a plurality of dummy via chains 171*v* is provided over the low relative dielectric constant film 4 of the top layer from that of the bottom layer, continuing from the Si substrate 1. It is to be noted that all the reinforcing metal layers 172 of the dummy via chains 171*v* of the bottom layer are connected to the reinforcing material (film) 3 and Si substrate 1 via two reinforcing plugs 174. In FIG. 40, for the ease of seeing the extending direction of each dummy via chain 171*v* and the connected portion between the dummy via chains 171*v*, the hatching of each reinforcing metal layer 172 is omitted.

As described above, according to the tenth embodiment, the effects similar to those of the first to ninth embodiments can be obtained. When the arrangement pattern of the dummy via chain 171 of the present embodiment in the sectional view is combined with that of the dummy via chain 161 of the ninth embodiment in the plan view, the arrangement pattern of the dummy via chain can remarkably variously be comprised. That is, in the semiconductor device including the multi-layered wiring structure, it is possible to obtain the arrangement pattern of the dummy via chain in which the appropriate stress alleviation capability can be obtained in accordance with the arrangement pattern of the effective wiring in the plan and sectional views. This also applies to the dummy via chain 122 of the seventh embodiment and the dummy via chain 146*b* of the eighth embodiment.

Furthermore, the arrangement patterns of the dummy via chains 122, 146*b*, 161, 171 are not limited to those described in the ninth and tenth embodiments. The dummy via chains 122, 146*b*, 161, 171 can take various other arrangement patterns.

For example, it is assumed that at least one reinforcing metal layer 124, 149, 162, 164, 165, 166, 172 is further provided in the interlayer insulating film 4 of the layer different from that in which the reinforcing metal layer 124, 149, 162, 164, 165, 166, 172 is provided comprising at least one of the opposite ends of each dummy via chain 122, 146*b*, 161, 171. Moreover, the reinforcing metal layer 124, 149, 162, 164, 165, 166, 172 may further be connected to the reinforcing metal layer 124, 149, 162, 164, 165, 166, 172 comprising one end of each dummy via chain 122, 146*b*, 161, 171 via the reinforcing via plug 125, 148, 163, 173. Even when the reinforcing metal layer 124, 149, 162, 164, 165, 166, 172 is connected to the end of each dummy via chain 122, 146*b*, 161, 171, the length of the dummy via chain 122, 146*b*, 161, 171 only increases, and there is no possibility of decrease of the stress alleviation effect. Similarly, the length of the unit dummy chain can appropriately be set to the appropriate length.

Moreover, each reinforcing metal layer 124, 149, 162, 164, 165, 166, 172 may be extended long and formed in the same direction in all the layers. Alternatively, each reinforcing metal layer 124, 149, 162, 164, 165, 166, 172 may be extended long and formed in the direction different with each layer. Similarly, each dummy via chain 122, 146*b*, 161, 171 may be arranged in the same direction in all the layers. Alternatively, the dummy via chain 122, 146b, 161, 171 may be arranged along the direction different with each layer. Furthermore, the reinforcing metal layer 124, 149, 162, 164, 165, 166, 172 may be extended long and formed along the direction in which the dummy via chain 122, 146b, 161, 171 is arranged. Alternatively, the reinforcing metal layer 124, 149, 162, 164, 165, 166, 172 may be extended long and formed along the direction vertical to the direction in which the dummy via chain 122, 146b, 161, 171 is arranged. In this manner, the shape or direction of each reinforcing metal layer 124, 149, 162, 164, 165, 166, 172 may variously be set with respect to the shape, direction, and arrangement direction of the dummy via chain 122, 146b, 161, 171.

It is to be noted that the semiconductor device according to the present invention is not restricted to the first to tenth embodiments. Without departing from the scope of the present invention, a part of the constitution or the manufacturing process can be changed to various settings, or various settings can appropriately be combined, used, or carried out.

For example, some of the reinforcing plugs may substantially be connected to the reinforcing material (film) having a high mechanical strength (Young's modulus). The connected portion may be other than the lower end or the middle portion. Furthermore, the reinforcing plug to be connected to the upper surface of the conductive layer or the reinforcing metal layer may separately be provided so as to be connected to the reinforcing material provided above. Alternatively, the reinforcing plug may also be formed so as to be connected to all the reinforcing materials provided below the conductive layer or the reinforcing metal layer connected to the reinforcing plug. Moreover, the conductive layer and conductive plug, the conductive layer and first reinforcing plug, or the reinforcing metal layer and second reinforcing plug may also be formed in a so-called single damascene structure in which these layers are plugs are separately formed. The strength in the connected portion between the conductive layer or reinforcing metal layer and each reinforcing plug may preferably be larger than the horizontal and vertical load stresses applied to the connected portion.

Moreover, examples of the low relative dielectric constant film having a relative dielectric constant of 3.4 or less include: films including a siloxane skeleton such as polysiloxane, hydrogen siloxexyoxane, polymethyl siloxane, and methyl siloxexyoxane; films containing organic resins such as polyarylene ether, polybenzoxazole, and polybenzocyclobutene as major components; and porous films such as a porous silica film.

Furthermore, the reinforcing material (film) having a Young's modulus of 30 GPa or more is not limited to an SiCN film or an SiC film. Any material may be used as long as the material has a Young's modulus of about 30 GPa or more, and does not have an electric function (conductivity). For example, the material may also be formed of a ceramic. Concretely, d-TEOS, p-SiH$_4$, SiO$_2$, SiO, SiOP, SiOF, SiN, SiON, SiCH, SiOC, SiOCH, and the like can be used. Moreover, when the Young's modulus of the capping film (layer) is about 30 GPa or more, and this capping film can be used as the reinforcing material (film), the top barrier film (layer) can also be omitted depending on the material of the wiring. That is, at least one type (layer) of the reinforcing material may be provided. Additionally, needless to say, a plurality of types (a plurality of or a multiplicity of layers) of the reinforcing materials may also be provided. The number of types (layers) may appropriately be set to the appropriate number in accordance with the desired constitution and function of the semiconductor device.

Moreover, the materials for forming the conductive layer, conductive plug, first reinforcing plug, reinforcing metal layer, and second reinforcing plug are not limited to copper (Cu). Concretely, the material may also be formed in a metal film containing, as the major component, at least one of metal elements such as Cu, Al, W, Ta, Nb, Ti, V, Ru, Mo, or a metal laminate film of a combination of these elements. The conductive layer, conductive plug, first reinforcing plug, reinforcing metal layer, and second reinforcing plug may also be formed of mutually different materials. The reinforcing wiring portion comprised of the reinforcing metal layer and second reinforcing plug may be formed of the material which can reduce the horizontal and vertical load stresses applied to the effective wiring portion comprised of the conductive layer, conductive plug, and first reinforcing plug.

Furthermore, the barrier metal film is not limited to the laminate film of Ta and TaN, and combinations such as Ti and TiN, Nb and NbN, W and WN, and Zr and ZrN may also be used. Furthermore, these metals, compounds, TaSiN, and TiSiN may also be provided alone. The layer formed of the compound is not limited to nitride, and examples thereof may include carbide containing the metal element as the major component, or boride. That is, the barrier metal film may be formed of the material which can enhance the durability against the horizontal and vertical load stresses of the effective wiring portion, and the reinforcing function of the reinforcing wiring portion in accordance with the materials forming the conductive layer, conductive plug, first reinforcing plug, reinforcing metal layer, and second reinforcing plug. Examples of the material forming the barrier metal film include metals of groups IV-A, V-A, and VI-A and compounds.

Moreover, needless to say, it is preferable to combine the materials which can mutually enhance the functions as the materials forming the low relative dielectric constant film, reinforcing material, wiring, and barrier metal film.

Furthermore, the shape of the wiring pattern of the effective wiring portion or the reinforcing wiring portion of each of the first to tenth embodiments is not limited to the shape shown in FIGS. 8, 10, 13 to 18B, 19A, 19B, 21A, 21B, 22A, 22B, 22C, and 24A to 40. For example, all the Cu reinforcing via plugs 28 of the third embodiment shown in FIG. 13 may also be formed in the shapes projecting into the low relative dielectric constant film 4 of the lower layer like the Cu reinforcing via plug 28 of the fourth embodiment shown in FIG. 14. Moreover, as in the fifth embodiment shown in FIG. 15, the insulating film provided adjacent to the low relative dielectric constant film 4 may also be limited to the SiCN film 3. Even with this setting, the effect of the present invention can sufficiently be obtained.

Additionally, the number of laminates of the interlayer insulating films, reinforcing materials, wiring layers, and reinforcing wiring layers is not limited to two or three. Needless to say, one layer or four or more layers may also be stacked.

Moreover, in the seventh embodiment, each insulating film on the Si substrate 1 is comprised in the same manner as in the first embodiment, but the present invention is not limited to this. For example, instead of the SiC film 2, an SiO$_2$ film may also be used. Similarly, instead of the SiCN film 3, an SiN film may also be used. The film corresponding to the SiC film 2 or the SiCN film 3 is not limited as long as the Young's modulus is about 30 GPa or more. Among the insulating films 4 of the layers in which the conductive plugs 27 are provided, the Young's modulus of at least one layer of the insulating film 4 may be 20 GPa or less. This constitution also applies to the eighth and tenth embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
an insulating film which is provided in at least one layer above a substrate and whose relative dielectric constant is 3.4 or less;
at least one conductive layer provided in the insulating film;
at least one conductive plug which is formed in the insulating film and which is electrically connected to the at least one conductive layer to form a conduction path;
at least one reinforcing material which is provided under the at least one conductive layer and whose Young's modulus is 30 GPa or more;
at least one first reinforcing plug which is connected to the at least one conductive layer, which is formed in contact with the at least one reinforcing material, and which is arranged within 5 μm from the at least one conductive plug, an interval between plugs including the respective at least one first reinforcing plug and the at least one conductive plug being set to 1 μm or less;
a reinforcing metal layer which is provided in the insulating film in an area other than that where the at least one conductive layer is formed, and which is electrically disconnected from the at least one conductive layer and the at least one conductive plug; and
a second reinforcing plug which is connected to the under side of the reinforcing metal layer and which is formed in contact with the at least one reinforcing material.

2. The device according to claim 1, wherein:
the insulating film and the at least one reinforcing material are stacked and arranged in two or more layers of the insulating film and the at least one reinforcing material, respectively, and the at least one conductive layer, the at least one conductive plug, and the at least one first reinforcing plug is provided with respect to the insulating film and the at least one reinforcing material of the respective layers.

3. The device according to claim 1, further comprising:
a barrier metal film with which the conductive plug is coated and which contains a high-melting metal.

4. The device according to claim 1, wherein a Young's modulus of the insulating film of at least one layer is 20 GPa or less.

5. The device according to claim 1, wherein:
the reinforcing metal layer is provided within 5 μm from the conductive layer.

6. The device according to claim 1, wherein:
a plurality of second reinforcing plugs are provided, and an interval between the second reinforcing plugs is set to 5 μm or less.

7. The device according to claim 1, wherein:
the at least one reinforcing material comprises the reinforcing metal layer provided in the insulating film of a layer under that of the insulating film in which the at least one conductive layer is provided.

8. The device according to claim 1, wherein:
the insulating film and the at least one reinforcing material are stacked and arranged in two or more layers of the insulating film and the at least one reinforcing material, respectively, and the at least one conductive layer, the at least one conductive plug, the at least one first reinforcing plug, the reinforcing metal layer, and the second reinforcing plug are provided with respect to the insulating film and the at least one reinforcing material of the respective layers.

* * * * *